(12) United States Patent
Guilford et al.

(10) Patent No.: US 10,102,215 B2
(45) Date of Patent: Oct. 16, 2018

(54) APPARATUS FOR HARDWARE IMPLEMENTATION OF LOSSLESS DATA COMPRESSION

(71) Applicant: Intel Corporation, Santa Clara, CA (US)

(72) Inventors: James D. Guilford, Northborough, MA (US); Vinodh Gopal, Westborough, MA (US); Gilbert M. Wolrich, Framingham, MA (US); Daniel F. Cutter, Maynard, MA (US)

(73) Assignee: Intel Corporation, Santa Clara, CA (US)

( * ) Notice: Subject to any disclaimer, the term of this patent is extended or adjusted under 35 U.S.C. 154(b) by 151 days.

(21) Appl. No.: 14/671,605

(22) Filed: Mar. 27, 2015

(65) Prior Publication Data

US 2016/0283504 A1    Sep. 29, 2016

(51) Int. Cl.
  *H03M 7/34* (2006.01)
  *G06F 17/30* (2006.01)
  *H03M 7/30* (2006.01)
  *H03M 7/40* (2006.01)

(52) U.S. Cl.
  CPC .... *G06F 17/30153* (2013.01); *H03M 7/3084* (2013.01); *H03M 7/3088* (2013.01); *H03M 7/4006* (2013.01)

(58) Field of Classification Search
  CPC .......... H03M 7/3084; H03M 7/3088; H03M 7/4006; H03M 7/30; H03M 7/3059; H03M 7/3086; G06F 17/3033; G06F 17/30153; G06F 17/30371; G06F 17/30598; G06F 11/1453; G06F 11/3072; G06F 17/30501; G06F 17/30516; G06F 17/30569
  USPC .................... 341/51, 106, 107; 707/693, 797
  See application file for complete search history.

(56) References Cited

U.S. PATENT DOCUMENTS

| | | | | |
|---|---|---|---|---|
| 5,883,588 A * | 3/1999 | Okamura | ............ | H03M 7/3086 341/5 |
| 5,951,623 A * | 9/1999 | Reynar | .................... | G06T 9/005 341/106 |
| 6,021,198 A * | 2/2000 | Anigbogu | ............ | H03M 7/3086 341/51 |
| 7,783,855 B2 * | 8/2010 | Goswami | .......... | G06F 17/30336 707/693 |
| 8,013,762 B2 * | 9/2011 | Matthews, Jr. | ...... | H03M 7/3086 341/51 |
| 2002/0063641 A1 * | 5/2002 | Fish | .................... | H03M 7/3086 341/87 |

(Continued)

OTHER PUBLICATIONS

Intel Corporation, IA-32 Intel® Architecture Software Developer's manual—vol. 2: Instruction Set Reference, 978 pages, 2003.

(Continued)

*Primary Examiner* — Linh Nguyen
(74) *Attorney, Agent, or Firm* — Alliance IP, LLC

(57) ABSTRACT

A processor includes a memory hierarchy, buffer, and a compression module. The compression module includes logic to evaluate a stream of data to be compressed according to a compression scheme, selectively modify a format of the compression scheme based upon a number of literals received, compress a sequence of the data to produce the output data sequence, and send the output data sequence to the memory hierarchy.

20 Claims, 30 Drawing Sheets

(56) References Cited

U.S. PATENT DOCUMENTS

| | | | | |
|---|---|---|---|---|
| 2014/0156790 A1* | 6/2014 | Gopal | ............... | H03M 7/3086 |
| | | | | 709/217 |
| 2014/0289208 A1* | 9/2014 | Itani | .................. | H03M 7/6017 |
| | | | | 707/693 |
| 2015/0227565 A1* | 8/2015 | Amit | ............... | G06F 17/30327 |
| | | | | 707/797 |

OTHER PUBLICATIONS

"Google Snappy Algorithm", Google Code, 3 pages, 2011.
Yann Collet, "$LZ_4$ Explained", RealTime Data Compression, 14 pages, May 26, 2011.

* cited by examiner

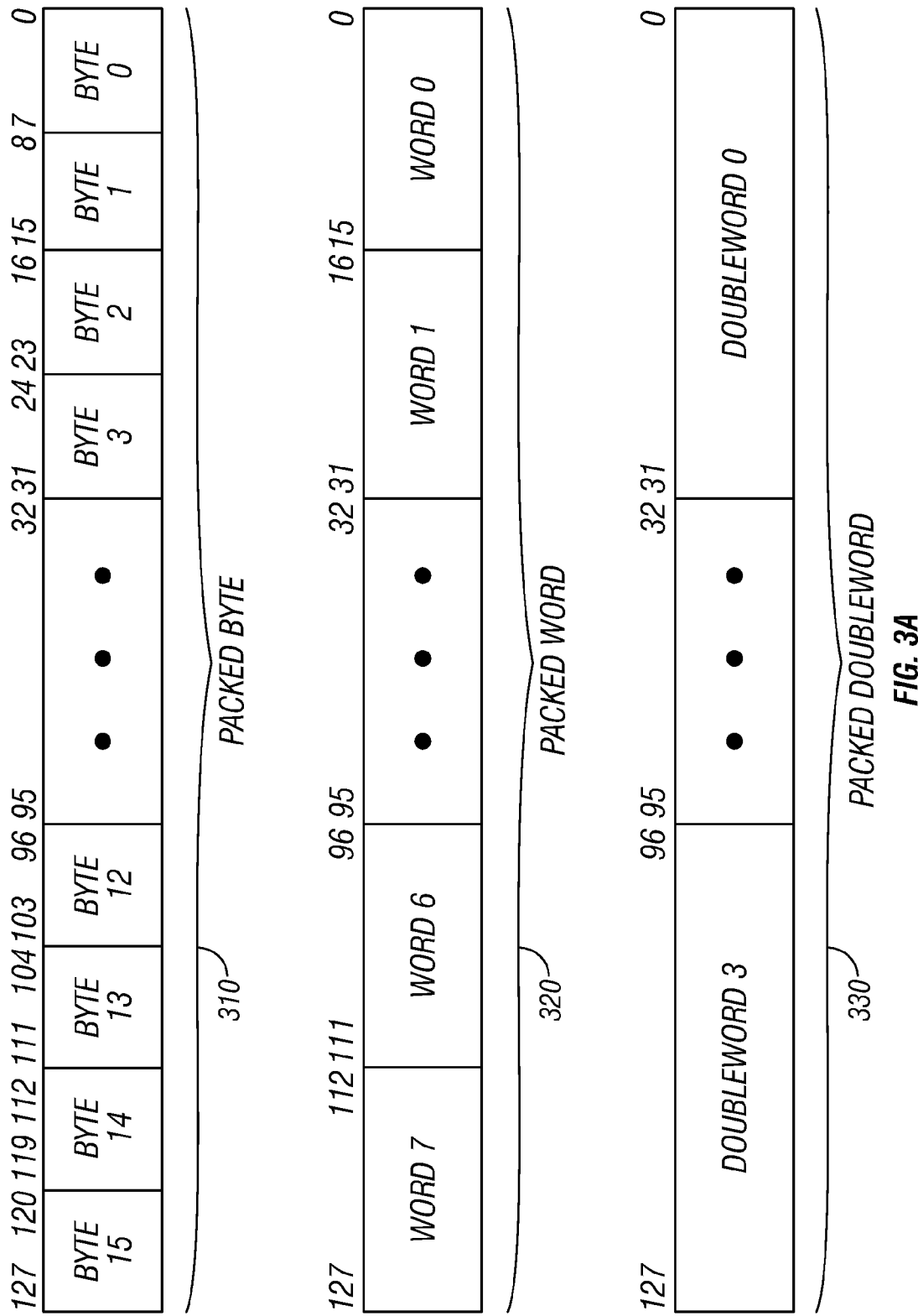

| 127 | 112 111 | 96 95 | 80 79 | 64 63 | 48 47 | 32 31 | 16 15 | 0 |
|---|---|---|---|---|---|---|---|---|
| HALF 7 | HALF 6 | HALF 5 | HALF 4 | HALF 3 | HALF 2 | HALF 1 | HALF 0 | |

PACKED HALF
341

| 127 | 96 95 | 64 63 | 32 31 | 0 |
|---|---|---|---|---|
| SINGLE 3 | SINGLE 2 | SINGLE 1 | SINGLE 0 | |

PACKED SINGLE
342

| 127 | 64 63 | 0 |
|---|---|---|
| DOUBLE 1 | DOUBLE 0 | |

PACKED DOUBLE
343

FIG. 3B

| 127 | 120 119 | 112 111 | 104 103 | | 24 23 | 16 15 | 8 7 | 0 |
|---|---|---|---|---|---|---|---|---|
| bbbb bbbb | bbbb bbbb | bbbb bbbb | • • • | | bbbb bbbb | bbbb bbbb | bbbb bbbb | |

UNSIGNED PACKED BYTE REPRESENTATION 344

| 127 | 120 119 | 112 111 | 104 103 | | 24 23 | 16 15 | 8 7 | 0 |
|---|---|---|---|---|---|---|---|---|
| sbbb bbbb | sbbb bbbb | sbbb bbbb | • • • | | sbbb bbbb | sbbb bbbb | sbbb bbbb | |

SIGNED PACKED BYTE REPRESENTATION 345

| 127 | 112 111 | | 16 15 | 0 |
|---|---|---|---|---|
| wwww wwww wwww wwww | • • • | | wwww wwww wwww wwww | |

UNSIGNED PACKED WORD REPRESENTATION 346

| 127 | 112 111 | | 16 15 | 0 |
|---|---|---|---|---|
| swww wwww wwww wwww | • • • | | swww wwww wwww wwww | |

SIGNED PACKED WORD REPRESENTATION 347

| 127 | 92 91 | 32 31 | 0 |
|---|---|---|---|
| dddd dddd dddd dddd dddd dddd dddd dddd | • • • | dddd dddd dddd dddd dddd dddd dddd dddd | |

UNSIGNED PACKED DOUBLEWORD REPRESENTATION 348

| 127 | 92 91 | 32 31 | 0 |
|---|---|---|---|
| sddd dddd dddd dddd dddd dddd dddd dddd | • • • | sddd dddd dddd dddd dddd dddd dddd dddd | |

SIGNED PACKED DOUBLEWORD REPRESENTATION 349

*FIG. 3C*

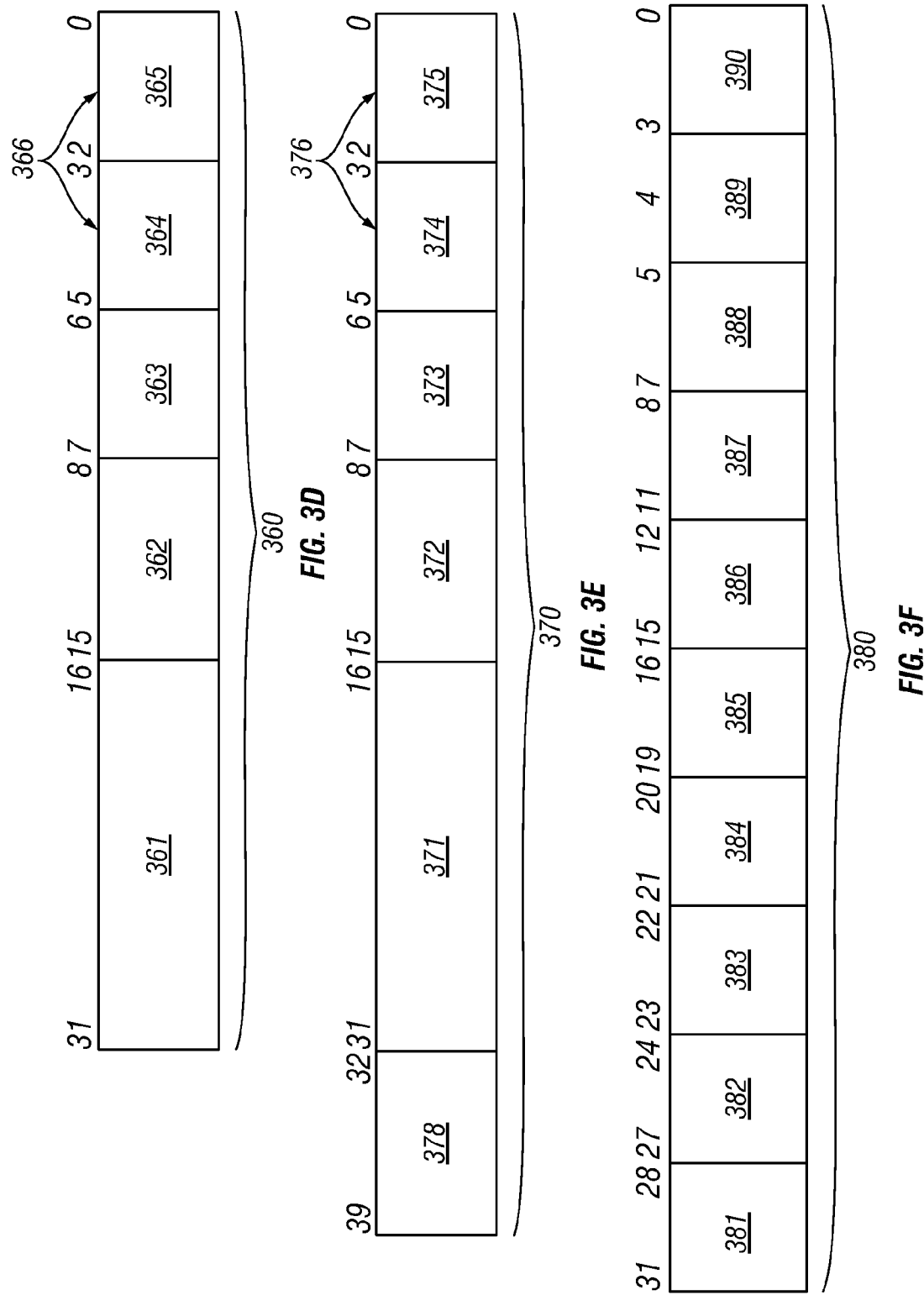

APPARATUS FOR HARDWARE IMPLEMENTATION OF LOSSLESS DATA COMPRESSION

FIELD OF THE INVENTION

The present disclosure pertains to the field of processing logic, microprocessors, and associated instruction set architecture that, when executed by the processor or other processing logic, perform logical, mathematical, or other functional operations.

DESCRIPTION OF RELATED ART

Multiprocessor systems are becoming more and more common. Applications of multiprocessor systems include dynamic domain partitioning all the way down to desktop computing. In order to take advantage of multiprocessor systems, code to be executed may be separated into multiple threads for execution by various processing entities. Each thread may be executed in parallel with one another. Furthermore, in order to increase the utility of a processing entity, out-of-order execution may be employed. Out-of-order execution may execute instructions as input to such instructions is made available. Thus, an instruction that appears later in a code sequence may be executed before an instruction appearing earlier in a code sequence. Furthermore, instructions or data may be compressed using lossless data compression algorithms.

DESCRIPTION OF THE FIGURES

Embodiments are illustrated by way of example and not limitation in the Figures of the accompanying drawings:

FIG. 3A illustrates various packed data type representations in multimedia registers, in accordance with embodiments of the present disclosure;

FIG. 3B illustrates possible in-register data storage formats, in accordance with embodiments of the present disclosure;

FIG. 3C illustrates various signed and unsigned packed data type representations in multimedia registers, in accordance with embodiments of the present disclosure;

FIG. 3D illustrates an embodiment of an operation encoding format;

FIG. 3E illustrates another possible operation encoding format having forty or more bits, in accordance with embodiments of the present disclosure;

FIG. 3F illustrates yet another possible operation encoding format, in accordance with embodiments of the present disclosure;

DETAILED DESCRIPTION

Figure 1A:
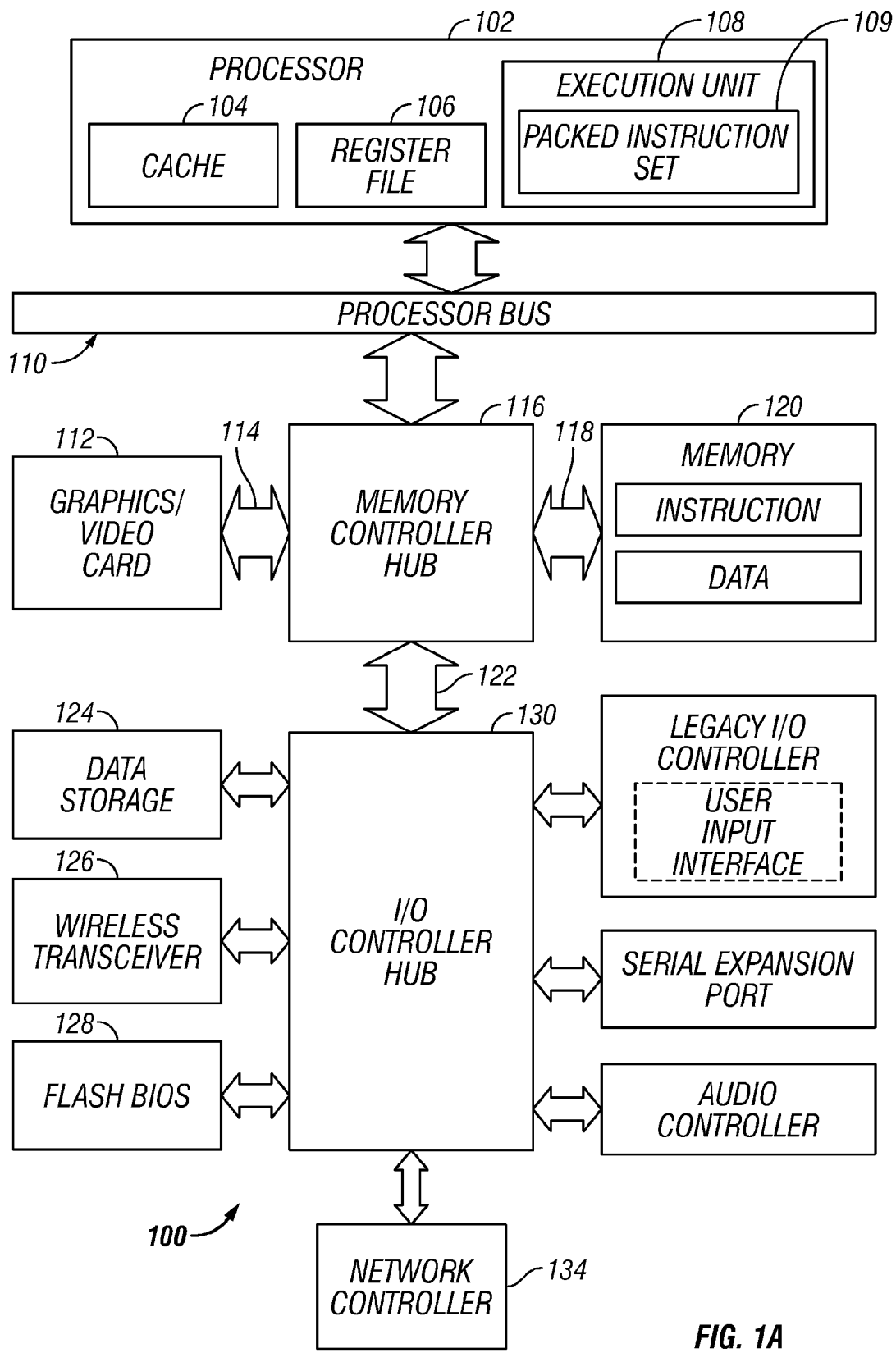
FIG. 1A is a block diagram of an exemplary computer system formed with a processor that may include execution units to execute an instruction, in accordance with embodiments of the present disclosure.

The following description describes an instruction and processing logic for inter-strand communication via a shared register fil in a processor, virtual processor, package, computer system, or other processing apparatus. Such a processing apparatus may include an out-of-order processor. In the following description, numerous specific details such as processing logic, processor types, micro-architectural conditions, events, enablement mechanisms, and the like are set forth in order to provide a more thorough understanding of embodiments of the present disclosure. It will be appreciated, however, by one skilled in the art that the embodiments may be practiced without such specific details. Additionally, some well-known structures, circuits, and the like have not been shown in detail to avoid unnecessarily obscuring embodiments of the present disclosure.

Although the following embodiments are described with reference to a processor, other embodiments are applicable to other types of integrated circuits and logic devices. Similar techniques and teachings of embodiments of the present disclosure may be applied to other types of circuits or semiconductor devices that may benefit from higher pipeline throughput and improved performance. The teachings of embodiments of the present disclosure are applicable to any processor or machine that performs data manipulations. However, the embodiments are not limited to processors or machines that perform 512-bit, 256-bit, 128-bit, 64-bit, 32-bit, or 16-bit data operations and may be applied to any processor and machine in which manipulation or management of data may be performed. In addition, the following description provides examples, and the accompanying drawings show various examples for the purposes of illustration. However, these examples should not be construed in a limiting sense as they are merely intended to provide examples of embodiments of the present disclosure rather than to provide an exhaustive list of all possible implementations of embodiments of the present disclosure.

Although the below examples describe instruction handling and distribution in the context of execution units and logic circuits, other embodiments of the present disclosure may be accomplished by way of a data or instructions stored on a machine-readable, tangible medium, which when performed by a machine cause the machine to perform functions consistent with at least one embodiment of the disclosure. In one embodiment, functions associated with embodiments of the present disclosure are embodied in machine-executable instructions. The instructions may be used to cause a general-purpose or special-purpose processor that may be programmed with the instructions to perform the steps of the present disclosure. Embodiments of the present disclosure may be provided as a computer program product or software which may include a machine or computer-readable medium having stored thereon instructions which may be used to program a computer (or other electronic devices) to perform one or more operations according to embodiments of the present disclosure. Furthermore, steps of embodiments of the present disclosure might be performed by specific hardware components that contain fixed-function logic for performing the steps, or by any combination of programmed computer components and fixed-function hardware components.

Instructions used to program logic to perform embodiments of the present disclosure may be stored within a memory in the system, such as DRAM, cache, flash memory, or other storage. Furthermore, the instructions may be distributed via a network or by way of other computer-readable media. Thus a machine-readable medium may include any mechanism for storing or transmitting information in a form readable by a machine (e.g., a computer), but is not limited to, floppy diskettes, optical disks, Compact Discs, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium may include any type of tangible machine-readable medium suitable for storing or transmitting electronic instructions or information in a form readable by a machine (e.g., a computer).

A design may go through various stages, from creation to simulation to fabrication. Data representing a design may represent the design in a number of manners. First, as may be useful in simulations, the hardware may be represented using a hardware description language or another functional description language. Additionally, a circuit level model with logic and/or transistor gates may be produced at some stages of the design process. Furthermore, designs, at some stage, may reach a level of data representing the physical placement of various devices in the hardware model. In cases wherein some semiconductor fabrication techniques are used, the data representing the hardware model may be the data specifying the presence or absence of various features on different mask layers for masks used to produce the integrated circuit. In any representation of the design, the data may be stored in any form of a machine-readable medium. A memory or a magnetic or optical storage such as a disc may be the machine-readable medium to store information transmitted via optical or electrical wave modulated or otherwise generated to transmit such information. When an electrical carrier wave indicating or carrying the code or design is transmitted, to the extent that copying, buffering, or retransmission of the electrical signal is performed, a new copy may be made. Thus, a communication provider or a network provider may store on a tangible, machine-readable medium, at least temporarily, an article, such as information encoded into a carrier wave, embodying techniques of embodiments of the present disclosure.

In modern processors, a number of different execution units may be used to process and execute a variety of code and instructions. Some instructions may be quicker to complete while others may take a number of clock cycles to complete. The faster the throughput of instructions, the better the overall performance of the processor. Thus it would be advantageous to have as many instructions execute as fast as possible. However, there may be certain instructions that have greater complexity and require more in terms of execution time and processor resources, such as floating point instructions, load/store operations, data moves, etc.

As more computer systems are used in internet, text, and multimedia applications, additional processor support has been introduced over time. In one embodiment, an instruction set may be associated with one or more computer architectures, including data types, instructions, register architecture, addressing modes, memory architecture, interrupt and exception handling, and external input and output (I/O).

In one embodiment, the instruction set architecture (ISA) may be implemented by one or more micro-architectures, which may include processor logic and circuits used to implement one or more instruction sets. Accordingly, processors with different micro-architectures may share at least a portion of a common instruction set. For example, Intel®

Pentium 4 processors, Intel® Core™ processors, and processors from Advanced Micro Devices, Inc. of Sunnyvale Calif. implement nearly identical versions of the x86 instruction set (with some extensions that have been added with newer versions), but have different internal designs. Similarly, processors designed by other processor development companies, such as ARM Holdings, Ltd., MIPS, or their licensees or adopters, may share at least a portion a common instruction set, but may include different processor designs. For example, the same register architecture of the ISA may be implemented in different ways in different micro-architectures using new or well-known techniques, including dedicated physical registers, one or more dynamically allocated physical registers using a register renaming mechanism (e.g., the use of a Register Alias Table (RAT), a Reorder Buffer (ROB) and a retirement register file. In one embodiment, registers may include one or more registers, register architectures, register files, or other register sets that may or may not be addressable by a software programmer.

An instruction may include one or more instruction formats. In one embodiment, an instruction format may indicate various fields (number of bits, location of bits, etc.) to specify, among other things, the operation to be performed and the operands on which that operation will be performed. In a further embodiment, some instruction formats may be further defined by instruction templates (or sub-formats). For example, the instruction templates of a given instruction format may be defined to have different subsets of the instruction format's fields and/or defined to have a given field interpreted differently. In one embodiment, an instruction may be expressed using an instruction format (and, if defined, in a given one of the instruction templates of that instruction format) and specifies or indicates the operation and the operands upon which the operation will operate.

Scientific, financial, auto-vectorized general purpose, RMS (recognition, mining, and synthesis), and visual and multimedia applications (e.g., 2D/3D graphics, image processing, video compression/decompression, voice recognition algorithms and audio manipulation) may require the same operation to be performed on a large number of data items. In one embodiment, Single Instruction Multiple Data (SIMD) refers to a type of instruction that causes a processor to perform an operation on multiple data elements. SIMD technology may be used in processors that may logically divide the bits in a register into a number of fixed-sized or variable-sized data elements, each of which represents a separate value. For example, in one embodiment, the bits in a 64-bit register may be organized as a source operand containing four separate 16-bit data elements, each of which represents a separate 16-bit value. This type of data may be referred to as 'packed' data type or 'vector' data type, and operands of this data type may be referred to as packed data operands or vector operands. In one embodiment, a packed data item or vector may be a sequence of packed data elements stored within a single register, and a packed data operand or a vector operand may a source or destination operand of a SIMD instruction (or 'packed data instruction' or a 'vector instruction'). In one embodiment, a SIMD instruction specifies a single vector operation to be performed on two source vector operands to generate a destination vector operand (also referred to as a result vector operand) of the same or different size, with the same or different number of data elements, and in the same or different data element order.

SIMD technology, such as that employed by the Intel® Core™ processors having an instruction set including x86, MMX™, Streaming SIMD Extensions (SSE), SSE2, SSE3, SSE4.1, and SSE4.2 instructions, ARM processors, such as the ARM Cortex® family of processors having an instruction set including the Vector Floating Point (VFP) and/or NEON instructions, and MIPS processors, such as the Loongson family of processors developed by the Institute of Computing Technology (ICT) of the Chinese Academy of Sciences, has enabled a significant improvement in application performance (Core™ and MMX™ are registered trademarks or trademarks of Intel Corporation of Santa Clara, Calif.).

In one embodiment, destination and source registers/data may be generic terms to represent the source and destination of the corresponding data or operation. In some embodiments, they may be implemented by registers, memory, or other storage areas having other names or functions than those depicted. For example, in one embodiment, "DEST1" may be a temporary storage register or other storage area, whereas "SRC1" and "SRC2" may be a first and second source storage register or other storage area, and so forth. In other embodiments, two or more of the SRC and DEST storage areas may correspond to different data storage elements within the same storage area (e.g., a SIMD register). In one embodiment, one of the source registers may also act as a destination register by, for example, writing back the result of an operation performed on the first and second source data to one of the two source registers serving as a destination registers.

FIG. 1A is a block diagram of an exemplary computer system formed with a processor that may include execution units to execute an instruction, in accordance with embodiments of the present disclosure. System 100 may include a component, such as a processor 102 to employ execution units including logic to perform algorithms for process data, in accordance with the present disclosure, such as in the embodiment described herein. System 100 may be representative of processing systems based on the PENTIUM® III, PENTIUM® 4, Xeon™, Itanium®, XScale™ and/or StrongARM™ microprocessors available from Intel Corporation of Santa Clara, Calif., although other systems (including PCs having other microprocessors, engineering workstations, set-top boxes and the like) may also be used. In one embodiment, sample system 100 may execute a version of the WINDOWS™ operating system available from Microsoft Corporation of Redmond, Wash., although other operating systems (UNIX and Linux for example), embedded software, and/or graphical user interfaces, may also be used. Thus, embodiments of the present disclosure are not limited to any specific combination of hardware circuitry and software.

Embodiments are not limited to computer systems. Embodiments of the present disclosure may be used in other devices such as handheld devices and embedded applications. Some examples of handheld devices include cellular phones, Internet Protocol devices, digital cameras, personal digital assistants (PDAs), and handheld PCs. Embedded applications may include a micro controller, a digital signal processor (DSP), system on a chip, network computers (NetPC), set-top boxes, network hubs, wide area network (WAN) switches, or any other system that may perform one or more instructions in accordance with at least one embodiment.

Computer system 100 may include a processor 102 that may include one or more execution units 108 to perform an algorithm to perform at least one instruction in accordance with one embodiment of the present disclosure. One embodiment may be described in the context of a single processor desktop or server system, but other embodiments may be included in a multiprocessor system. System 100 may be an example of a 'hub' system architecture. System 100 may include a processor 102 for processing data signals. Processor 102 may include a complex instruction set computer (CISC) microprocessor, a reduced instruction set computing (RISC) microprocessor, a very long instruction word (VLIW) microprocessor, a processor implementing a combination of instruction sets, or any other processor device, such as a digital signal processor, for example. In one embodiment, processor 102 may be coupled to a processor bus 110 that may transmit data signals between processor 102 and other components in system 100. The elements of system 100 may perform conventional functions that are well known to those familiar with the art.

In one embodiment, processor 102 may include a Level 1 (L1) internal cache memory 104. Depending on the architecture, the processor 102 may have a single internal cache or multiple levels of internal cache. In another embodiment, the cache memory may reside external to processor 102. Other embodiments may also include a combination of both internal and external caches depending on the particular implementation and needs. Register file 106 may store different types of data in various registers including integer registers, floating point registers, status registers, and instruction pointer register.

Execution unit 108, including logic to perform integer and floating point operations, also resides in processor 102. Processor 102 may also include a microcode (ucode) ROM that stores microcode for certain macroinstructions. In one embodiment, execution unit 108 may include logic to handle a packed instruction set 109. By including the packed instruction set 109 in the instruction set of a general-purpose processor 102, along with associated circuitry to execute the instructions, the operations used by many multimedia applications may be performed using packed data in a general-purpose processor 102. Thus, many multimedia applications may be accelerated and executed more efficiently by using the full width of a processor's data bus for performing operations on packed data. This may eliminate the need to transfer smaller units of data across the processor's data bus to perform one or more operations one data element at a time.

Embodiments of an execution unit 108 may also be used in micro controllers, embedded processors, graphics devices, DSPs, and other types of logic circuits. System 100 may include a memory 120. Memory 120 may be implemented as a Dynamic Random Access Memory (DRAM) device, a Static Random Access Memory (SRAM) device, flash memory device, or other memory device. Memory 120 may store instructions and/or data represented by data signals that may be executed by processor 102.

A system logic chip 116 may be coupled to processor bus 110 and memory 120. System logic chip 116 may include a memory controller hub (MCH). Processor 102 may communicate with MCH 116 via a processor bus 110. MCH 116 may provide a high bandwidth memory path 118 to memory 120 for instruction and data storage and for storage of graphics commands, data and textures. MCH 116 may direct data signals between processor 102, memory 120, and other components in system 100 and to bridge the data signals between processor bus 110, memory 120, and system I/O 122. In some embodiments, the system logic chip 116 may provide a graphics port for coupling to a graphics controller 112. MCH 116 may be coupled to memory 120 through a memory interface 118. Graphics card 112 may be coupled to MCH 116 through an Accelerated Graphics Port (AGP) interconnect 114.

System 100 may use a proprietary hub interface bus 122 to couple MCH 116 to I/O controller hub (ICH) 130. In one embodiment, ICH 130 may provide direct connections to some I/O devices via a local I/O bus. The local I/O bus may include a high-speed I/O bus for connecting peripherals to memory 120, chipset, and processor 102. Examples may include the audio controller, firmware hub (flash BIOS) 128, wireless transceiver 126, data storage 124, legacy I/O controller containing user input and keyboard interfaces, a serial expansion port such as Universal Serial Bus (USB), and a network controller 134. Data storage device 124 may comprise a hard disk drive, a floppy disk drive, a CD-ROM device, a flash memory device, or other mass storage device.

For another embodiment of a system, an instruction in accordance with one embodiment may be used with a system on a chip. One embodiment of a system on a chip comprises of a processor and a memory. The memory for one such system may include a flash memory. The flash memory may be located on the same die as the processor and other system components. Additionally, other logic blocks such as a memory controller or graphics controller may also be located on a system on a chip.

Figure 1B:
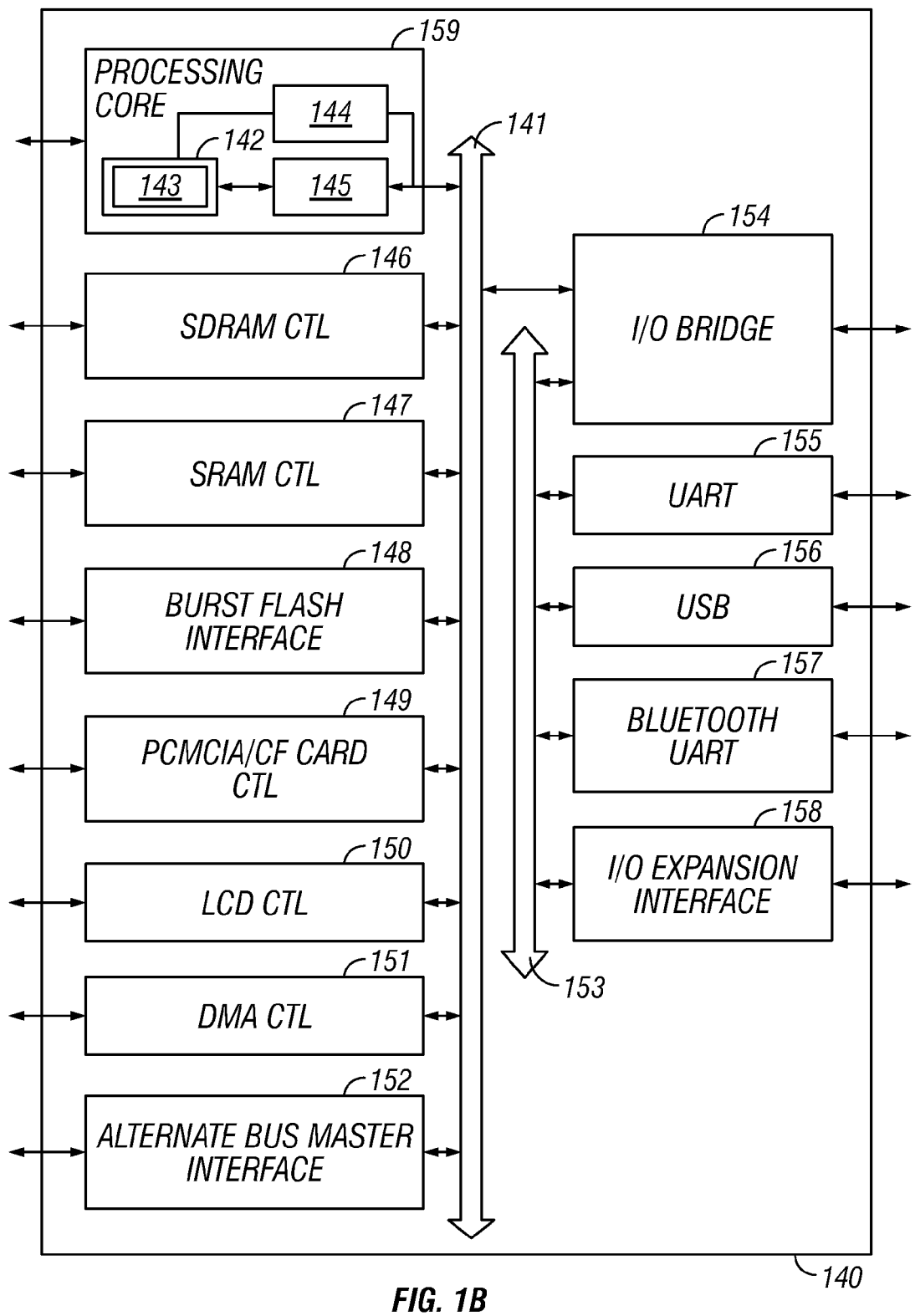
FIG. 1B illustrates a data processing system, in accordance with embodiments of the present disclosure.

FIG. 1B illustrates a data processing system 140 which implements the principles of embodiments of the present disclosure. It will be readily appreciated by one of skill in the art that the embodiments described herein may operate with alternative processing systems without departure from the scope of embodiments of the disclosure.

Computer system 140 comprises a processing core 159 for performing at least one instruction in accordance with one embodiment. In one embodiment, processing core 159 represents a processing unit of any type of architecture, including but not limited to a CISC, a RISC or a VLIW-type architecture. Processing core 159 may also be suitable for manufacture in one or more process technologies and by being represented on a machine-readable media in sufficient detail, may be suitable to facilitate said manufacture.

Processing core 159 comprises an execution unit 142, a set of register files 145, and a decoder 144. Processing core 159 may also include additional circuitry (not shown) which may be unnecessary to the understanding of embodiments of the present disclosure. Execution unit 142 may execute instructions received by processing core 159. In addition to performing typical processor instructions, execution unit 142 may perform instructions in packed instruction set 143 for performing operations on packed data formats. Packed instruction set 143 may include instructions for performing embodiments of the disclosure and other packed instructions. Execution unit 142 may be coupled to register file 145 by an internal bus. Register file 145 may represent a storage area on processing core 159 for storing information, including data. As previously mentioned, it is understood that the storage area may store the packed data might not be critical. Execution unit 142 may be coupled to decoder 144. Decoder 144 may decode instructions received by processing core 159 into control signals and/or microcode entry points. In response to these control signals and/or microcode entry points, execution unit 142 performs the appropriate operations. In one embodiment, the decoder may interpret the opcode of the instruction, which will indicate what operation should be performed on the corresponding data indicated within the instruction.

Processing core 159 may be coupled with bus 141 for communicating with various other system devices, which may include but are not limited to, for example, Synchronous Dynamic Random Access Memory (SDRAM) control 146, Static Random Access Memory (SRAM) control 147, burst flash memory interface 148, Personal Computer Memory Card International Association (PCMCIA)/Compact Flash (CF) card control 149, Liquid Crystal Display (LCD) control 150, Direct Memory Access (DMA) controller 151, and alternative bus master interface 152. In one embodiment, data processing system 140 may also comprise an I/O bridge 154 for communicating with various I/O devices via an I/O bus 153. Such I/O devices may include but are not limited to, for example, Universal Asynchronous Receiver/Transmitter (UART) 155, Universal Serial Bus (USB) 156, Bluetooth wireless UART 157 and I/O expansion interface 158.

One embodiment of data processing system 140 provides for mobile, network and/or wireless communications and a processing core 159 that may perform SIMD operations including a text string comparison operation. Processing core 159 may be programmed with various audio, video, imaging and communications algorithms including discrete transformations such as a Walsh-Hadamard transform, a fast Fourier transform (FFT), a discrete cosine transform (DCT), and their respective inverse transforms; compression/decompression techniques such as color space transformation, video encode motion estimation or video decode motion compensation; and modulation/demodulation (MODEM) functions such as pulse coded modulation (PCM).

Figure 1C:
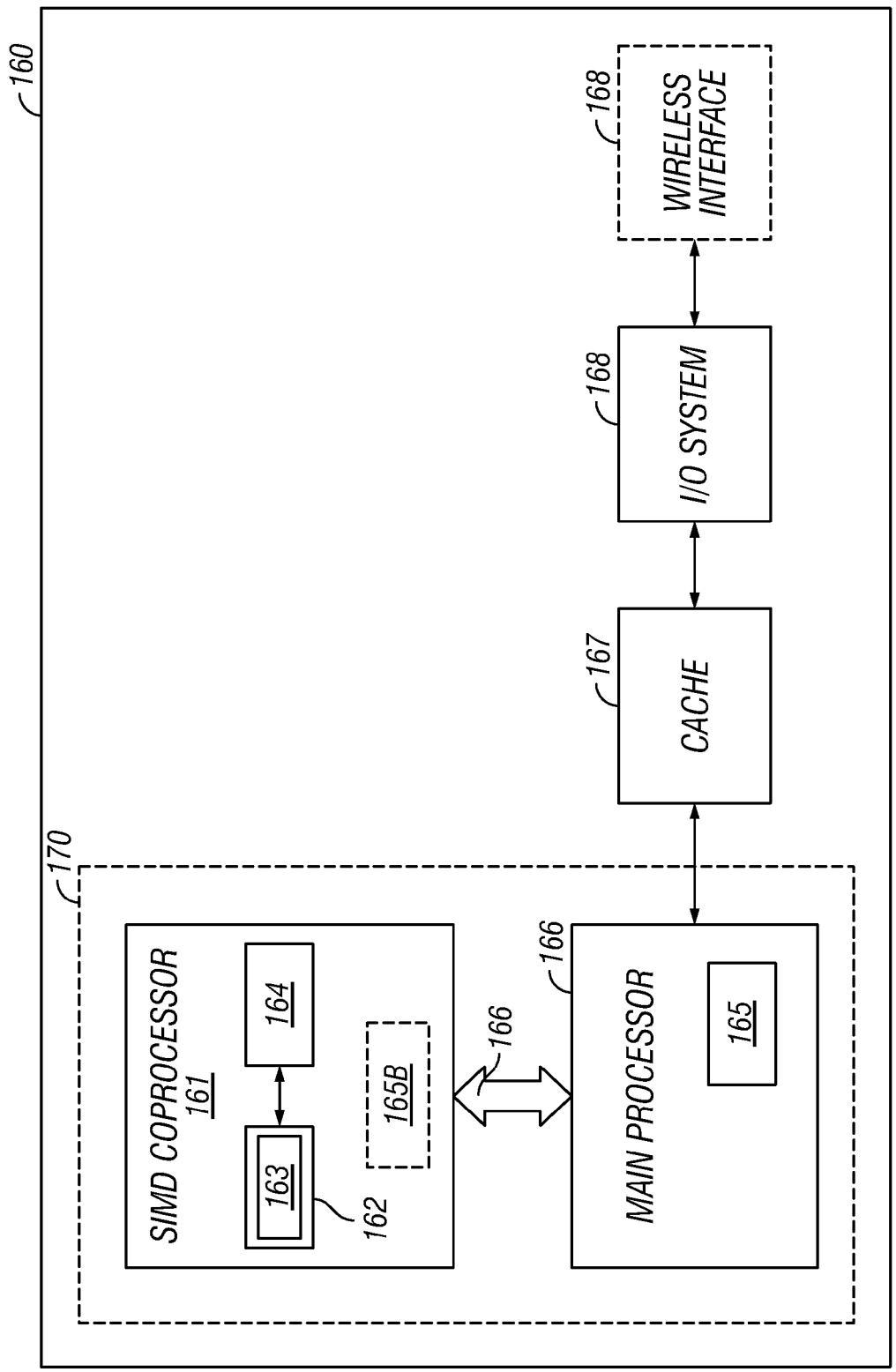
FIG. 1C illustrates other embodiments of a data processing system for performing text string comparison operations.

FIG. 1C illustrates other embodiments of a data processing system that performs SIMD text string comparison operations. In one embodiment, data processing system 160 may include a main processor 166, a SIMD coprocessor 161, a cache memory 167, and an input/output system 168. Input/output system 168 may optionally be coupled to a wireless interface 169. SIMD coprocessor 161 may perform operations including instructions in accordance with one embodiment. In one embodiment, processing core 170 may be suitable for manufacture in one or more process technologies and by being represented on a machine-readable media in sufficient detail, may be suitable to facilitate the manufacture of all or part of data processing system 160 including processing core 170.

In one embodiment, SIMD coprocessor 161 comprises an execution unit 162 and a set of register files 164. One embodiment of main processor 165 comprises a decoder 165 to recognize instructions of instruction set 163 including instructions in accordance with one embodiment for execution by execution unit 162. In other embodiments, SIMD coprocessor 161 also comprises at least part of decoder 165 to decode instructions of instruction set 163. Processing core 170 may also include additional circuitry (not shown) which may be unnecessary to the understanding of embodiments of the present disclosure.

In operation, main processor 166 executes a stream of data processing instructions that control data processing operations of a general type including interactions with cache memory 167, and input/output system 168. Embedded within the stream of data processing instructions may be SIMD coprocessor instructions. Decoder 165 of main processor 166 recognizes these SIMD coprocessor instructions as being of a type that should be executed by an attached SIMD coprocessor 161. Accordingly, main processor 166 issues these SIMD coprocessor instructions (or control signals representing SIMD coprocessor instructions) on the coprocessor bus 166. From coprocessor bus 166, these instructions may be received by any attached SIMD coprocessors. In this case, SIMD coprocessor 161 may accept and execute any received SIMD coprocessor instructions intended for it.

Data may be received via wireless interface 169 for processing by the SIMD coprocessor instructions. For one example, voice communication may be received in the form of a digital signal, which may be processed by the SIMD coprocessor instructions to regenerate digital audio samples representative of the voice communications. For another example, compressed audio and/or video may be received in the form of a digital bit stream, which may be processed by the SIMD coprocessor instructions to regenerate digital audio samples and/or motion video frames. In one embodiment of processing core 170, main processor 166, and a SIMD coprocessor 161 may be integrated into a single processing core 170 comprising an execution unit 162, a set of register files 164, and a decoder 165 to recognize instructions of instruction set 163 including instructions in accordance with one embodiment.

Figure 2:
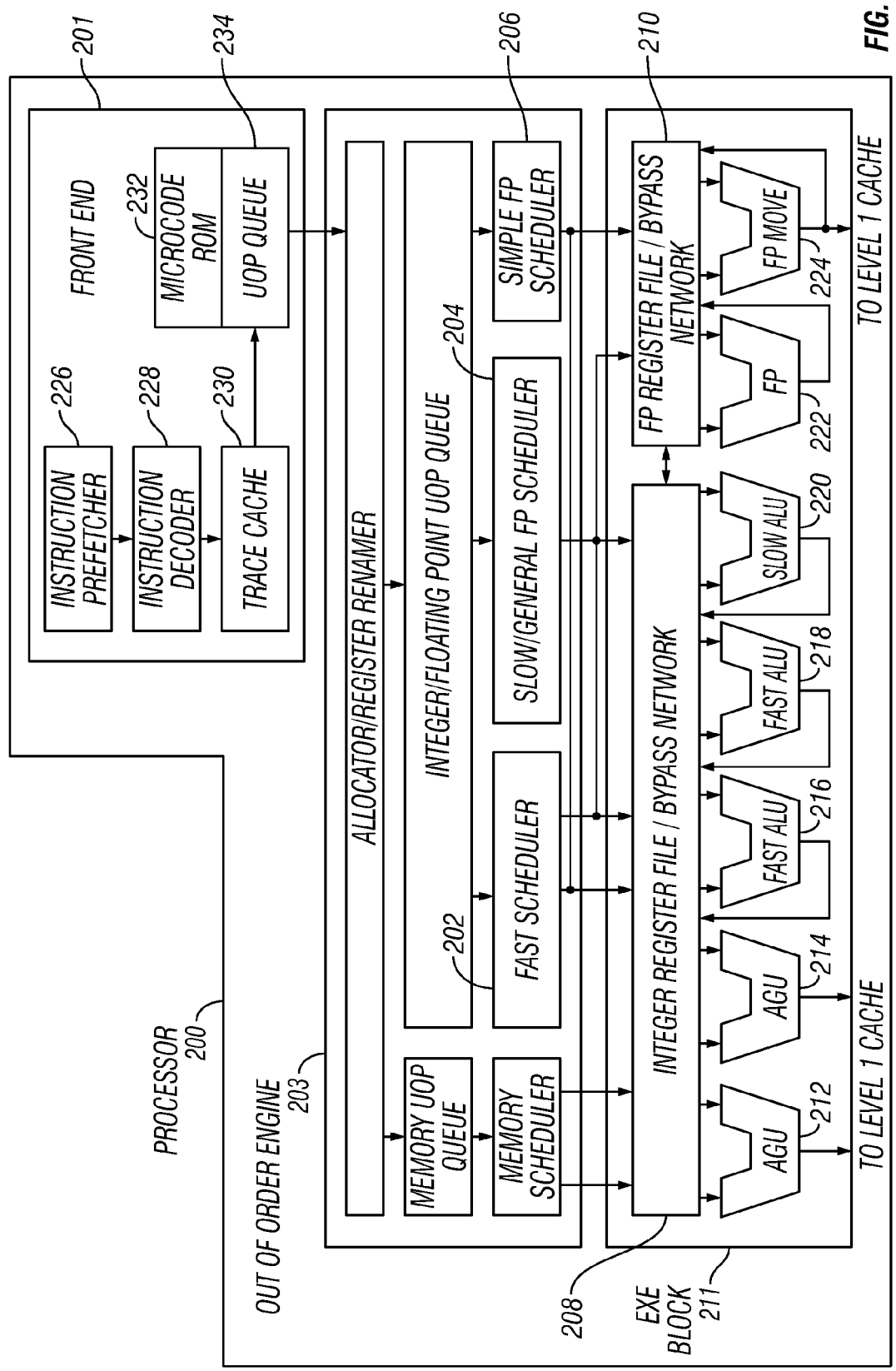
FIG. 2 is a block diagram of the micro-architecture for a processor that may include logic circuits to perform instructions, in accordance with embodiments of the present disclosure.

FIG. 2 is a block diagram of the micro-architecture for a processor 200 that may include logic circuits to perform instructions, in accordance with embodiments of the present disclosure. In some embodiments, an instruction in accordance with one embodiment may be implemented to operate on data elements having sizes of byte, word, doubleword, quadword, etc., as well as datatypes, such as single and double precision integer and floating point datatypes. In one embodiment, in-order front end 201 may implement a part of processor 200 that may fetch instructions to be executed and prepares the instructions to be used later in the processor pipeline. Front end 201 may include several units. In one embodiment, instruction prefetcher 226 fetches instructions from memory and feeds the instructions to an instruction decoder 228 which in turn decodes or interprets the instructions. For example, in one embodiment, the decoder decodes a received instruction into one or more operations called "micro-instructions" or "micro-operations" (also called micro op or uops) that the machine may execute. In other embodiments, the decoder parses the instruction into an opcode and corresponding data and control fields that may be used by the micro-architecture to perform operations in accordance with one embodiment. In one embodiment, trace cache 230 may assemble decoded uops into program ordered sequences or traces in uop queue 234 for execution. When trace cache 230 encounters a complex instruction, microcode ROM 232 provides the uops needed to complete the operation.

Some instructions may be converted into a single micro-op, whereas others need several micro-ops to complete the full operation. In one embodiment, if more than four micro-ops are needed to complete an instruction, decoder 228 may access microcode ROM 232 to perform the instruction. In one embodiment, an instruction may be decoded into a small number of micro-ops for processing at instruction decoder 228. In another embodiment, an instruction may be stored within microcode ROM 232 should a number of micro-ops be needed to accomplish the operation. Trace cache 230 refers to an entry point programmable logic array (PLA) to determine a correct micro-instruction pointer for reading the micro-code sequences to complete one or more instructions in accordance with one embodiment from micro-code ROM 232. After microcode ROM 232 finishes sequencing micro-ops for an instruction, front end 201 of the machine may resume fetching micro-ops from trace cache 230.

Out-of-order execution engine 203 may prepare instructions for execution. The out-of-order execution logic has a number of buffers to smooth out and re-order the flow of instructions to optimize performance as they go down the pipeline and get scheduled for execution. The allocator logic allocates the machine buffers and resources that each uop needs in order to execute. The register renaming logic renames logic registers onto entries in a register file. The allocator also allocates an entry for each uop in one of the two uop queues, one for memory operations and one for non-memory operations, in front of the instruction schedulers: memory scheduler, fast scheduler 202, slow/general floating point scheduler 204, and simple floating point scheduler 206. Uop schedulers 202, 204, 206, determine when a uop is ready to execute based on the readiness of their dependent input register operand sources and the availability of the execution resources the uops need to complete their operation. Fast scheduler 202 of one embodiment may schedule on each half of the main clock cycle while the other schedulers may only schedule once per main processor clock cycle. The schedulers arbitrate for the dispatch ports to schedule uops for execution.

Register files 208, 210 may be arranged between schedulers 202, 204, 206, and execution units 212, 214, 216, 218, 220, 222, 224 in execution block 211. Each of register files 208, 210 perform integer and floating point operations, respectively. Each register file 208, 210, may include a bypass network that may bypass or forward just completed results that have not yet been written into the register file to new dependent uops. Integer register file 208 and floating point register file 210 may communicate data with the other. In one embodiment, integer register file 208 may be split into two separate register files, one register file for low-order thirty-two bits of data and a second register file for high order thirty-two bits of data. Floating point register file 210 may include 128-bit wide entries because floating point instructions typically have operands from 64 to 128 bits in width.

Execution block 211 may contain execution units 212, 214, 216, 218, 220, 222, 224. Execution units 212, 214, 216, 218, 220, 222, 224 may execute the instructions. Execution block 211 may include register files 208, 210 that store the integer and floating point data operand values that the micro-instructions need to execute. In one embodiment, processor 200 may comprise a number of execution units: address generation unit (AGU) 212, AGU 214, fast Arithmetic Logic Unit (ALU) 216, fast ALU 218, slow ALU 220, floating point ALU 222, floating point move unit 224. In another embodiment, floating point execution blocks 222, 224, may execute floating point, MMX, SIMD, and SSE, or other operations. In yet another embodiment, floating point ALU 222 may include a 64-bit by 64-bit floating point divider to execute divide, square root, and remainder micro-ops. In various embodiments, instructions involving a floating point value may be handled with the floating point hardware. In one embodiment, ALU operations may be passed to high-speed ALU execution units 216, 218. High-speed ALUs 216, 218 may execute fast operations with an effective latency of half a clock cycle. In one embodiment, most complex integer operations go to slow ALU 220 as slow ALU 220 may include integer execution hardware for long-latency type of operations, such as a multiplier, shifts, flag logic, and branch processing. Memory load/store operations may be executed by AGUs 212, 214. In one embodiment, integer ALUs 216, 218, 220 may perform integer operations on 64-bit data operands. In other embodiments, ALUs 216, 218, 220 may be implemented to support a variety of data bit sizes including sixteen, thirty-two, 128, 256, etc. Similarly, floating point units 222, 224 may be implemented to support a range of operands having bits of various widths. In one embodiment, floating point units 222, 224, may operate on 128-bit wide packed data operands in conjunction with SIMD and multimedia instructions.

In one embodiment, uops schedulers 202, 204, 206, dispatch dependent operations before the parent load has finished executing. As uops may be speculatively scheduled and executed in processor 200, processor 200 may also include logic to handle memory misses. If a data load misses in the data cache, there may be dependent operations in flight in the pipeline that have left the scheduler with temporarily incorrect data. A replay mechanism tracks and re-executes instructions that use incorrect data. Only the dependent operations might need to be replayed and the independent ones may be allowed to complete. The schedulers and replay mechanism of one embodiment of a processor may also be designed to catch instruction sequences for text string comparison operations.

The term "registers" may refer to the on-board processor storage locations that may be used as part of instructions to identify operands. In other words, registers may be those that may be usable from the outside of the processor (from a programmer's perspective). However, in some embodiments registers might not be limited to a particular type of circuit. Rather, a register may store data, provide data, and perform the functions described herein. The registers described herein may be implemented by circuitry within a processor using any number of different techniques, such as dedicated physical registers, dynamically allocated physical registers using register renaming, combinations of dedicated and dynamically allocated physical registers, etc. In one embodiment, integer registers store 32-bit integer data. A register file of one embodiment also contains eight multimedia SIMD registers for packed data. For the discussions below, the registers may be understood to be data registers designed to hold packed data, such as 64-bit wide MMX™ registers (also referred to as 'mm' registers in some instances) in microprocessors enabled with MMX technology from Intel Corporation of Santa Clara, Calif. These MMX registers, available in both integer and floating point forms, may operate with packed data elements that accompany SIMD and SSE instructions. Similarly, 128-bit wide XMM registers relating to SSE2, SSE3, SSE4, or beyond (referred to generically as "SSEx") technology may hold such packed data operands. In one embodiment, in storing packed data and integer data, the registers do not need to differentiate between the two data types. In one embodiment, integer and floating point may be contained in the same register file or different register files. Furthermore, in one embodiment, floating point and integer data may be stored in different registers or the same registers.

In the examples of the following figures, a number of data operands may be described. FIG. 3A illustrates various packed data type representations in multimedia registers, in accordance with embodiments of the present disclosure. FIG. 3A illustrates data types for a packed byte 310, a packed word 320, and a packed doubleword (dword) 330 for 128-bit wide operands. Packed byte format 310 of this example may be 128 bits long and contains sixteen packed byte data elements. A byte may be defined, for example, as eight bits of data. Information for each byte data element may be stored in bit 7 through bit 0 for byte 0, bit 15 through bit 8 for byte 1, bit 23 through bit 16 for byte 2, and finally bit 120 through bit 127 for byte 15. Thus, all available bits may be used in the register. This storage arrangement increases the storage efficiency of the processor. As well, with sixteen data elements accessed, one operation may now be performed on sixteen data elements in parallel.

Generally, a data element may include an individual piece of data that is stored in a single register or memory location with other data elements of the same length. In packed data sequences relating to SSEx technology, the number of data elements stored in a XMM register may be 128 bits divided by the length in bits of an individual data element. Similarly, in packed data sequences relating to MMX and SSE technology, the number of data elements stored in an MMX register may be 64 bits divided by the length in bits of an individual data element. Although the data types illustrated in FIG. 3A may be 128 bits long, embodiments of the present disclosure may also operate with 64-bit wide or other sized operands. Packed word format 320 of this example may be 128 bits long and contains eight packed word data elements. Each packed word contains sixteen bits of information. Packed doubleword format 330 of FIG. 3A may be 128 bits long and contains four packed doubleword data elements. Each packed doubleword data element contains thirty-two bits of information. A packed quadword may be 128 bits long and contain two packed quad-word data elements.

FIG. 3B illustrates possible in-register data storage formats, in accordance with embodiments of the present disclosure. Each packed data may include more than one independent data element. Three packed data formats are illustrated; packed half 341, packed single 342, and packed double 343. One embodiment of packed half 341, packed single 342, and packed double 343 contain fixed-point data elements. For another embodiment one or more of packed half 341, packed single 342, and packed double 343 may contain floating-point data elements. One embodiment of packed half 341 may be 128 bits long containing eight 16-bit data elements. One embodiment of packed single 342 may be 128 bits long and contains four 32-bit data elements. One embodiment of packed double 343 may be 128 bits long and contains two 64-bit data elements. It will be appreciated that such packed data formats may be further extended to other register lengths, for example, to 96-bits, 160-bits, 192-bits, 224-bits, 256-bits or more.

FIG. 3C illustrates various signed and unsigned packed data type representations in multimedia registers, in accordance with embodiments of the present disclosure. Unsigned packed byte representation 344 illustrates the storage of an unsigned packed byte in a SIMD register. Information for each byte data element may be stored in bit 7 through bit 0 for byte 0, bit 15 through bit 8 for byte 1, bit 23 through bit 16 for byte 2, and finally bit 120 through bit 127 for byte 15. Thus, all available bits may be used in the register. This storage arrangement may increase the storage efficiency of the processor. As well, with sixteen data elements accessed, one operation may now be performed on sixteen data elements in a parallel fashion. Signed packed byte representation 345 illustrates the storage of a signed packed byte. Note that the eighth bit of every byte data element may be the sign indicator. Unsigned packed word representation 346 illustrates how word seven through word zero may be stored in a SIMD register. Signed packed word representation 347 may be similar to the unsigned packed word in-register representation 346. Note that the sixteenth bit of each word data element may be the sign indicator. Unsigned packed doubleword representation 348 shows how doubleword data elements are stored. Signed packed doubleword representation 349 may be similar to unsigned packed doubleword in-register representation 348. Note that the necessary sign bit may be the thirty-second bit of each doubleword data element.

FIG. 3D illustrates an embodiment of an operation encoding (opcode). Furthermore, format 360 may include register/memory operand addressing modes corresponding with a type of opcode format described in the "IA-32 Intel Architecture Software Developer's Manual Volume 2: Instruction Set Reference," which is available from Intel Corporation, Santa Clara, Calif. on the world-wide-web (www) at intel.com/design/litcentr. In one embodiment, and instruction may be encoded by one or more of fields 361 and 362. Up to two operand locations per instruction may be identified, including up to two source operand identifiers 364 and 365. In one embodiment, destination operand identifier 366 may be the same as source operand identifier 364, whereas in other embodiments they may be different. In another embodiment, destination operand identifier 366 may be the same as source operand identifier 365, whereas in other embodiments they may be different. In one embodiment, one of the source operands identified by source operand identifiers 364 and 365 may be overwritten by the results of the text string comparison operations, whereas in other embodiments identifier 364 corresponds to a source register element and identifier 365 corresponds to a destination register element. In one embodiment, operand identifiers 364 and 365 may identify 32-bit or 64-bit source and destination operands.

FIG. 3E illustrates another possible operation encoding (opcode) format 370, having forty or more bits, in accordance with embodiments of the present disclosure. Opcode format 370 corresponds with opcode format 360 and comprises an optional prefix byte 378. An instruction according to one embodiment may be encoded by one or more of fields 378, 371, and 372. Up to two operand locations per instruction may be identified by source operand identifiers 374 and 375 and by prefix byte 378. In one embodiment, prefix byte 378 may be used to identify 32-bit or 64-bit source and destination operands. In one embodiment, destination operand identifier 376 may be the same as source operand identifier 374, whereas in other embodiments they may be different. For another embodiment, destination operand identifier 376 may be the same as source operand identifier 375, whereas in other embodiments they may be different. In one embodiment, an instruction operates on one or more of the operands identified by operand identifiers 374 and 375 and one or more operands identified by operand identifiers 374 and 375 may be overwritten by the results of the instruction, whereas in other embodiments, operands identified by identifiers 374 and 375 may be written to another data element in another register. Opcode formats 360 and 370 allow register to register, memory to register, register by memory, register by register, register by immediate, register to memory addressing specified in part by MOD fields 363 and 373 and by optional scale-index-base and displacement bytes.

FIG. 3F illustrates yet another possible operation encoding (opcode) format, in accordance with embodiments of the present disclosure. 64-bit single instruction multiple data (SIMD) arithmetic operations may be performed through a coprocessor data processing (CDP) instruction. Operation encoding (opcode) format 380 depicts one such CDP instruction having CDP opcode fields 382 an0064 389. The type of CDP instruction, for another embodiment, operations may be encoded by one or more of fields 383, 384, 387, and 388. Up to three operand locations per instruction may be identified, including up to two source operand identifiers 385 and 390 and one destination operand identifier 386. One embodiment of the coprocessor may operate on eight, sixteen, thirty-two, and 64-bit values. In one embodiment, an instruction may be performed on integer data elements. In some embodiments, an instruction may be executed conditionally, using condition field 381. For some embodiments, source data sizes may be encoded by field 383. In some embodiments, Zero (Z), negative (N), carry (C), and over-flow (V) detection may be done on SIMD fields. For some instructions, the type of saturation may be encoded by field 384.

Figure 4A:
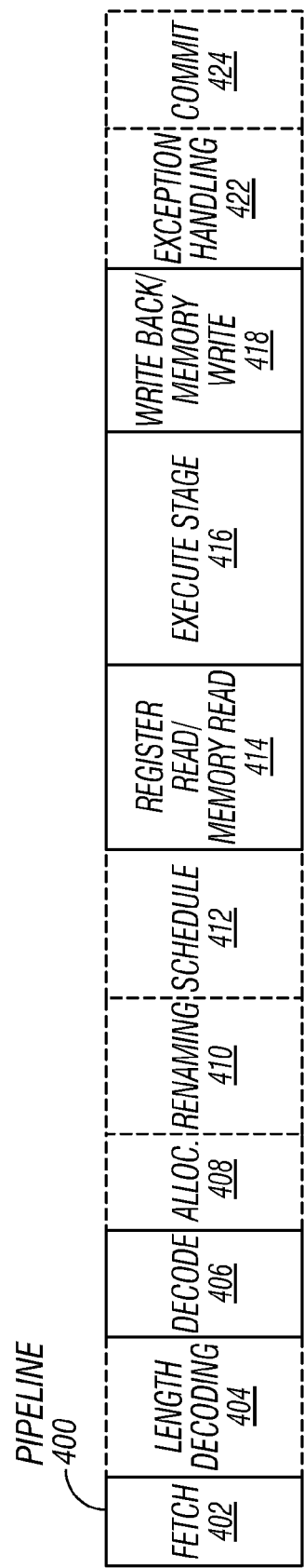
FIG. 4A is a block diagram illustrating an in-order pipeline and a register renaming stage, out-of-order issue/execution pipeline, in accordance with embodiments of the present disclosure.
Figure 4B:
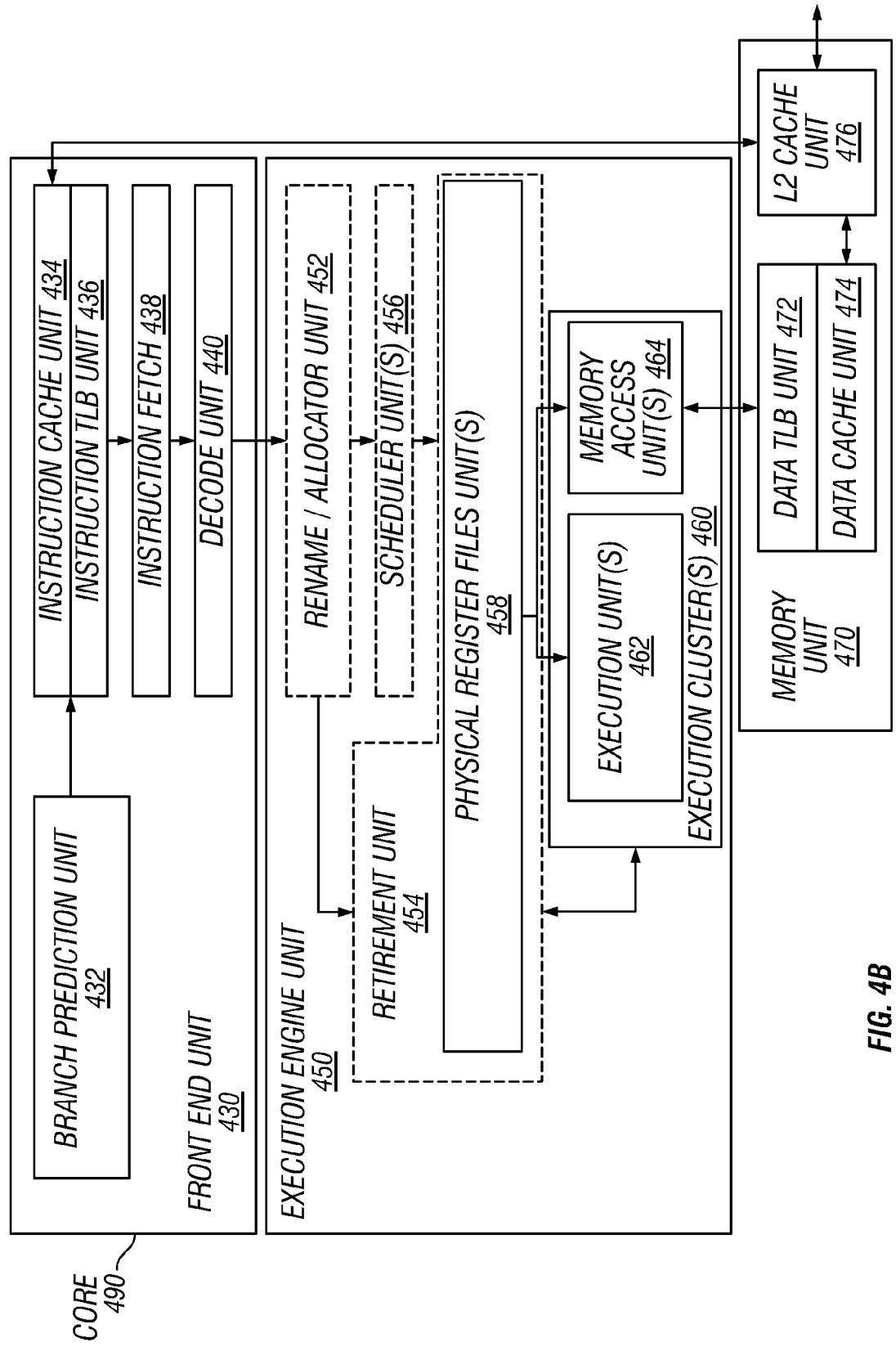
FIG. 4B is a block diagram illustrating an in-order architecture core and a register renaming logic, out-of-order issue/execution logic to be included in a processor, in accordance with embodiments of the present disclosure.

FIG. 4A is a block diagram illustrating an in-order pipeline and a register renaming stage, out-of-order issue/execution pipeline, in accordance with embodiments of the present disclosure. FIG. 4B is a block diagram illustrating an in-order architecture core and a register renaming logic, out-of-order issue/execution logic to be included in a processor, in accordance with embodiments of the present disclosure. The solid lined boxes in FIG. 4A illustrate the in-order pipeline, while the dashed lined boxes illustrates the register renaming, out-of-order issue/execution pipeline. Similarly, the solid lined boxes in FIG. 4B illustrate the in-order architecture logic, while the dashed lined boxes illustrates the register renaming logic and out-of-order issue/execution logic.

In FIG. 4A, a processor pipeline 400 may include a fetch stage 402, a length decode stage 404, a decode stage 406, an allocation stage 408, a renaming stage 410, a scheduling (also known as a dispatch or issue) stage 412, a register read/memory read stage 414, an execute stage 416, a write-back/memory-write stage 418, an exception handling stage 422, and a commit stage 424.

In FIG. 4B, arrows denote a coupling between two or more units and the direction of the arrow indicates a direction of data flow between those units. FIG. 4B shows processor core 490 including a front end unit 430 coupled to an execution engine unit 450, and both may be coupled to a memory unit 470.

Core 490 may be a Reduced Instruction Set Computing (RISC) core, a Complex Instruction Set Computing (CISC) core, a Very Long Instruction Word (VLIW) core, or a hybrid or alternative core type. In one embodiment, core 490 may be a special-purpose core, such as, for example, a network or communication core, compression engine, graphics core, or the like.

Front end unit 430 may include a branch prediction unit 432 coupled to an instruction cache unit 434. Instruction cache unit 434 may be coupled to an instruction Translation Lookaside Buffer (TLB) 436. TLB 436 may be coupled to an instruction fetch unit 438, which is coupled to a decode unit 440. Decode unit 440 may decode instructions, and generate as an output one or more micro-operations, micro-code entry points, microinstructions, other instructions, or other control signals, which may be decoded from, or which otherwise reflect, or may be derived from, the original instructions. The decoder may be implemented using various different mechanisms. Examples of suitable mechanisms include, but are not limited to, look-up tables, hardware implementations, programmable logic arrays (PLAs), microcode read-only memories (ROMs), etc. In one embodiment, instruction cache unit 434 may be further coupled to a level 2 (L2) cache unit 476 in memory unit 470. Decode unit 440 may be coupled to a rename/allocator unit 452 in execution engine unit 450.

Execution engine unit 450 may include rename/allocator unit 452 coupled to a retirement unit 454 and a set of one or more scheduler units 456. Scheduler units 456 represent any number of different schedulers, including reservations stations, central instruction window, etc. Scheduler units 456 may be coupled to physical register file units 458. Each of physical register file units 458 represents one or more physical register files, different ones of which store one or more different data types, such as scalar integer, scalar floating point, packed integer, packed floating point, vector integer, vector floating point, etc., status (e.g., an instruction pointer that is the address of the next instruction to be executed), etc. Physical register file units 458 may be overlapped by retirement unit 154 to illustrate various ways in which register renaming and out-of-order execution may be implemented (e.g., using one or more reorder buffers and one or more retirement register files, using one or more future files, one or more history buffers, and one or more retirement register files; using register maps and a pool of registers; etc.). Generally, the architectural registers may be visible from the outside of the processor or from a programmer's perspective. The registers might not be limited to any known particular type of circuit. Various different types of registers may be suitable as long as they store and provide data as described herein. Examples of suitable registers include, but might not be limited to, dedicated physical registers, dynamically allocated physical registers using register renaming, combinations of dedicated and dynamically allocated physical registers, etc. Retirement unit 454 and physical register file units 458 may be coupled to execution clusters 460. Execution clusters 460 may include a set of one or more execution units 162 and a set of one or more memory access units 464. Execution units 462 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. Scheduler units 456, physical register file units 458, and execution clusters 460 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file unit, and/or execution cluster—and in the case of a separate memory access pipeline, certain embodiments may be implemented in which only the execution cluster of this pipeline has memory access units 464). It should also be understood that where separate pipelines are used, one or more of these pipelines may be out-of-order issue/execution and the rest in-order.

The set of memory access units 464 may be coupled to memory unit 470, which may include a data TLB unit 472 coupled to a data cache unit 474 coupled to a level 2 (L2) cache unit 476. In one exemplary embodiment, memory access units 464 may include a load unit, a store address unit, and a store data unit, each of which may be coupled to data TLB unit 472 in memory unit 470. L2 cache unit 476 may be coupled to one or more other levels of cache and eventually to a main memory.

By way of example, the exemplary register renaming, out-of-order issue/execution core architecture may implement pipeline 400 as follows: 1) instruction fetch 438 may perform fetch and length decoding stages 402 and 404; 2) decode unit 440 may perform decode stage 406; 3) rename/allocator unit 452 may perform allocation stage 408 and renaming stage 410; 4) scheduler units 456 may perform schedule stage 412; 5) physical register file units 458 and memory unit 470 may perform register read/memory read stage 414; execution cluster 460 may perform execute stage 416; 6) memory unit 470 and physical register file units 458 may perform write-back/memory-write stage 418; 7) various units may be involved in the performance of exception handling stage 422; and 8) retirement unit 454 and physical register file units 458 may perform commit stage 424.

Core 490 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.).

It should be understood that the core may support multithreading (executing two or more parallel sets of operations or threads) in a variety of manners. Multithreading support may be performed by, for example, including time sliced multithreading, simultaneous multithreading (where a single physical core provides a logical core for each of the threads that physical core is simultaneously multithreading), or a combination thereof. Such a combination may include, for example, time sliced fetching and decoding and simultaneous multithreading thereafter such as in the Intel® Hyperthreading technology.

While register renaming may be described in the context of out-of-order execution, it should be understood that register renaming may be used in an in-order architecture. While the illustrated embodiment of the processor may also include a separate instruction and data cache units 434/474 and a shared L2 cache unit 476, other embodiments may have a single internal cache for both instructions and data, such as, for example, a Level 1 (L1) internal cache, or multiple levels of internal cache. In some embodiments, the system may include a combination of an internal cache and an external cache that may be external to the core and/or the processor. In other embodiments, all of the cache may be external to the core and/or the processor.

Figure 5A:
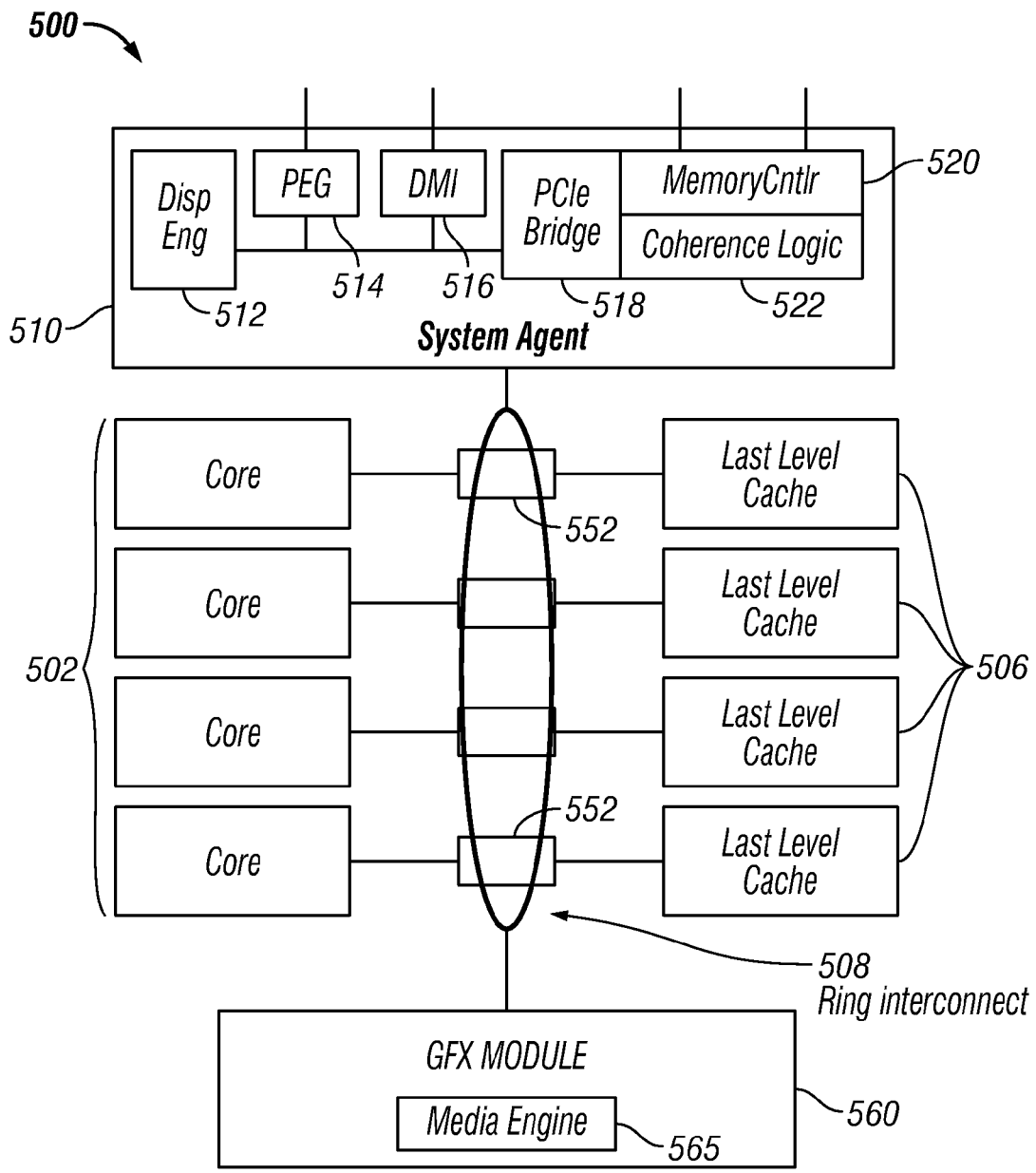
FIG. 5A is a block diagram of a processor, in accordance with embodiments of the present disclosure.

FIG. 5A is a block diagram of a processor 500, in accordance with embodiments of the present disclosure. In one embodiment, processor 500 may include a multicore processor. Processor 500 may include a system agent 510 communicatively coupled to one or more cores 502. Furthermore, cores 502 and system agent 510 may be communicatively coupled to one or more caches 506. Cores 502, system agent 510, and caches 506 may be communicatively coupled via one or more memory control units 552. Furthermore, cores 502, system agent 510, and caches 506 may be communicatively coupled to a graphics module 560 via memory control units 552.

Processor 500 may include any suitable mechanism for interconnecting cores 502, system agent 510, and caches 506, and graphics module 560. In one embodiment, processor 500 may include a ring-based interconnect unit 508 to interconnect cores 502, system agent 510, and caches 506, and graphics module 560. In other embodiments, processor 500 may include any number of well-known techniques for interconnecting such units. Ring-based interconnect unit 508 may utilize memory control units 552 to facilitate interconnections.

Processor 500 may include a memory hierarchy comprising one or more levels of caches within the cores, one or more shared cache units such as caches 506, or external memory (not shown) coupled to the set of integrated memory controller units 552. Caches 506 may include any suitable cache. In one embodiment, caches 506 may include one or more mid-level caches, such as Level 2 (L2), Level 3 (L3), Level 4 (L4), or other levels of cache, a last level cache (LLC), and/or combinations thereof.

In various embodiments, one or more of cores 502 may perform multi-threading. System agent 510 may include components for coordinating and operating cores 502. System agent unit 510 may include for example a Power Control Unit (PCU). The PCU may be or include logic and components needed for regulating the power state of cores 502. System agent 510 may include a display engine 512 for driving one or more externally connected displays or graphics module 560. System agent 510 may include an interface 1214 for communications busses for graphics. In one embodiment, interface 1214 may be implemented by PCI Express (PCIe). In a further embodiment, interface 1214 may be implemented by PCI Express Graphics (PEG). System agent 510 may include a direct media interface (DMI) 516. DMI 516 may provide links between different bridges on a motherboard or other portion of a computer system. System agent 510 may include a PCIe bridge 1218 for providing PCIe links to other elements of a computing system. PCIe bridge 1218 may be implemented using a memory controller 1220 and coherence logic 1222.

Cores 502 may be implemented in any suitable manner. Cores 502 may be homogenous or heterogeneous in terms of architecture and/or instruction set. In one embodiment, some of cores 502 may be in-order while others may be out-of-order. In another embodiment, two or more of cores 502 may execute the same instruction set, while others may execute only a subset of that instruction set or a different instruction set.

Processor 500 may include a general-purpose processor, such as a Core™ i3, i5, i7, 2 Duo and Quad, Xeon™, Itanium™, XScale™ or StrongARM™ processor, which may be available from Intel Corporation, of Santa Clara, Calif. Processor 500 may be provided from another company, such as ARM Holdings, Ltd, MIPS, etc. Processor 500 may be a special-purpose processor, such as, for example, a network or communication processor, compression engine, graphics processor, co-processor, embedded processor, or the like. Processor 500 may be implemented on one or more chips. Processor 500 may be a part of and/or may be implemented on one or more substrates using any of a number of process technologies, such as, for example, BiCMOS, CMOS, or NMOS.

In one embodiment, a given one of caches 506 may be shared by multiple ones of cores 502. In another embodiment, a given one of caches 506 may be dedicated to one of cores 502. The assignment of caches 506 to cores 502 may be handled by a cache controller or other suitable mechanism. A given one of caches 506 may be shared by two or more cores 502 by implementing time-slices of a given cache 506.

Graphics module 560 may implement an integrated graphics processing subsystem. In one embodiment, graphics module 560 may include a graphics processor. Furthermore, graphics module 560 may include a media engine 565. Media engine 565 may provide media encoding and video decoding.

Figure 5B:
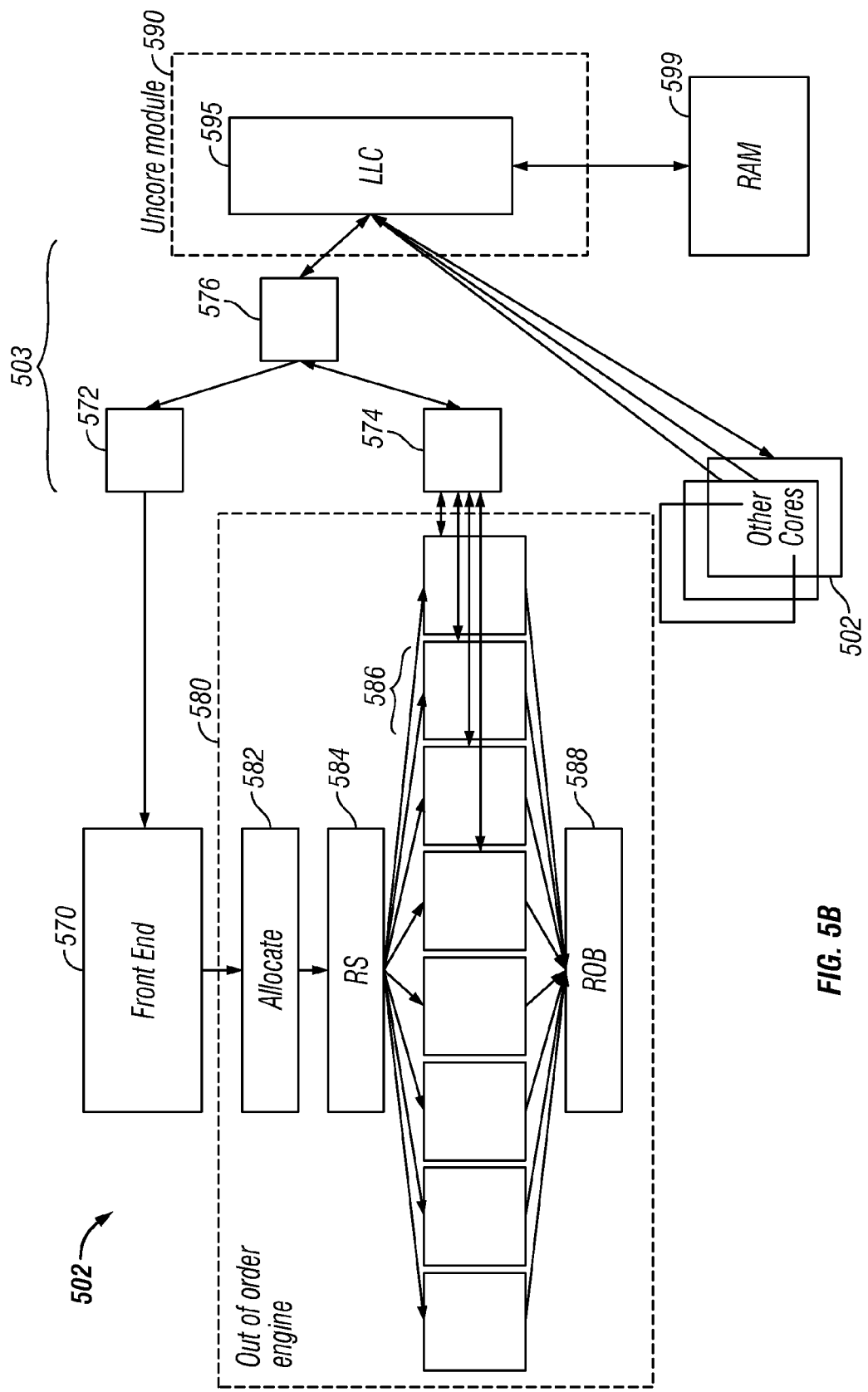
FIG. 5B is a block diagram of an example implementation of a core, in accordance with embodiments of the present disclosure.

FIG. 5B is a block diagram of an example implementation of a core 502, in accordance with embodiments of the present disclosure. Core 502 may include a front end 570 communicatively coupled to an out-of-order engine 580. Core 502 may be communicatively coupled to other portions of processor 500 through cache hierarchy 503.

Front end 570 may be implemented in any suitable manner, such as fully or in part by front end 201 as described above. In one embodiment, front end 570 may communicate with other portions of processor 500 through cache hierarchy 503. In a further embodiment, front end 570 may fetch instructions from portions of processor 500 and prepare the instructions to be used later in the processor pipeline as they are passed to out-of-order execution engine 580.

Out-of-order execution engine 580 may be implemented in any suitable manner, such as fully or in part by out-of-order execution engine 203 as described above. Out-of-order execution engine 580 may prepare instructions received from front end 570 for execution. Out-of-order execution engine 580 may include an allocate module 1282. In one embodiment, allocate module 1282 may allocate resources of processor 500 or other resources, such as registers or buffers, to execute a given instruction. Allocate module 1282 may make allocations in schedulers, such as a memory scheduler, fast scheduler, or floating point scheduler. Such schedulers may be represented in FIG. 5B by resource schedulers 584. Allocate module 1282 may be implemented fully or in part by the allocation logic described in conjunction with FIG. 2. Resource schedulers 584 may determine when an instruction is ready to execute based on the readiness of a given resource's sources and the availability of execution resources needed to execute an instruction. Resource schedulers 584 may be implemented by, for example, schedulers 202, 204, 206 as discussed above. Resource schedulers 584 may schedule the execution of instructions upon one or more resources. In one embodiment, such resources may be internal to core 502, and may be illustrated, for example, as resources 586. In another embodiment, such resources may be external to core 502 and may be accessible by, for example, cache hierarchy 503. Resources may include, for example, memory, caches, register files, or registers. Resources internal to core 502 may be represented by resources 586 in FIG. 5B. As necessary, values written to or read from resources 586 may be coordinated with other portions of processor 500 through, for example, cache hierarchy 503. As instructions are assigned resources, they may be placed into a reorder buffer 588. Reorder buffer 588 may track instructions as they are executed and may selectively reorder their execution based upon any suitable criteria of processor 500. In one embodiment, reorder buffer 588 may identify instructions or a series of instructions that may be executed independently. Such instructions or a series of instructions may be executed in parallel from other such instructions. Parallel execution in core 502 may be performed by any suitable number of separate execution blocks or virtual processors. In one embodiment, shared resources—such as memory, registers, and caches—may be accessible to multiple virtual processors within a given core 502. In other embodiments, shared resources may be accessible to multiple processing entities within processor 500.

Cache hierarchy 503 may be implemented in any suitable manner. For example, cache hierarchy 503 may include one or more lower or mid-level caches, such as caches 572, 574. In one embodiment, cache hierarchy 503 may include an LLC 595 communicatively coupled to caches 572, 574. In another embodiment, LLC 595 may be implemented in a module 590 accessible to all processing entities of processor 500. In a further embodiment, module 590 may be implemented in an uncore module of processors from Intel, Inc. Module 590 may include portions or subsystems of processor 500 necessary for the execution of core 502 but might not be implemented within core 502. Besides LLC 595, Module 590 may include, for example, hardware interfaces, memory coherency coordinators, interprocessor interconnects, instruction pipelines, or memory controllers. Access to RAM 599 available to processor 500 may be made through module 590 and, more specifically, LLC 595. Furthermore, other instances of core 502 may similarly access module 590. Coordination of the instances of core 502 may be facilitated in part through module 590.

Figure 6:
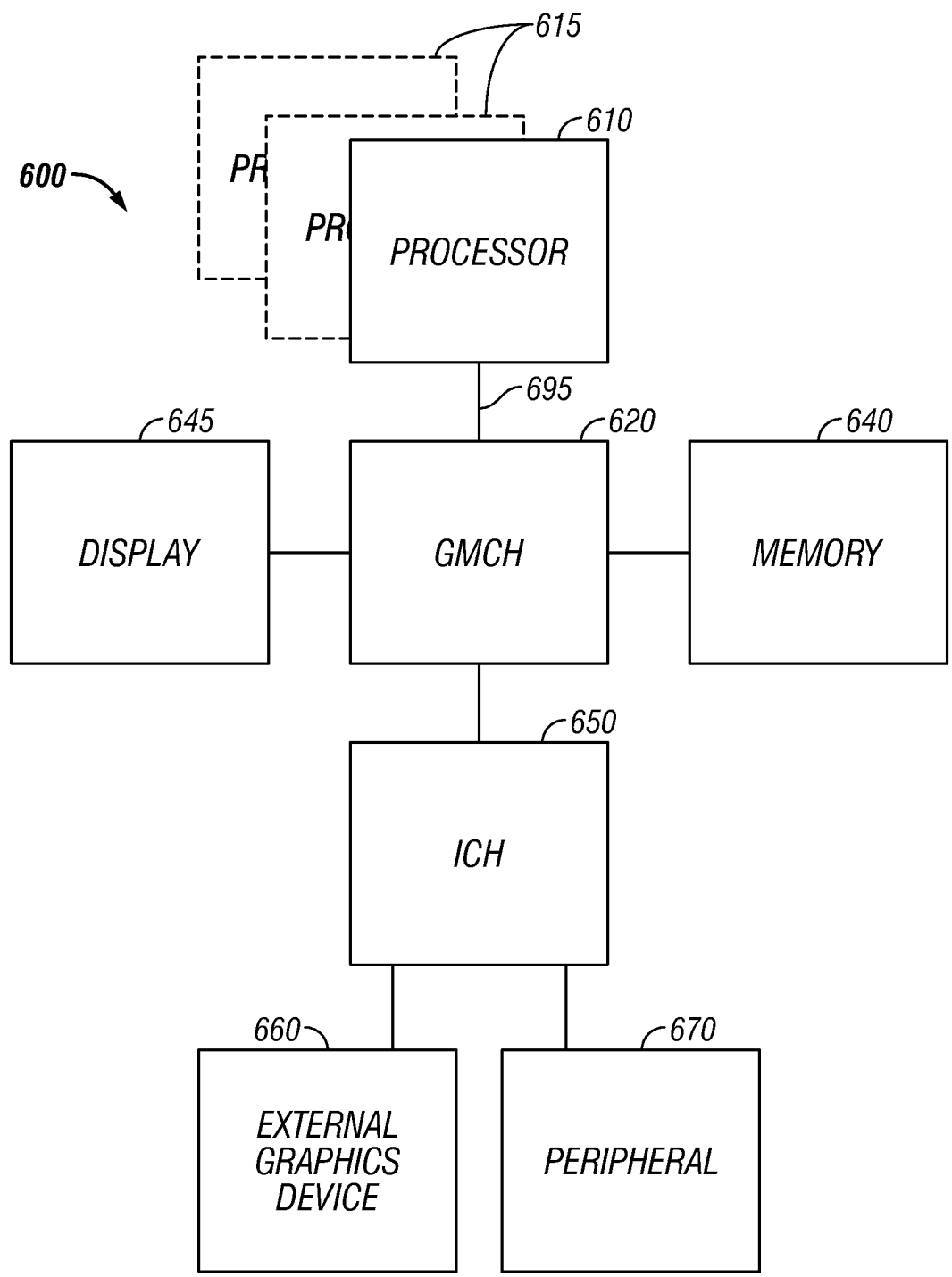
FIG. 6 is a block diagram of a system, in accordance with embodiments of the present disclosure.
Figure 7:
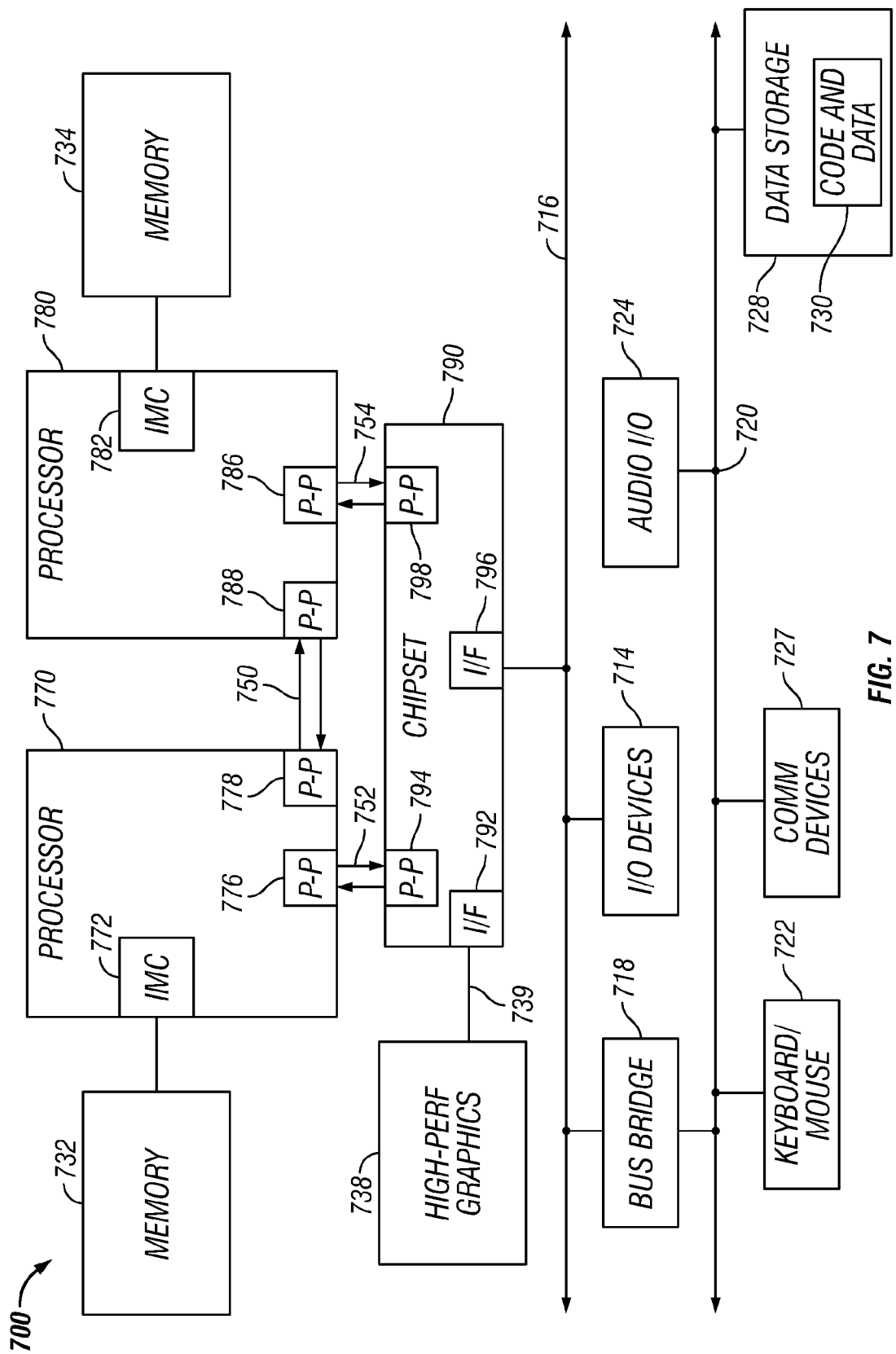
FIG. 7 is a block diagram of a second system, in accordance with embodiments of the present disclosure.
Figure 8:
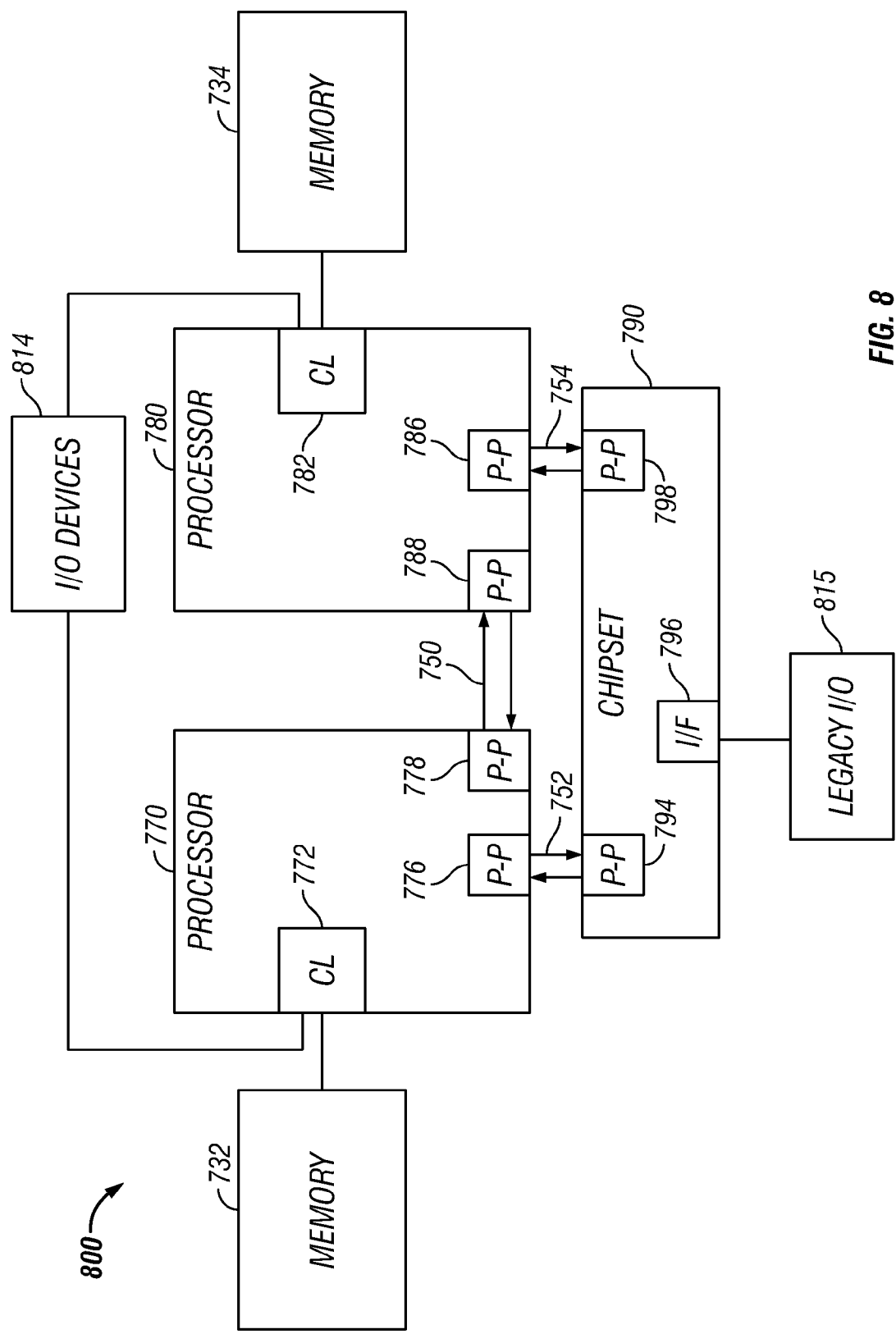
FIG. 8 is a block diagram of a third system in accordance with embodiments of the present disclosure.
Figure 9:
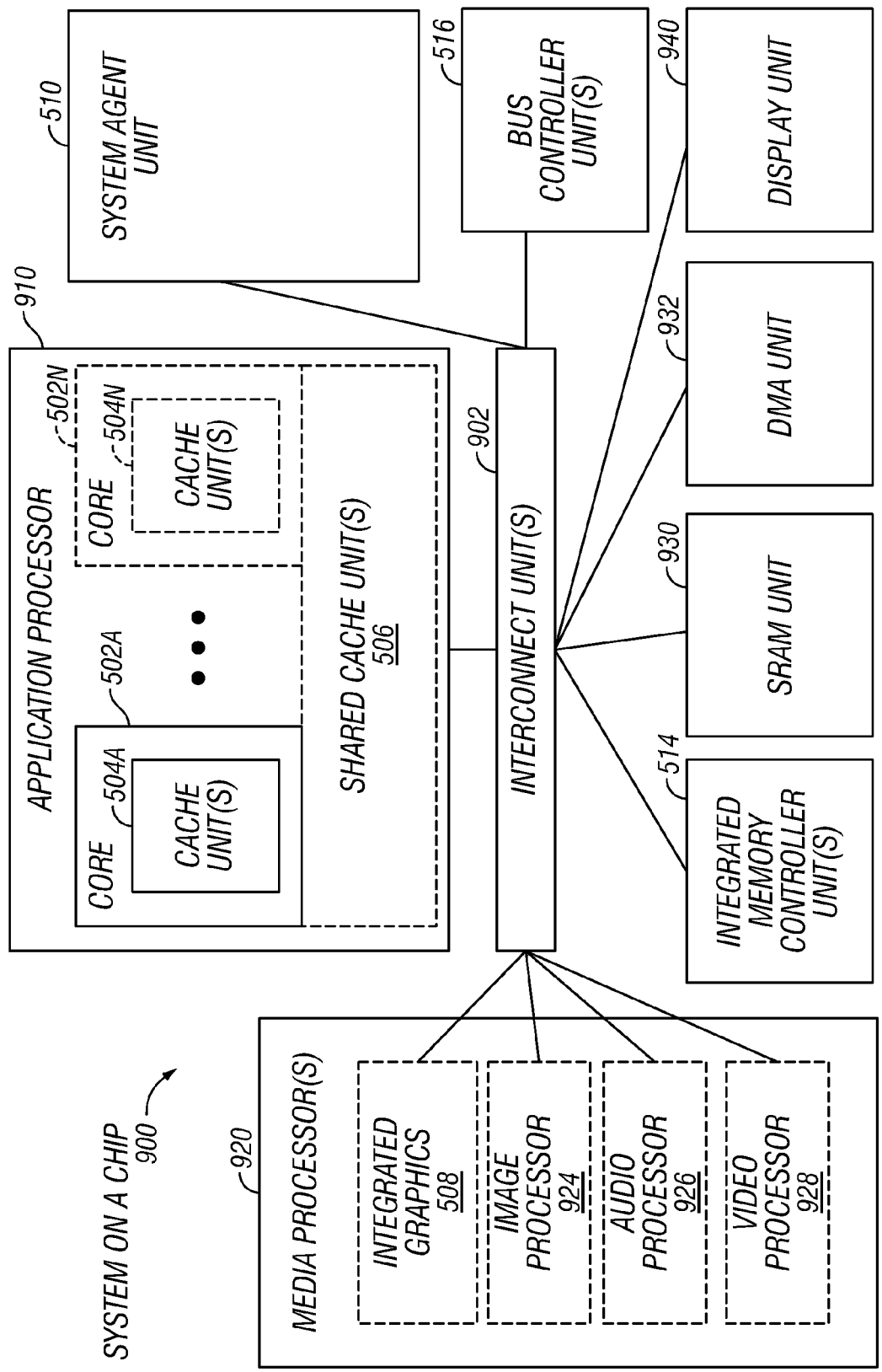
FIG. 9 is a block diagram of a system-on-a-chip, in accordance with embodiments of the present disclosure.

FIGS. 6-8 may illustrate exemplary systems suitable for including processor 500, while FIG. 9 may illustrate an exemplary System on a Chip (SoC) that may include one or more of cores 502. Other system designs and implementations known in the arts for laptops, desktops, handheld PCs, personal digital assistants, engineering workstations, servers, network devices, network hubs, switches, embedded processors, DSPs, graphics devices, video game devices, set-top boxes, micro controllers, cell phones, portable media players, hand held devices, and various other electronic devices, may also be suitable. In general, a huge variety of systems or electronic devices that incorporate a processor and/or other execution logic as disclosed herein may be generally suitable.

FIG. 6 illustrates a block diagram of a system 600, in accordance with embodiments of the present disclosure. System 600 may include one or more processors 610, 615, which may be coupled to Graphics Memory Controller Hub (GMCH) 620. The optional nature of additional processors 615 is denoted in FIG. 6 with broken lines.

Each processor 610,615 may be some version of processor 500. However, it should be noted that integrated graphics logic and integrated memory control units might not exist in processors 610,615. FIG. 6 illustrates that GMCH 620 may be coupled to a memory 640 that may be, for example, a dynamic random access memory (DRAM). The DRAM may, for at least one embodiment, be associated with a non-volatile cache.

GMCH 620 may be a chipset, or a portion of a chipset. GMCH 620 may communicate with processors 610, 615 and control interaction between processors 610, 615 and memory 640. GMCH 620 may also act as an accelerated bus interface between the processors 610, 615 and other elements of system 600. In one embodiment, GMCH 620 communicates with processors 610, 615 via a multi-drop bus, such as a frontside bus (FSB) 695.

Furthermore, GMCH 620 may be coupled to a display 645 (such as a flat panel display). In one embodiment, GMCH 620 may include an integrated graphics accelerator. GMCH 620 may be further coupled to an input/output (I/O) controller hub (ICH) 650, which may be used to couple various peripheral devices to system 600. External graphics device 660 may include be a discrete graphics device coupled to ICH 650 along with another peripheral device 670.

In other embodiments, additional or different processors may also be present in system 600. For example, additional processors 610, 615 may include additional processors that may be the same as processor 610, additional processors that may be heterogeneous or asymmetric to processor 610, accelerators (such as, e.g., graphics accelerators or digital signal processing (DSP) units), field programmable gate arrays, or any other processor. There may be a variety of differences between the physical resources 610, 615 in terms of a spectrum of metrics of merit including architectural, micro-architectural, thermal, power consumption characteristics, and the like. These differences may effectively manifest themselves as asymmetry and heterogeneity amongst processors 610, 615. For at least one embodiment, various processors 610, 615 may reside in the same die package.

FIG. 7 illustrates a block diagram of a second system 700, in accordance with embodiments of the present disclosure. As shown in FIG. 7, multiprocessor system 700 may include a point-to-point interconnect system, and may include a first processor 770 and a second processor 780 coupled via a point-to-point interconnect 750. Each of processors 770 and 780 may be some version of processor 500 as one or more of processors 610,615.

While FIG. 7 may illustrate two processors 770, 780, it is to be understood that the scope of the present disclosure is not so limited. In other embodiments, one or more additional processors may be present in a given processor.

Processors 770 and 780 are shown including integrated memory controller units 772 and 782, respectively. Processor 770 may also include as part of its bus controller units point-to-point (P-P) interfaces 776 and 778; similarly, second processor 780 may include P-P interfaces 786 and 788. Processors 770, 780 may exchange information via a point-to-point (P-P) interface 750 using P-P interface circuits 778, 788. As shown in FIG. 7, IMCs 772 and 782 may couple the processors to respective memories, namely a memory 732 and a memory 734, which in one embodiment may be portions of main memory locally attached to the respective processors.

Processors 770, 780 may each exchange information with a chipset 790 via individual P-P interfaces 752, 754 using point to point interface circuits 776, 794, 786, 798. In one embodiment, chipset 790 may also exchange information with a high-performance graphics circuit 738 via a high-performance graphics interface 739.

A shared cache (not shown) may be included in either processor or outside of both processors, yet connected with the processors via P-P interconnect, such that either or both processors' local cache information may be stored in the shared cache if a processor is placed into a low power mode.

Chipset 790 may be coupled to a first bus 716 via an interface 796. In one embodiment, first bus 716 may be a Peripheral Component Interconnect (PCI) bus, or a bus such as a PCI Express bus or another third generation I/O interconnect bus, although the scope of the present disclosure is not so limited.

As shown in FIG. 7, various I/O devices 714 may be coupled to first bus 716, along with a bus bridge 718 which couples first bus 716 to a second bus 720. In one embodiment, second bus 720 may be a Low Pin Count (LPC) bus. Various devices may be coupled to second bus 720 including, for example, a keyboard and/or mouse 722, communication devices 727 and a storage unit 728 such as a disk drive or other mass storage device which may include instructions/code and data 730, in one embodiment. Further, an audio I/O 724 may be coupled to second bus 720. Note that other architectures may be possible. For example, instead of the point-to-point architecture of FIG. 7, a system may implement a multi-drop bus or other such architecture.

FIG. 8 illustrates a block diagram of a third system 800 in accordance with embodiments of the present disclosure. Like elements in FIGS. 7 and 8 bear like reference numerals, and certain aspects of FIG. 7 have been omitted from FIG. 8 in order to avoid obscuring other aspects of FIG. 8.

FIG. 8 illustrates that processors 870, 880 may include integrated memory and I/O Control Logic ("CL") 872 and 882, respectively. For at least one embodiment, CL 872, 882 may include integrated memory controller units such as that described above in connection with FIGS. 5 and 7. In addition. CL 872, 882 may also include I/O control logic. FIG. 8 illustrates that not only memories 832, 834 may be coupled to CL 872, 882, but also that I/O devices 814 may also be coupled to control logic 872, 882. Legacy I/O devices 815 may be coupled to chipset 890.

FIG. 9 illustrates a block diagram of a SoC 900, in accordance with embodiments of the present disclosure. Similar elements in FIG. 5 bear like reference numerals. Also, dashed lined boxes may represent optional features on more advanced SoCs. An interconnect units 902 may be coupled to: an application processor 910 which may include a set of one or more cores 902A-N and shared cache units 906; a system agent unit 910; a bus controller units 916; an integrated memory controller units 914; a set or one or more media processors 920 which may include integrated graphics logic 908, an image processor 924 for providing still and/or video camera functionality, an audio processor 926 for providing hardware audio acceleration, and a video processor 928 for providing video encode/decode acceleration; an SRAM unit 930; a DMA unit 932; and a display unit 940 for coupling to one or more external displays.

Figure 10:
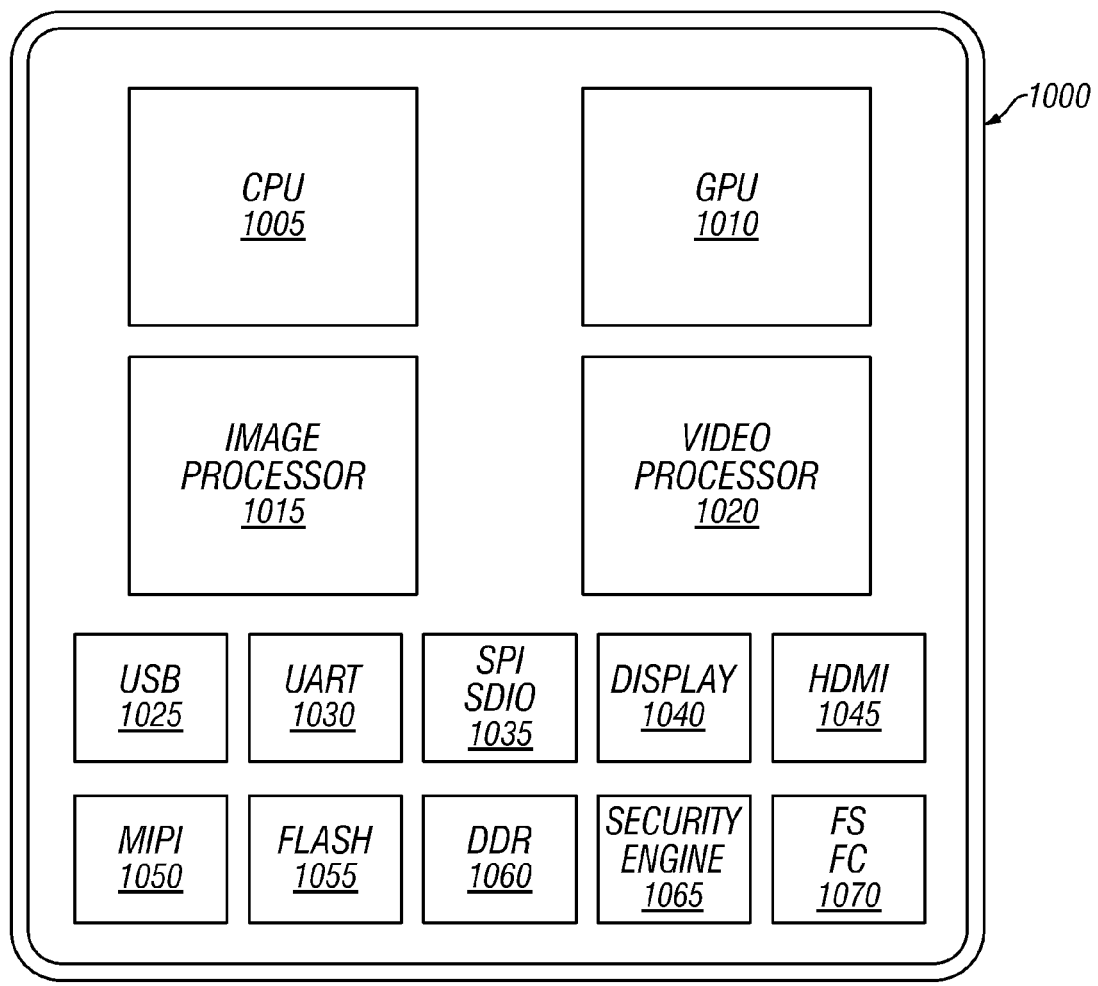
FIG. 10 illustrates a processor containing a central processing unit and a graphics processing unit which may perform at least one instruction, in accordance with embodiments of the present disclosure.

FIG. 10 illustrates a processor containing a Central Processing Unit (CPU) and a graphics processing unit (GPU), which may perform at least one instruction, in accordance with embodiments of the present disclosure. In one embodiment, an instruction to perform operations according to at least one embodiment could be performed by the CPU. In another embodiment, the instruction could be performed by the GPU. In still another embodiment, the instruction may be performed through a combination of operations performed by the GPU and the CPU. For example, in one embodiment, an instruction in accordance with one embodiment may be received and decoded for execution on the GPU. However, one or more operations within the decoded instruction may be performed by a CPU and the result returned to the GPU for final retirement of the instruction. Conversely, in some embodiments, the CPU may act as the primary processor and the GPU as the co-processor.

In some embodiments, instructions that benefit from highly parallel, throughput processors may be performed by the GPU, while instructions that benefit from the performance of processors that benefit from deeply pipelined architectures may be performed by the CPU. For example, graphics, scientific applications, financial applications and other parallel workloads may benefit from the performance of the GPU and be executed accordingly, whereas more sequential applications, such as operating system kernel or application code may be better suited for the CPU.

In FIG. 10, processor 1000 includes a CPU 1005, GPU 1010, image processor 1015, video processor 1020, USB controller 1025, UART controller 1030, SPI/SDIO controller 1035, display device 1040, memory interface controller 1045, MIPI controller 1050, flash memory controller 1055, Dual Data Rate (DDR) controller 1060, security engine 1065, and $I^2S/I^2C$ controller 1070. Other logic and circuits may be included in the processor of FIG. 10, including more CPUs or GPUs and other peripheral interface controllers.

One or more aspects of at least one embodiment may be implemented by representative data stored on a machine-readable medium which represents various logic within the processor, which when read by a machine causes the machine to fabricate logic to perform the techniques described herein. Such representations, known as "IP cores" may be stored on a tangible, machine-readable medium ("tape") and supplied to various customers or manufacturing facilities to load into the fabrication machines that actually make the logic or processor. For example, IP cores, such as the Cortex™ family of processors developed by ARM Holdings, Ltd. and Loongson IP cores developed the Institute of Computing Technology (ICT) of the Chinese Academy of Sciences may be licensed or sold to various customers or licensees, such as Texas Instruments, Qualcomm, Apple, or Samsung and implemented in processors produced by these customers or licensees.

Figure 11:
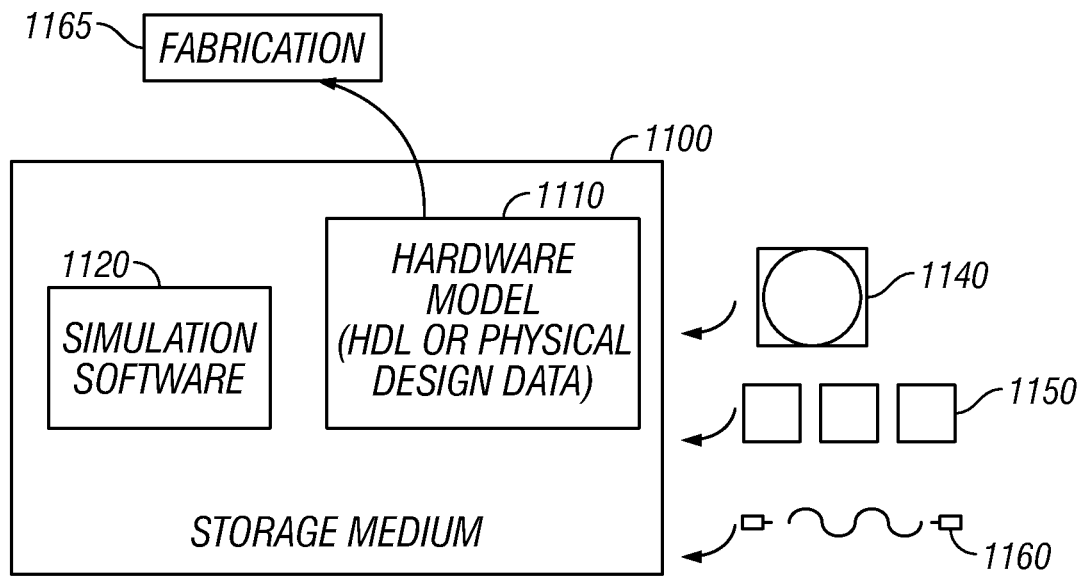
FIG. 11 is a block diagram illustrating the development of IP cores, in accordance with embodiments of the present disclosure.

FIG. 11 illustrates a block diagram illustrating the development of IP cores, in accordance with embodiments of the present disclosure. Storage 1130 may include simulation software 1120 and/or hardware or software model 1110. In one embodiment, the data representing the IP core design may be provided to storage 1130 via memory 1140 (e.g., hard disk), wired connection (e.g., internet) 1150 or wireless connection 1160. The IP core information generated by the simulation tool and model may then be transmitted to a fabrication facility where it may be fabricated by a third party to perform at least one instruction in accordance with at least one embodiment.

In some embodiments, one or more instructions may correspond to a first type or architecture (e.g., x86) and be translated or emulated on a processor of a different type or architecture (e.g., ARM). An instruction, according to one embodiment, may therefore be performed on any processor or processor type, including ARM, x86, MIPS, a GPU, or other processor type or architecture.

Figure 12:
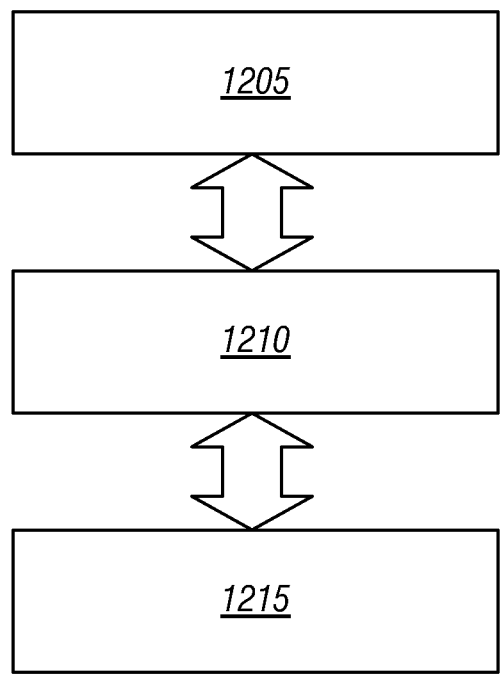
FIG. 12 illustrates how an instruction of a first type may be emulated by a processor of a different type, in accordance with embodiments of the present disclosure.

FIG. 12 illustrates how an instruction of a first type may be emulated by a processor of a different type, in accordance with embodiments of the present disclosure. In FIG. 12, program 1205 contains some instructions that may perform the same or substantially the same function as an instruction according to one embodiment. However the instructions of program 1205 may be of a type and/or format that is different from or incompatible with processor 1215, meaning the instructions of the type in program 1205 may not be able to execute natively by the processor 1215. However, with the help of emulation logic, 1210, the instructions of program 1205 may be translated into instructions that may be natively be executed by the processor 1215. In one embodiment, the emulation logic may be embodied in hardware. In another embodiment, the emulation logic may be embodied in a tangible, machine-readable medium containing software to translate instructions of the type in program 1205 into the type natively executable by processor 1215. In other embodiments, emulation logic may be a combination of fixed-function or programmable hardware and a program stored on a tangible, machine-readable medium. In one embodiment, the processor contains the emulation logic, whereas in other embodiments, the emulation logic exists outside of the processor and may be provided by a third party. In one embodiment, the processor may load the emulation logic embodied in a tangible, machine-readable medium containing software by executing microcode or firmware contained in or associated with the processor.

Figure 13:
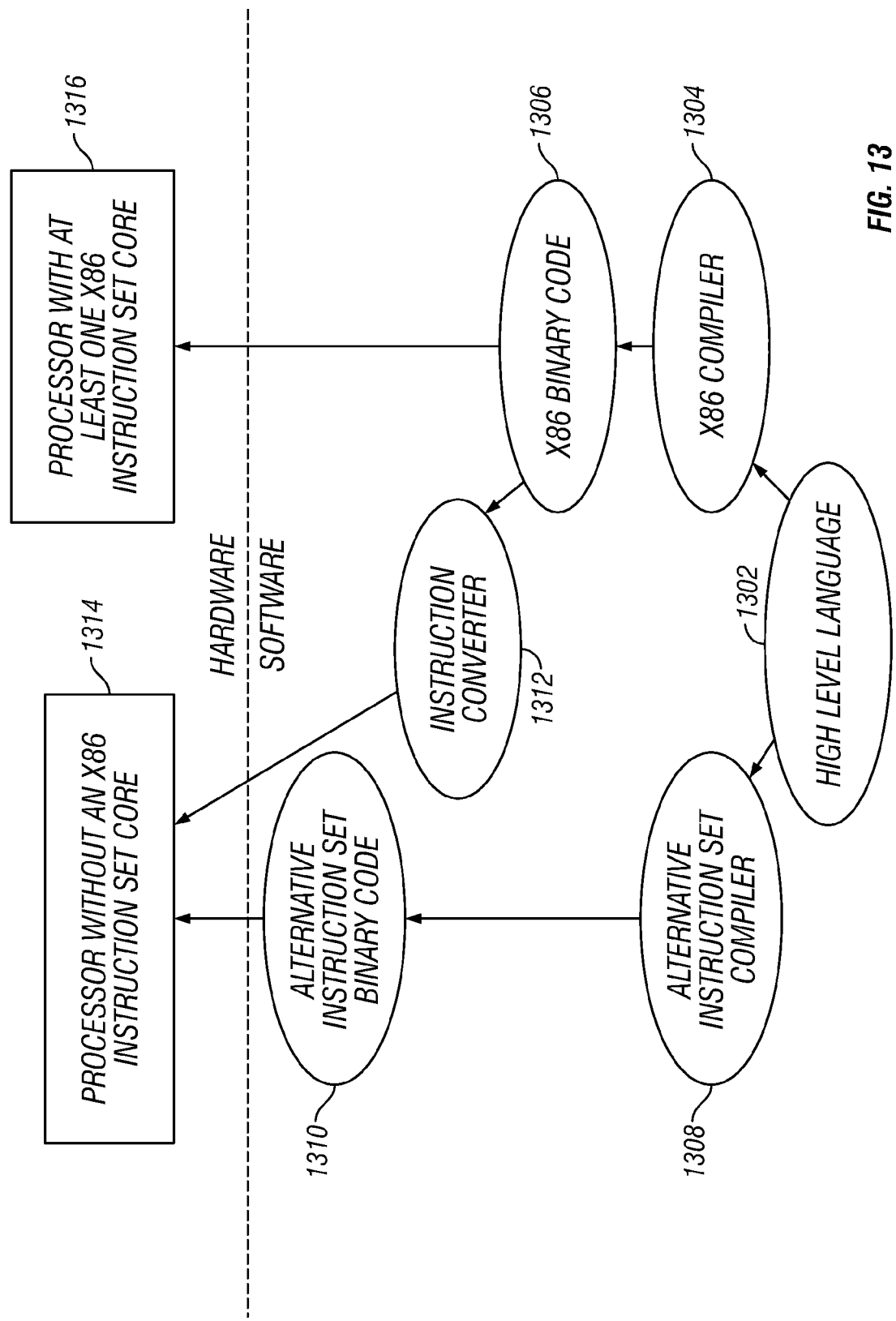
FIG. 13 illustrates a block diagram contrasting the use of a software instruction converter to convert binary instructions in a source instruction set to binary instructions in a target instruction set, in accordance with embodiments of the present disclosure.

FIG. 13 illustrates a block diagram contrasting the use of a software instruction converter to convert binary instructions in a source instruction set to binary instructions in a target instruction set, in accordance with embodiments of the present disclosure. In the illustrated embodiment, the instruction converter may be a software instruction converter, although the instruction converter may be implemented in software, firmware, hardware, or various combinations thereof. FIG. 13 shows a program in a high level language 1302 may be compiled using an x86 compiler 1304 to generate x86 binary code 1306 that may be natively executed by a processor with at least one x86 instruction set core 1316. The processor with at least one x86 instruction set core 1316 represents any processor that may perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. x86 compiler 1304 represents a compiler that may be operable to generate x86 binary code 1306 (e.g., object code) that may, with or without additional linkage processing, be executed on the processor with at least one x86 instruction set core 1316. Similarly, FIG. 13 shows the program in high level language 1302 may be compiled using an alternative instruction set compiler 1308 to generate alternative instruction set binary code 1310 that may be natively executed by a processor without at least one x86 instruction set core 1314 (e.g., a processor with cores that execute the MIPS instruction set of MIPS Technologies of Sunnyvale, Calif. and/or that execute the ARM instruction set of ARM Holdings of Sunnyvale, Calif.). Instruction converter 1312 may be used to convert x86 binary code 1306 into code that may be natively executed by the processor without an x86 instruction set core 1314. This converted code might not be the same as alternative instruction set binary code 1310; however, the converted code will accomplish the general operation and be made up of instructions from the alternative instruction set. Thus, instruction converter 1312 represents software, firmware, hardware, or a combination thereof that, through emulation, simulation or any other process, allows a processor or other electronic device that does not have an x86 instruction set processor or core to execute x86 binary code 1306.

Figure 14:
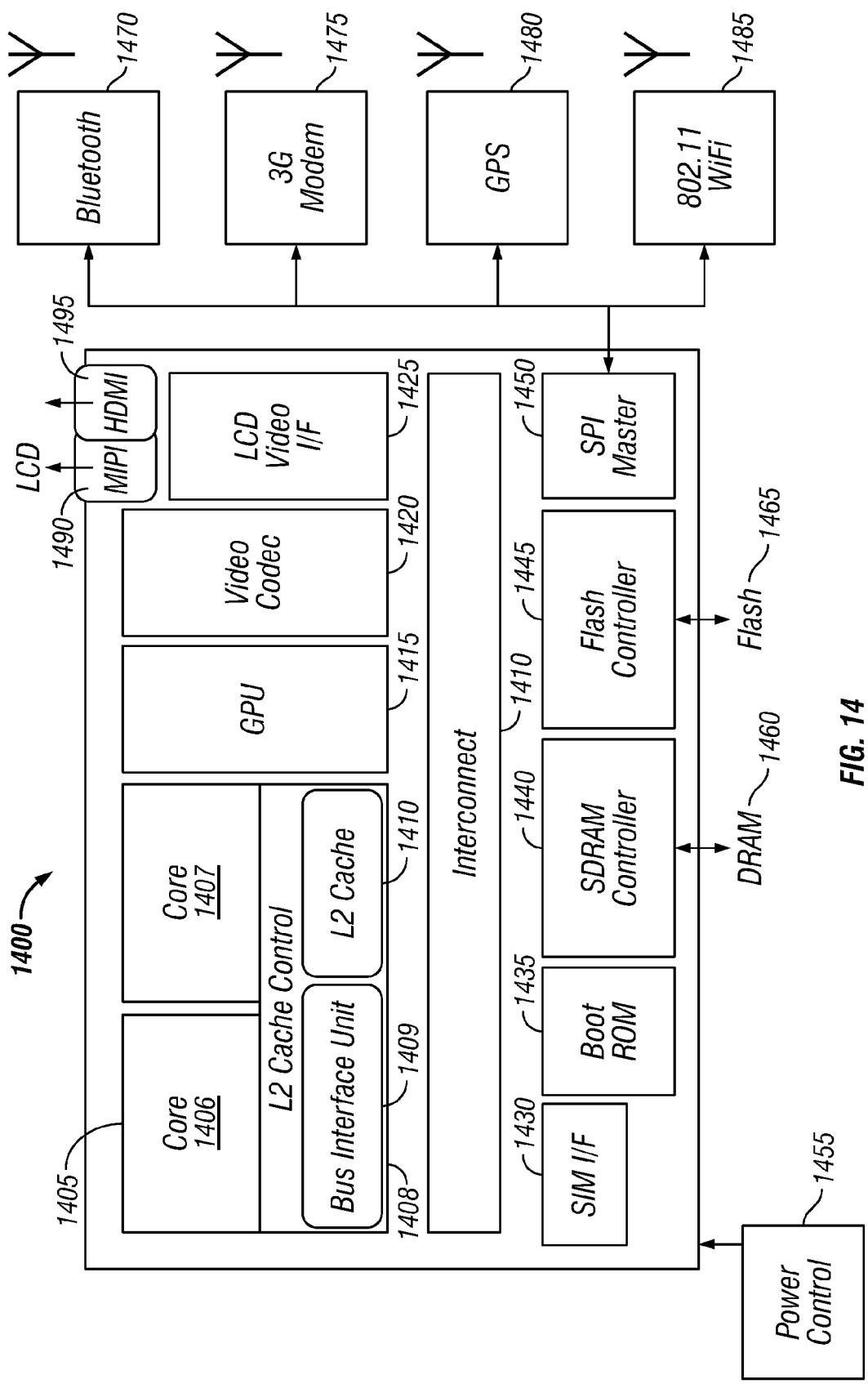
FIG. 14 is a block diagram of an instruction set architecture of a processor, in accordance with embodiments of the present disclosure.

FIG. 14 is a block diagram of an instruction set architecture 1400 of a processor, in accordance with embodiments of the present disclosure. Instruction set architecture 1400 may include any suitable number or kind of components.

For example, instruction set architecture 1400 may include processing entities such as one or more cores 1406, 1407 and a graphics processing unit 1415. Cores 1406, 1407 may be communicatively coupled to the rest of instruction set architecture 1400 through any suitable mechanism, such as through a bus or cache. In one embodiment, cores 1406, 1407 may be communicatively coupled through an L2 cache control 1408, which may include a bus interface unit 1409 and an L2 cache 1410. Cores 1406, 1407 and graphics processing unit 1415 may be communicatively coupled to each other and to the remainder of instruction set architecture 1400 through interconnect 1410. In one embodiment, graphics processing unit 1415 may use a video code 1420 defining the manner in which particular video signals will be encoded and decoded for output.

Instruction set architecture 1400 may also include any number or kind of interfaces, controllers, or other mechanisms for interfacing or communicating with other portions of an electronic device or system. Such mechanisms may facilitate interaction with, for example, peripherals, communications devices, other processors, or memory. In the example of FIG. 14, instruction set architecture 1400 may include an LCD video interface 1425, a Subscriber Interface Module (SIM) interface 1430, a boot ROM interface 1435, an SDRAM controller 1440, a flash controller 1445, and a Serial Peripheral Interface (SPI) master unit 1450. LCD video interface 1425 may provide output of video signals from, for example, GPU 1415 and through, for example, a Mobile Industry Processor Interface (MIPI) 1490 or a High-Definition Multimedia Interface (HDMI) 1495 to a display. Such a display may include, for example, an LCD. SIM interface 1430 may provide access to or from a SIM card or device. SDRAM controller 1440 may provide access to or from memory such as an SDRAM chip or module. Flash controller 1445 may provide access to or from memory such as flash memory or other instances of RAM. SPI master unit 1450 may provide access to or from communications modules, such as a Bluetooth module 1470, high-speed 3G modem 1475, global positioning system module 1480, or wireless module 1485 implementing a communications standard such as 802.11.

Figure 15:
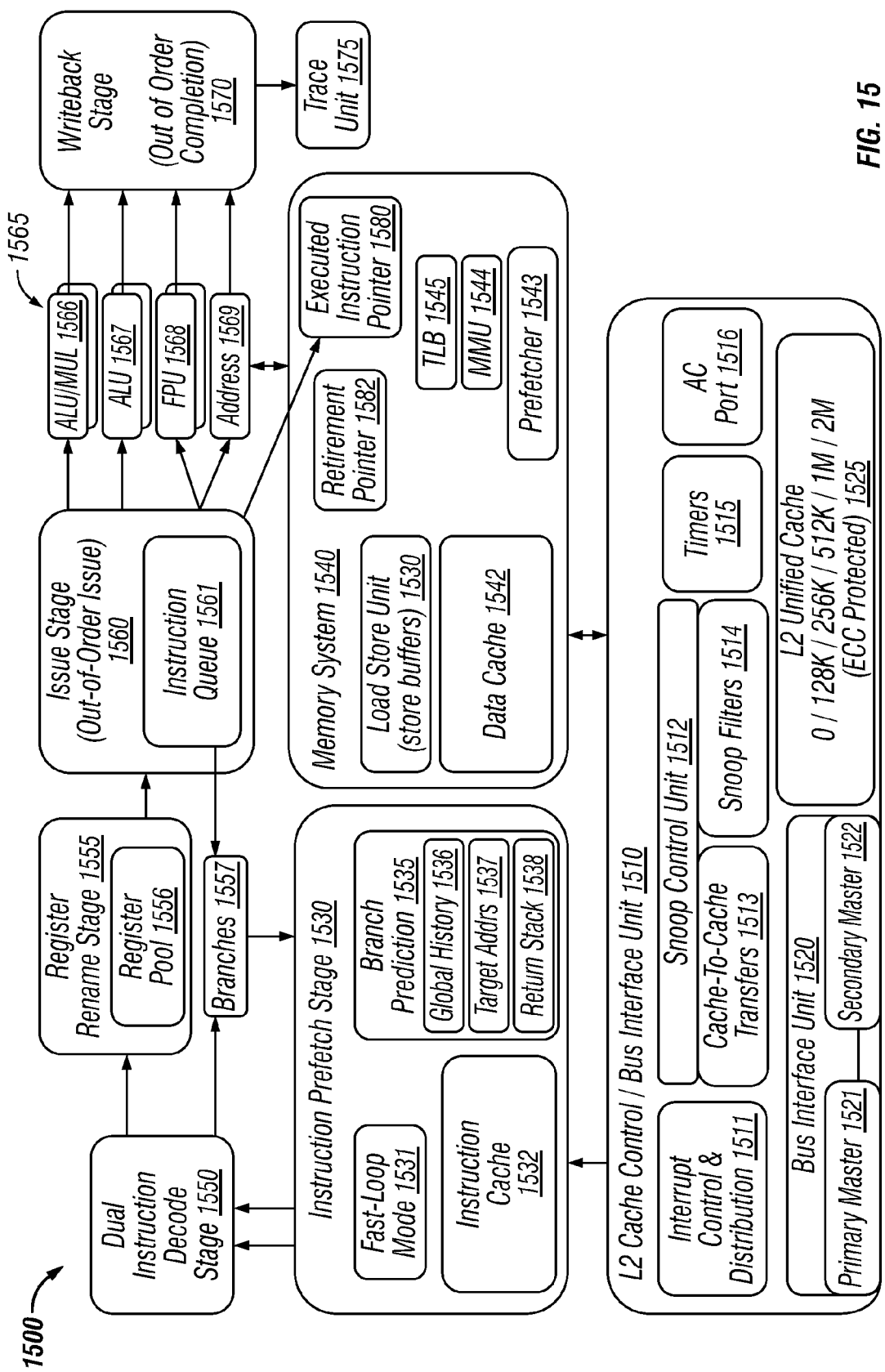
FIG. 15 is a more detailed block diagram of an instruction set architecture of a processor, in accordance with embodiments of the present disclosure.

FIG. 15 is a more detailed block diagram of an instruction set architecture 1500 of a processor, in accordance with embodiments of the present disclosure. Instruction architecture 1500 may implement one or more aspects of instruction set architecture 1400. Furthermore, instruction set architecture 1500 may illustrate modules and mechanisms for the execution of instructions within a processor.

Instruction architecture 1500 may include a memory system 1540 communicatively coupled to one or more execution entities 1565. Furthermore, instruction architecture 1500 may include a caching and bus interface unit such as unit 1510 communicatively coupled to execution entities 1565 and memory system 1540. In one embodiment, loading of instructions into execution entities 1564 may be performed by one or more stages of execution. Such stages may include, for example, instruction prefetch stage 1530, dual instruction decode stage 1550, register rename stage 155, issue stage 1560, and writeback stage 1570.

In one embodiment, memory system 1540 may include an executed instruction pointer 1580. Executed instruction pointer 1580 may store a value identifying the oldest, undispatched instruction within a batch of instructions. The oldest instruction may correspond to the lowest Program Order (PO) value. A PO may include a unique number of an instruction. Such an instruction may be a single instruction within a thread represented by multiple strands. A PO may be used in ordering instructions to ensure correct execution semantics of code. A PO may be reconstructed by mechanisms such as evaluating increments to PO encoded in the instruction rather than an absolute value. Such a reconstructed PO may be known as an "RPO." Although a PO may be referenced herein, such a PO may be used interchangeably with an RPO. A strand may include a sequence of instructions that are data dependent upon each other. The strand may be arranged by a binary translator at compilation time. Hardware executing a strand may execute the instructions of a given strand in order according to PO of the various instructions. A thread may include multiple strands such that instructions of different strands may depend upon each other. A PO of a given strand may be the PO of the oldest instruction in the strand which has not yet been dispatched to execution from an issue stage. Accordingly, given a thread of multiple strands, each strand including instructions ordered by PO, executed instruction pointer 1580 may store the oldest—illustrated by the lowest number—PO in the thread.

In another embodiment, memory system 1540 may include a retirement pointer 1582. Retirement pointer 1582 may store a value identifying the PO of the last retired instruction. Retirement pointer 1582 may be set by, for example, retirement unit 454. If no instructions have yet been retired, retirement pointer 1582 may include a null value.

Execution entities 1565 may include any suitable number and kind of mechanisms by which a processor may execute instructions. In the example of FIG. 15, execution entities 1565 may include ALU/Multiplication Units (MUL) 1566, ALUs 1567, and Floating Point Units (FPU) 1568. In one embodiment, such entities may make use of information contained within a given address 1569. Execution entities 1565 in combination with stages 1530, 1550, 1555, 1560, 1570 may collectively form an execution unit.

Unit 1510 may be implemented in any suitable manner. In one embodiment, unit 1510 may perform cache control. In such an embodiment, unit 1510 may thus include a cache 1525. Cache 1525 may be implemented, in a further embodiment, as an L2 unified cache with any suitable size, such as zero, 128 k, 256 k, 512 k, 1M, or 2M bytes of memory. In another, further embodiment, cache 1525 may be implemented in error-correcting code memory. In another embodiment, unit 1510 may perform bus interfacing to other portions of a processor or electronic device. In such an embodiment, unit 1510 may thus include a bus interface unit 1520 for communicating over an interconnect, intraprocessor bus, interprocessor bus, or other communication bus, port, or line. Bus interface unit 1520 may provide interfacing in order to perform, for example, generation of the memory and input/output addresses for the transfer of data between execution entities 1565 and the portions of a system external to instruction architecture 1500.

To further facilitate its functions, bus interface unit 1520 may include an interrupt control and distribution unit 1511 for generating interrupts and other communications to other portions of a processor or electronic device. In one embodiment, bus interface unit 1520 may include a snoop control unit 1512 that handles cache access and coherency for multiple processing cores. In a further embodiment, to provide such functionality, snoop control unit 1512 may include a cache-to-cache transfer unit that handles information exchanges between different caches. In another, further embodiment, snoop control unit 1512 may include one or more snoop filters 1514 that monitors the coherency of other caches (not shown) so that a cache controller, such as unit 1510, does not have to perform such monitoring directly. Unit 1510 may include any suitable number of timers 1515 for synchronizing the actions of instruction architecture 1500. Also, unit 1510 may include an AC port 1516.

Memory system 1540 may include any suitable number and kind of mechanisms for storing information for the processing needs of instruction architecture 1500. In one embodiment, memory system 1504 may include a load store unit 1530 for storing information such as buffers written to or read back from memory or registers. In another embodiment, memory system 1504 may include a translation lookaside buffer (TLB) 1545 that provides look-up of address values between physical and virtual addresses. In yet another embodiment, bus interface unit 1520 may include a Memory Management Unit (MMU) 1544 for facilitating access to virtual memory. In still yet another embodiment, memory system 1504 may include a prefetcher 1543 for requesting instructions from memory before such instructions are actually needed to be executed, in order to reduce latency.

The operation of instruction architecture 1500 to execute an instruction may be performed through different stages. For example, using unit 1510 instruction prefetch stage 1530 may access an instruction through prefetcher 1543. Instructions retrieved may be stored in instruction cache 1532. Prefetch stage 1530 may enable an option 1531 for fast-loop mode, wherein a series of instructions forming a loop that is small enough to fit within a given cache are executed. In one embodiment, such an execution may be performed without needing to access additional instructions from, for example, instruction cache 1532. Determination of what instructions to prefetch may be made by, for example, branch prediction unit 1535, which may access indications of execution in global history 1536, indications of target addresses 1537, or contents of a return stack 1538 to determine which of branches 1557 of code will be executed next. Such branches may be possibly prefetched as a result. Branches 1557 may be produced through other stages of operation as described below. Instruction prefetch stage 1530 may provide instructions as well as any predictions about future instructions to dual instruction decode stage.

Dual instruction decode stage 1550 may translate a received instruction into microcode-based instructions that may be executed. Dual instruction decode stage 1550 may simultaneously decode two instructions per clock cycle. Furthermore, dual instruction decode stage 1550 may pass its results to register rename stage 1555. In addition, dual instruction decode stage 1550 may determine any resulting branches from its decoding and eventual execution of the microcode. Such results may be input into branches 1557.

Register rename stage 1555 may translate references to virtual registers or other resources into references to physical registers or resources. Register rename stage 1555 may include indications of such mapping in a register pool 1556. Register rename stage 1555 may alter the instructions as received and send the result to issue stage 1560.

Issue stage 1560 may issue or dispatch commands to execution entities 1565. Such issuance may be performed in an out-of-order fashion. In one embodiment, multiple instructions may be held at issue stage 1560 before being executed. Issue stage 1560 may include an instruction queue 1561 for holding such multiple commands. Instructions may be issued by issue stage 1560 to a particular processing entity 1565 based upon any acceptable criteria, such as availability or suitability of resources for execution of a given instruction. In one embodiment, issue stage 1560 may reorder the instructions within instruction queue 1561 such that the first instructions received might not be the first instructions executed. Based upon the ordering of instruction queue 1561, additional branching information may be provided to branches 1557. Issue stage 1560 may pass instructions to executing entities 1565 for execution.

Upon execution, writeback stage 1570 may write data into registers, queues, or other structures of instruction set architecture 1500 to communicate the completion of a given command. Depending upon the order of instructions arranged in issue stage 1560, the operation of writeback stage 1570 may enable additional instructions to be executed. Performance of instruction set architecture 1500 may be monitored or debugged by trace unit 1575.

Figure 16:
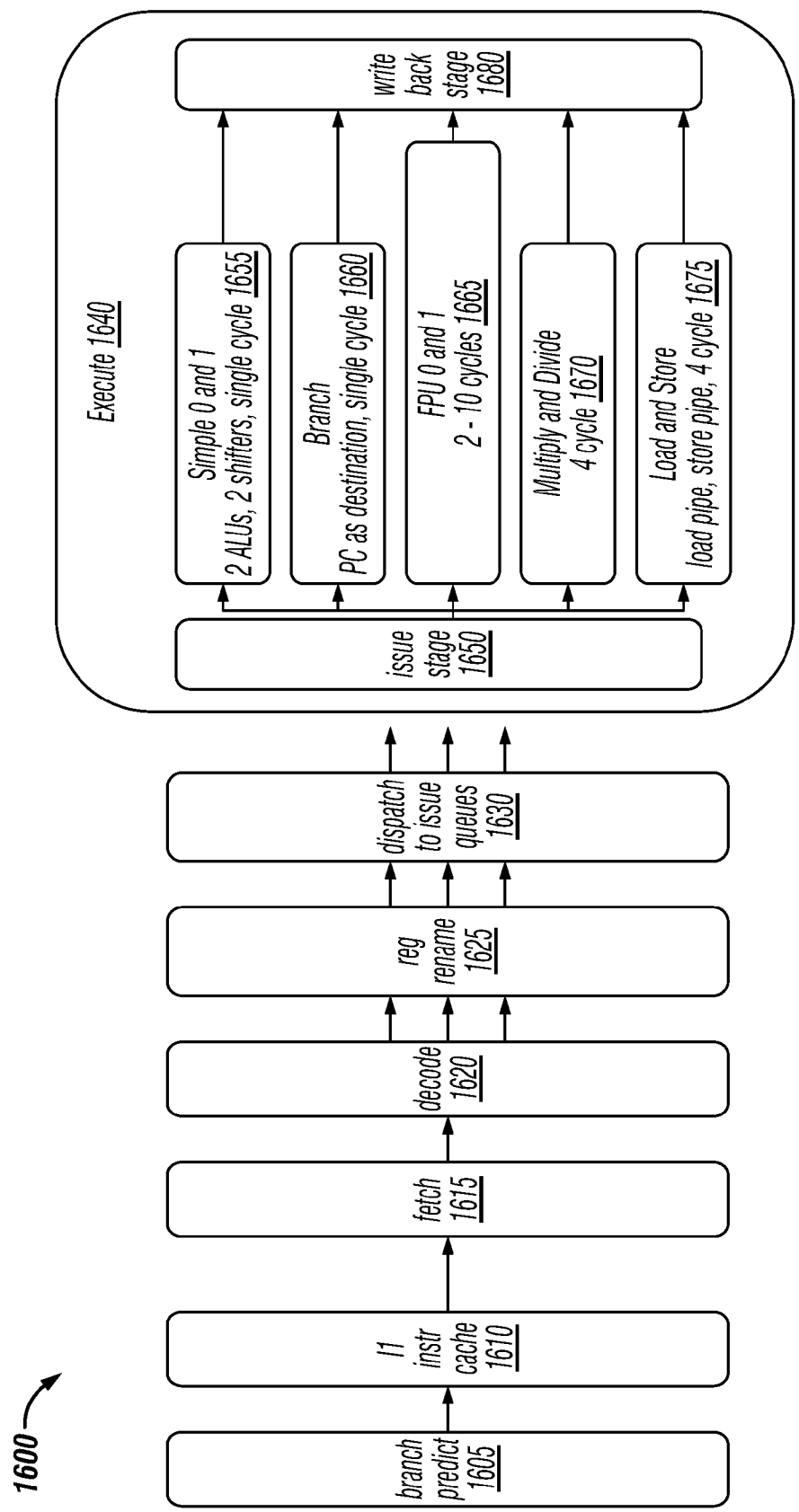
FIG. 16 is a block diagram of an execution pipeline for an instruction set architecture of a processor, in accordance with embodiments of the present disclosure.

FIG. 16 is a block diagram of an execution pipeline 1600 for an instruction set architecture of a processor, in accordance with embodiments of the present disclosure. Execution pipeline 1600 may illustrate operation of, for example, instruction architecture 1500 of FIG. 15.

Execution pipeline 1600 may include any suitable combination of steps or operations. In 1605, predictions of the branch that is to be executed next may be made. In one embodiment, such predictions may be based upon previous executions of instructions and the results thereof. In 1610, instructions corresponding to the predicted branch of execution may be loaded into an instruction cache. In 1615, one or more such instructions in the instruction cache may be fetched for execution. In 1620, the instructions that have been fetched may be decoded into microcode or more specific machine language. In one embodiment, multiple instructions may be simultaneously decoded. In 1625, references to registers or other resources within the decoded instructions may be reassigned. For example, references to virtual registers may be replaced with references to corresponding physical registers. In 1630, the instructions may be dispatched to queues for execution. In 1640, the instructions may be executed. Such execution may be performed in any suitable manner. In 1650, the instructions may be issued to a suitable execution entity. The manner in which the instruction is executed may depend upon the specific entity executing the instruction. For example, at 1655, an ALU may perform arithmetic functions. The ALU may utilize a single clock cycle for its operation, as well as two shifters. In one embodiment, two ALUs may be employed, and thus two instructions may be executed at 1655. At 1660, a determination of a resulting branch may be made. A program counter may be used to designate the destination to which the branch will be made. 1660 may be executed within a single clock cycle. At 1665, floating point arithmetic may be performed by one or more FPUs. The floating point operation may require multiple clock cycles to execute, such as two to ten cycles. At 1670, multiplication and division operations may be performed. Such operations may be performed in four clock cycles. At 1675, loading and storing operations to registers or other portions of pipeline 1600 may be performed. The operations may include loading and storing addresses. Such operations may be performed in four clock cycles. At 1680, write-back operations may be performed as required by the resulting operations of 1655-1675.

Figure 17:
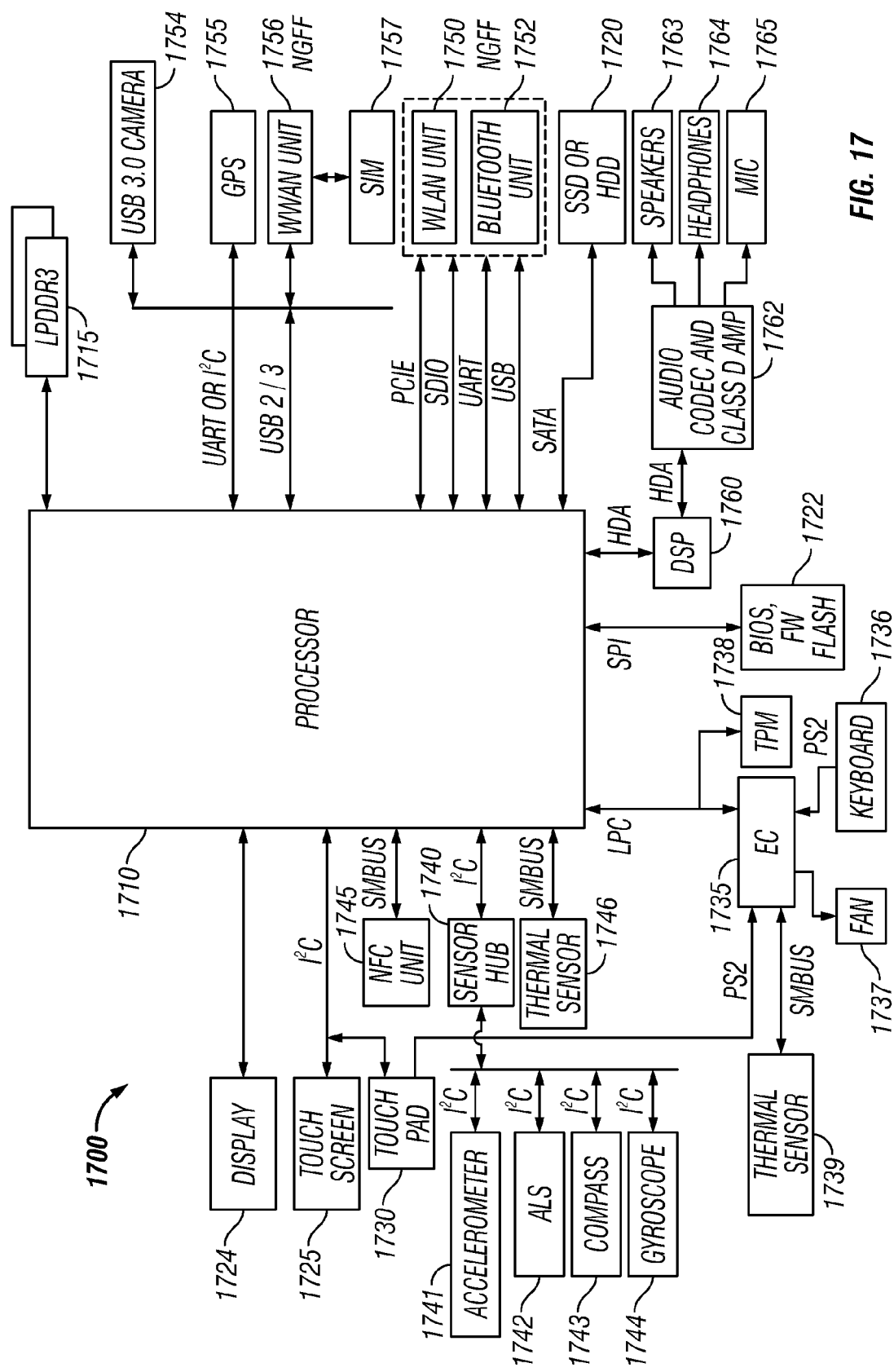
FIG. 17 is a block diagram of an electronic device for utilizing a processor, in accordance with embodiments of the present disclosure.

FIG. 17 is a block diagram of an electronic device 1700 for utilizing a processor 1710, in accordance with embodiments of the present disclosure. Electronic device 1700 may include, for example, a notebook, an ultrabook, a computer, a tower server, a rack server, a blade server, a laptop, a desktop, a tablet, a mobile device, a phone, an embedded computer, or any other suitable electronic device.

Electronic device 1700 may include processor 1710 communicatively coupled to any suitable number or kind of components, peripherals, modules, or devices. Such coupling may be accomplished by any suitable kind of bus or interface, such as I²C bus, System Management Bus (SMBus), Low Pin Count (LPC) bus, SPI, High Definition Audio (HDA) bus, Serial Advance Technology Attachment (SATA) bus, USB bus (versions 1, 2, 3), or Universal Asynchronous Receiver/Transmitter (UART) bus.

Such components may include, for example, a display 1724, a touch screen 1725, a touch pad 1730, a Near Field Communications (NFC) unit 1745, a sensor hub 1740, a thermal sensor 1746, an Express Chipset (EC) 1735, a Trusted Platform Module (TPM) 1738, BIOS/firmware/flash memory 1722, a DSP 1760, a drive 1720 such as a Solid State Disk (SSD) or a Hard Disk Drive (HDD), a wireless local area network (WLAN) unit 1750, a Bluetooth unit 1752, a Wireless Wide Area Network (WWAN) unit 1756, a Global Positioning System (GPS), a camera 1754 such as a USB 3.0 camera, or a Low Power Double Data Rate (LPDDR) memory unit 1715 implemented in, for example, the LPDDR3 standard. These components may each be implemented in any suitable manner.

Furthermore, in various embodiments other components may be communicatively coupled to processor 1710 through the components discussed above. For example, an accelerometer 1741, Ambient Light Sensor (ALS) 1742, compass 1743, and gyroscope 1744 may be communicatively coupled to sensor hub 1740. A thermal sensor 1739, fan 1737, keyboard 1746, and touch pad 1730 may be communicatively coupled to EC 1735. Speaker 1763, headphones 1764, and a microphone 1765 may be communicatively coupled to an audio unit 1764, which may in turn be communicatively coupled to DSP 1760. Audio unit 1764 may include, for example, an audio codec and a class D amplifier. A SIM card 1757 may be communicatively coupled to WWAN unit 1756. Components such as WLAN unit 1750 and Bluetooth unit 1752, as well as WWAN unit 1756 may be implemented in a Next Generation Form Factor (NGFF).

Figure 18:
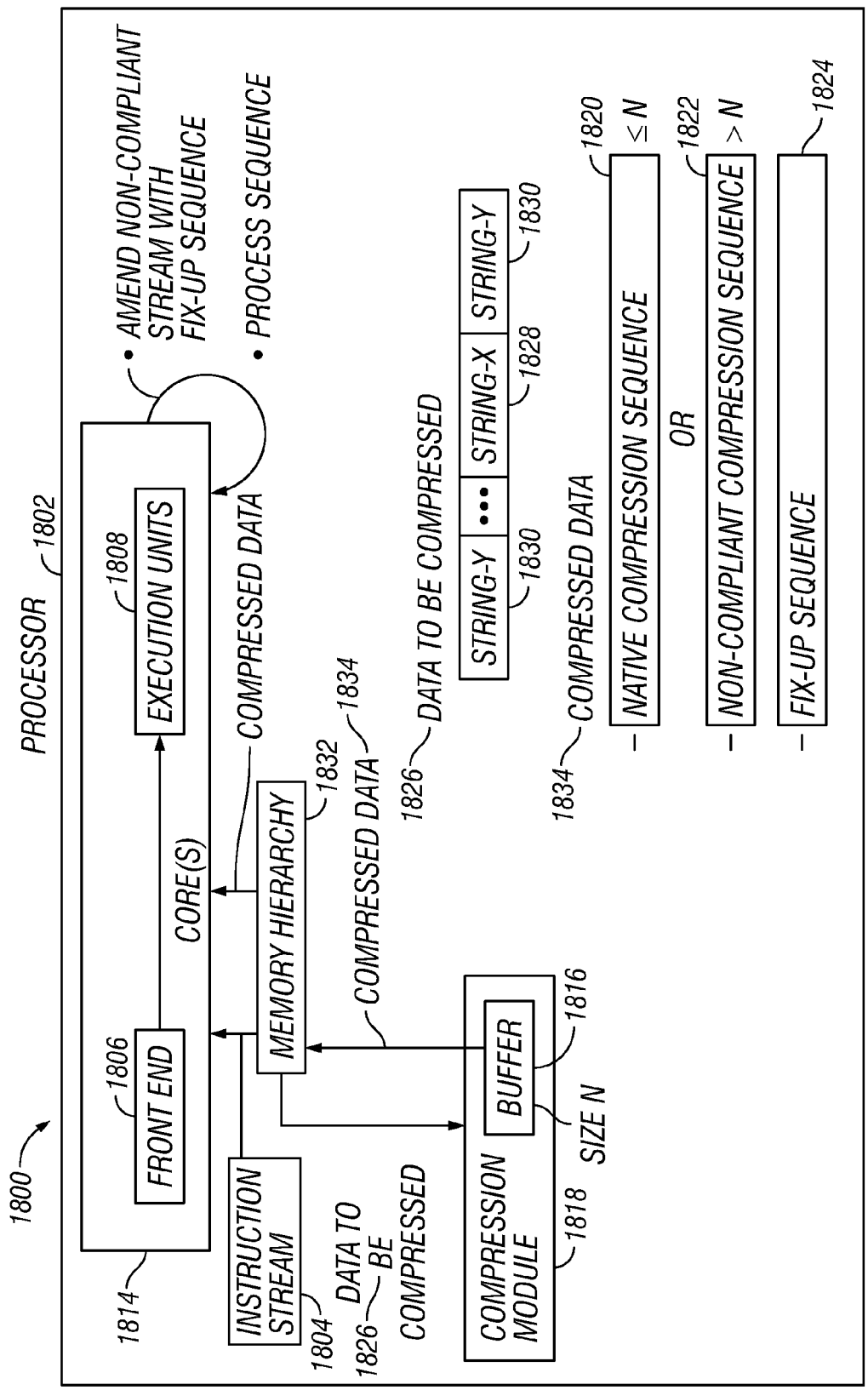
FIG. 18 illustrates a block diagram of a system for implementing an apparatus for lossless data compression, in accordance with embodiments of the present disclosure.

FIG. 18 illustrates a block diagram of a system 1800 for implementing an apparatus for lossless data compression, in accordance with embodiments of the present disclosure. In one embodiment, such lossless data compression may include the LZ4 data compression scheme. In other embodiments, the lossless data compression may include any compression scheme in which a number of literals are recorded within one record. For example, the lossless data compression may include LZ77-based compression formats or the Snappy data compression scheme. In yet other embodiments, the lossless data compression may include data compressions schemes in which parameters must be set with an earlier portion of the data compression scheme, wherein the parameters describe or define aspects of later portions of the data compression scheme. Such parameters might describe or define, for example, length of data that was not found to be repeated from earlier data, length of data that was found to be repeats of earlier data, and offsets of data that was found to be repeats of earlier data. For any given input byte from an input data stream, data compression may be performed. The input data stream may result in multiple compressed data sequences.

Lossless data compression may be performed by any suitable portion of system 1800. In one embodiment, lossless data compression may be performed in hardware. Such hardware may include an accelerator, a module, co-processor, a peripheral on a communication bus, or a memory controller. For example, system 1800 may implement such hardware in compression module 1818. Compression module 1818 may be included inside processor 1802 or may be implemented outside processor 1802 and communicatively coupled to processor 1802. Compression module 1818 may be implemented by any suitable combination of digital circuitry and analog circuitry. Compression module 1818 may include various execution units especially designed to perform lossless data compression according to the embodiments of this disclosure.

Lossless data compression may be performed based upon any suitable mechanism. In one embodiment, lossless data compression performed by compression module 1818 may be initiated by receiving jobs from processor 1802. Such jobs may be initiated by processor 1802 writing control and status registers (CSRs) to indicate parameters of compression, what type of compression is to be performed, and where such data to be compressed is located. Some parameters and data to be compressed may be located in, for example, memory hierarchy 1832. Memory hierarchy 1832 may include any suitable number of combinations of physical memory, caches, or other storage. In one embodiment, lossless data compression might be performed based upon a determination that instructions in instruction stream 1804 to be executed by processor 1802 are for performing lossless data compression. In such embodiments, execution of lossless data compression might be offloaded to compression module 1818. In another embodiment, lossless data compression might be performed by analysis by processor 1802 that lossless data compression will be advantageous. In yet another embodiment, lossless data compression might be specified by use of an application programming interface, driver, or other mechanism. The resulting data from data compression may be sent by compression module 1818 to memory hierarchy 1832. The results may be read, sent to recipients, decompressed, or otherwise utilized or processed by cores 1814. While cores 1814 could themselves perform the lossless data compression, performance might be slower than on hardware especially designed to perform the lossless data compression such as compression module 1818. Accordingly, in one embodiment, lossless data compression may be offloaded to compression module 1818.

Compression module 1818 may be implemented in any suitable manner. In one embodiment, compression module 1818 may include a buffer 1816 for outputting data to memory hierarchy 1832. By using such a buffer 1816, the entire contents of buffer 1816 may be written more efficiently to memory hierarchy 1832 than, for example, performing direct memory access writes to random locations in memory hierarchy as each data element is produced. However, buffer 1816 may be of a limited size, such as 128 bytes. Once buffer 1816 is full, its contents may be written to memory hierarchy 1832. Furthermore, the contents of buffer 1816 may be written to memory hierarchy 1832 upon completion of a compressed data sequence, even if buffer 1816 is not yet full.

In one embodiment, system 1800 may modify the implementation of a standardized lossless data compression in order to account for limitations within hardware, such as the size of buffer 1816. Buffer 1816 may be of size N, which may hold data before it is written to memory hierarchy 1832. Fully compressing a portion of the input data may result in a compressed data sequence that is larger than the size of buffer 1816. Accordingly, portions of the compressed data sequence may be flushed from buffer 1816 and written to memory hierarchy 1832 before the compressed data sequence is fully determined and entered into buffer 1816 by compression module 1818. If such portions written from buffer 1816 define or describe later portions of the data sequence, then buffer 1816 may represent a limitation on the size of data that may be compressed in hardware using compression module 1818. This may be because various portions of the compressed data sequence define or describe other portions of the compressed data stream. In some compression schemes, such as LZ4 or Snappy, the earlier portions of the compressed data sequence include parameters or other descriptions to define or describe later portions of the compressed data sequence. If the size of buffer 1816 is too small to fit the entire compressed data sequence, portions of the compressed data sequence might have already been written to memory hierarchy 1832 before all the data that such portions are to describe have even been read.

In one embodiment, compression module 1818 may output compressed data sequences with different formats, wherein the formats are selected according to the size of data that will result from compression. In a further embodiment, compression module 1818 may output compressed data according to a native compression scheme, according to its standard definition and format, if the resulting compressed data may fit within buffer 1816, or otherwise can be completely written by compression module 1818 within buffer 1816. In another embodiment, compression module 1818 may output compressed data sequences with a format that is substantially similar to a native data compression scheme. In yet another embodiment, compression module 1818 may output compressed data sequences that are based upon the details of the stream to be compressed. In still yet another embodiment, compression module 1818 may output compressed data sequences based upon the size of the sequence being generated. For example, compression module 1818 may apply LZ4 or Snappy compression schemes to such data and pass native compression sequence 1820 to buffer 1816. Compression module 1818 may apply such schemes in-line as data is received or read to be compressed, populating elements of buffer 1816 as they arrive and are processed. Native compression sequence 1820 may be read from memory hierarchy 1832 and natively processed by cores 1814 or another suitable recipient. Cores 1814 may assume that native compression sequence 1820 is fully compliant with the data compression scheme. Native compression sequence 1820 may be natively processed by cores 1814 or another suitable recipient. Cores 1814 may assume that native compression sequence 1820 is fully compliant with the data compression scheme.

In another, further embodiment, if the data to be compressed will result in a compressed data sequence with portions therein that are too large to fit within buffer 1816 and still describe or define all aspects of the data sequence, or otherwise cannot be completely written by compression module 1818 into buffer 1816, then compression module 1818 may modify a standard compression scheme such as LZ4 or Snappy. In yet another, further embodiment, compression module 1818 may use a modified compression scheme if the portion too large to fit within buffer 1816 has elements towards the beginning of the portion that are not known by compression module 1818 until after compression module 1818 finishes processing the portion. For example, compression module 1818 may modify the compression scheme because it needs to fit the literals of a data sequence somewhere such as buffer 1816, but buffer 1816 cannot store all of the literals of the data sequence. In another embodiment, compression module 1818 may write a resulting non-compliant compression sequence 1822 to buffer 1816 in multiple passes as buffer 1816 is flushed and written to memory hierarchy 1832. In yet another embodiment, compression module 1818 may pass a resulting fix-up sequence 1824 to recipients (such as cores 1814) through memory hierarchy 1832 in a separate location. Compression module 1818 may apply such a modified scheme in-line as data is received or read to be compressed and populate elements of non-compliant compression sequence 1822 through multiple writes to and flushes of instruction buffer 1816.

In one embodiment, non-compliant compression sequence 1822 may be processed by consumers of the sequence (and other sequences in an output stream) to repackage it a format compatible with the standard, native compression scheme. For example, cores 1814 may read sequences from memory hierarchy 1832 and then process them to comply with the original, unmodified data compression scheme. In another embodiment, cores 1814 may repackage non-compliant compression sequence 1822 to the native compression scheme format used by native compression sequence 1820 using fix-up sequence 1824. The resulting native compressed sequence may be used in any suitable manner.

In one embodiment, instances of non-compliant compression sequence 1822 may be the same length as instances of native compression sequence 1820 for the same input data 1826. However, non-compliant compression sequence 1822 may be arranged in a different format than native compression sequence 1820 for the same input data 1826. Fix-up sequence 1824 may specify how to modify non-compliant compression sequence into a format compliant with the native compression scheme.

The data to be compressed may be represented by data 1826. For example, data 1826 may include a sequence of data including a first string, "string-x" 1828 followed by another string, "string-y" 1830. The same string string-y 1830 may have appeared in previous data to be compressed (shown as part of data 1826, but in actuality appearing in previous data to be compressed). When compression module 1818 reaches string-x 1828, it may determine that string-x 1828 has not appeared in data to be compressed before.

String-x 1828 may be considered a literal, in that its values will be passed into the data compression sequence literally, with its values preserved. However, the appearance of an additional instance of string-y 1830 represents an opportunity to compress the data, rather than literally repeat its contents into the data compression sequence. Following a compression method such as LZ4, or a modified version thereof, compression module 1818 may encode into the compressed data sequence a reference to the previous instance of string-y 1830 in the input data (such as in data previously encountered in the input stream), rather than its literal contents. Such an encoding may be represented by one or more fields representing the offset of such a previous appearance of string-y 1830, as well as one or more fields representing the width of string-y 1830. In such a case, string-y 1830 may be referred to the match, and compression module 1818 may encode an offset of the match (where it previously appeared in the input data) and a width of the match in the compressed data sequence, rather than the literal contents of the match.

System 1800 may otherwise fetch, dispatch, execute, and retire instructions, such as those in instruction stream 1804 in a sequential or out-of-order manner. System 1800 may utilize any suitable number or kind of out-of-order processors or processing entities. System 1800 may illustrate elements of such a processor 1802, which may include any processor core, logical processor, processor, or other processing entity such as those illustrated in FIGS. 1-17. System 1800 may include a front end 1806 communicatively coupled to one or more execution units 1808. Front end 1812 may process instructions so that they may be executed by execution units 1808. Front end 1812 may include allocate units, decode instructions, perform binary translation, and dispatch units. Moreover, processor 1802 may include retirement units to reclaim resources used by instructions. One or more elements, such as front end 1812 and execution units 1808, may be included in one or more cores 1814.

Figure 19:
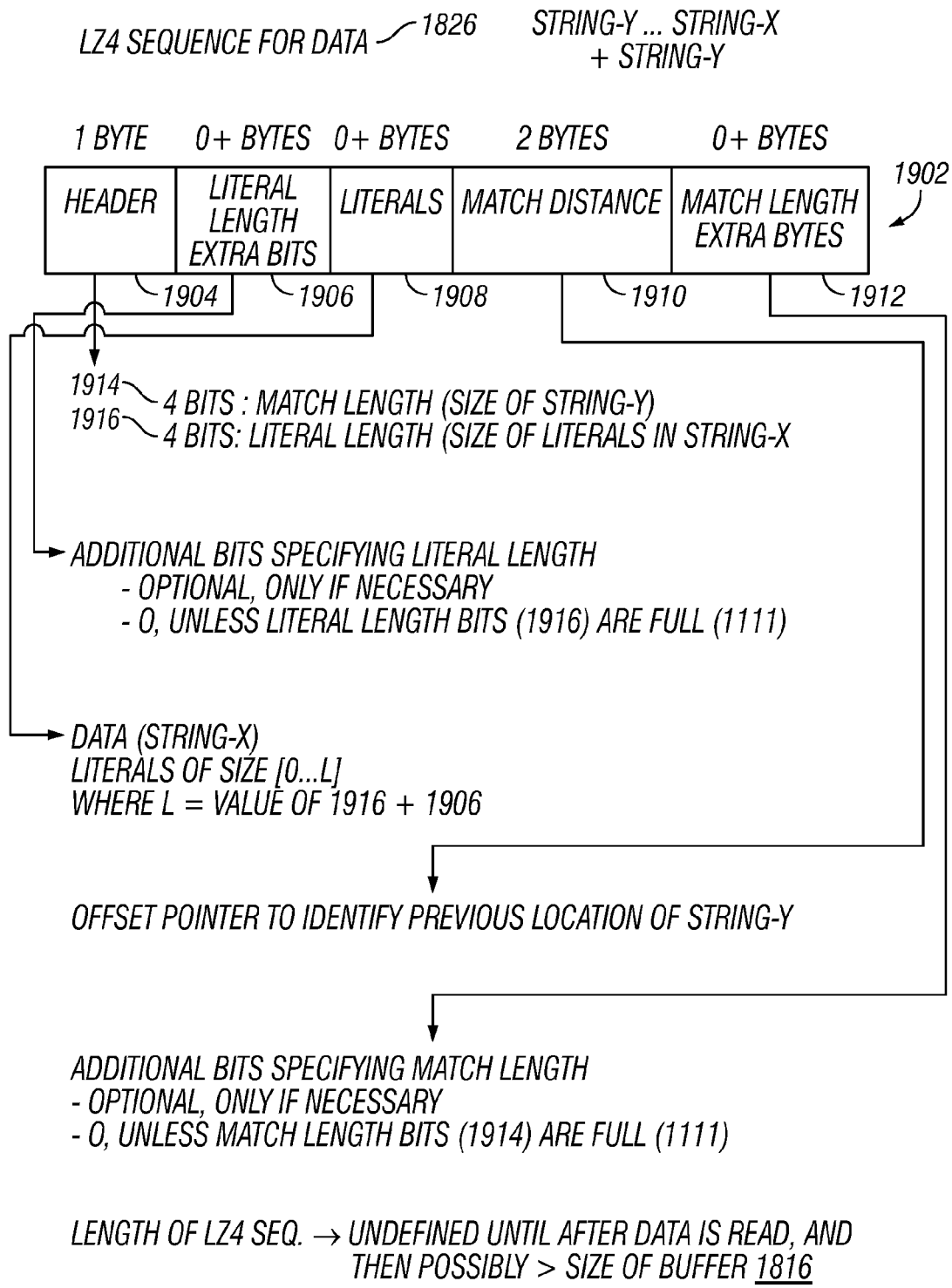
FIG. 19 illustrates a block diagram of a native data compression scheme, in accordance with embodiments of the present disclosure.

FIG. 19 illustrates a block diagram of a native data compression scheme, in accordance with embodiments of the present disclosure. In one embodiment, FIG. 19 illustrates a block diagram of representation and operation of LZ4 data compression. Native compression sequence 1902 may illustrate LZ4 data compression and how various fields are populated during its operation.

Native compression sequence 1902 may include various fields. Native compression sequence 1902 may include a header 1904. Header 1904 may be one byte wide. Header 1904 may itself include four bits 1914 for specifying a match length corresponding to the size of the data that has been identified as repeating data already encountered during previous compressions. This may include, for example, the size of string-y. Header 1904 may also include four bits 1916 for specifying the size of the literals in data 1826. This may include, for example, the size of string-x 1830. These bits might not be sufficient to describe the match size or literal size, as described in further detail below.

Native compression sequence 1902 may include a field 1906 for additional bits or bytes specifying the length of or number of literals in native compression sequence 1902. Field 1906 may be zero or more bytes. Field 1906 may be used if there are more than fourteen literals and bits 1916 are insufficient to fully enumerate all of them. Each byte in field 1906 may be added to determine the full number of literals. If a given byte is less than 255 (full), then it may be determined that such a byte is the last byte in field 1906. If a byte is 255, then it may be determined that yet another byte will be used to fully specify the size of the total number of literals. Field 1906 may be unused if it is not needed and bits 1916 are less than full. Each byte in field 1906 may specify a portion of the number up to 255 literals.

Field 1908 may include the literals from data 1826 leading up to the matched elements. For example, field 1908 may include the values of string-x 1828. The size of field 1908 may zero or more bytes. The total length L of the literals may be the sum of bits 1916 and the added values of field 1906. In some cases no literals before the match might have been found.

Field 1910 may include a match difference or offset. This may include a backward pointer to identify a portion of data that occurred earlier in the uncompressed stream of input data. Such data may have been generated as literals, matches, or a combination thereof. The pointer may identify what portions of previous data correspond to the match and is to be represented by a non-literal value. This may identify a location of a previous instance of, for example, string-y.

Field 1912 may specify additional bits or bytes specifying the length of matched elements in native compression sequence 1902. Field 1912 may be zero or more bytes. Field 1912 may be used if the length of the matched data is greater than can be enumerated by bits 1914. Each byte in field 1912 may be added to determine the full number of matched elements. If a given byte is less than 255 (full), then it may be determined that such a byte is the last byte in field 1912. If a byte is 255, then it may be determined that an additional byte will be used to specify the size of the total number of matched elements. Field 1912 may be unused if it is not needed and bits 1914 are less than full. Each byte in field 1912 may specify a portion of the number up to 255 elements.

Notably, the length of native compression sequence 1902 might be arbitrarily large, as its length will be unknown until all data is read to find a match and the number of literals is known. All of native compression sequence 1902 might not fit in buffer 1816, as literals might be added and buffer 1816 may be flushed before all elements are received so that literal length and match length can be determined. Native compression sequence 1902 might may describe a contiguous set of literals (which may be zero in length) followed by a match of previous data from the input data stream. Multiple instances of native compression sequences 1902 may form an output stream. For example, an input file may be parsed into many compression sequences, each of varying and arbitrary length. In one example, a 100 MB file may be compressed into a 20 MB data compression stream.

For example, as data to be processed arrives at compression module 1818 to be compressed, compression module 1818 may begin evaluating such data for a match to previously received data. As each successive byte arrives and is analyzed and no match is found, if compression module 1818 places each byte as a literal into buffer 1816 of the output compression sequence, buffer 1816 may begin to fill up. In one embodiment, buffer 1816 may include a 128-byte buffer. By the time that a match is found upon, for example, reception of the 151st byte, the literals to be included in such a match are bytes 1-151. However, by such a time, a header 1904 for the compression sequence as well as some of literal length extra bytes in field 1906 should have already been flushed from the buffer. Such fields cannot then be set with the length of the literals and the size of the match. In one embodiment, system 1800 may overcome such a deficiency by providing modifications to the native compression formats.

Figure 20:
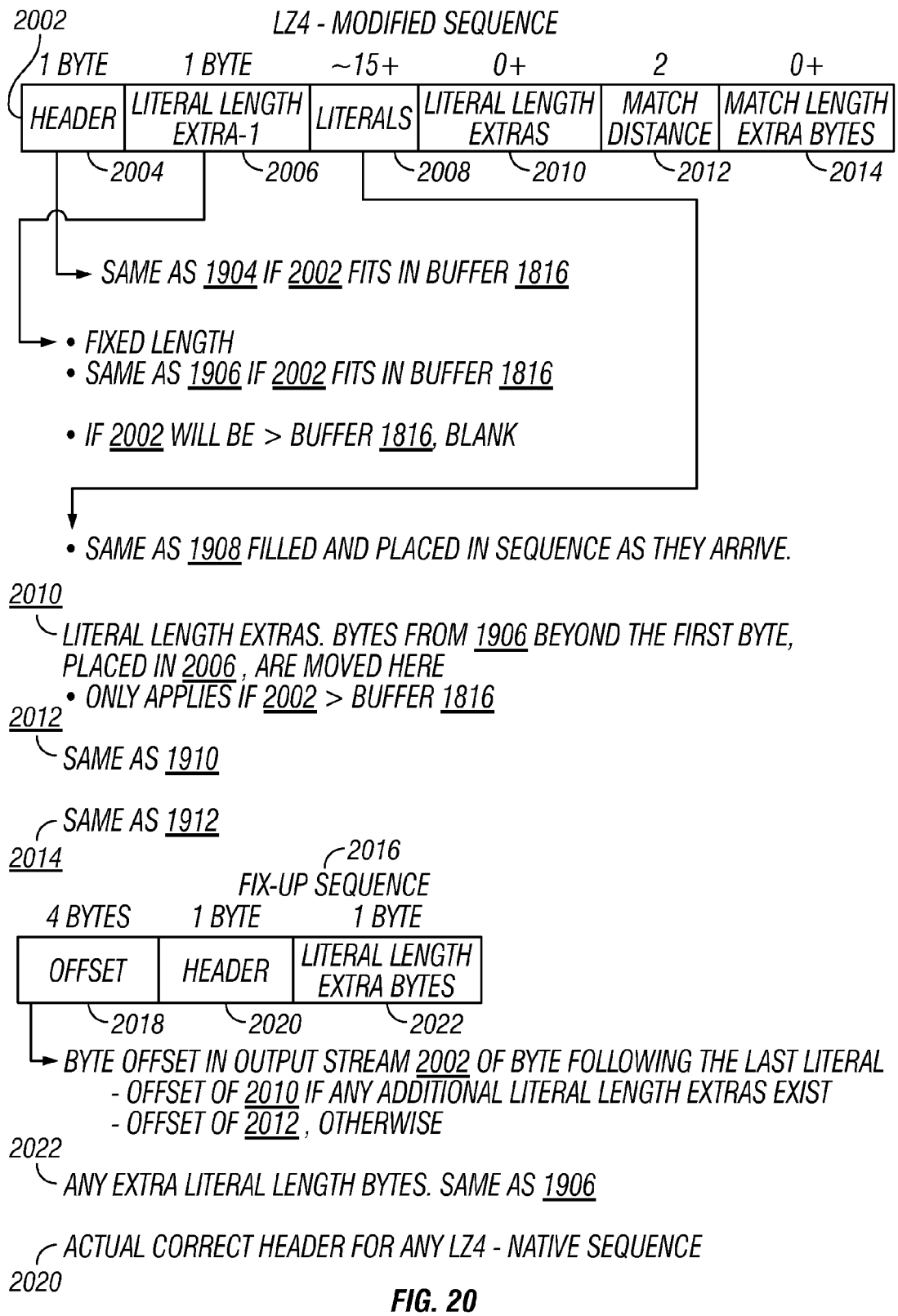
FIG. 20 illustrates a block diagram of a modified data compression scheme, in accordance with embodiments of the present disclosure.

FIG. 20 illustrates a block diagram of a modified data compression scheme, in accordance with embodiments of the present disclosure. In one embodiment, modified data compression sequence 2002 may deviate in format from a sequence using the standard, native data compression scheme that is modified. Such a native scheme may include an LZ4 data compression scheme. In another embodiment, modified data compression may be of the same size as a sequence using the standard, native data compression scheme. The modified data compression scheme may be selectively employed by compression module 1818 based upon the number of literals encountered before a match is found in data to be processed.

In one embodiment, modified data compression sequence 2002 may include a header 2004 of a single byte width. Header 2004 may be the same as header 1904 if modified data compression sequence 2002 is sufficiently small. In another embodiment, sequence 2002 may be sufficiently small if it can fit within buffer 1816. Otherwise, in one embodiment header 2004 may be replaced later by cores 1814 with a correct value according to the native compression scheme from values in fix-up sequence 1824, if necessary.

In one embodiment, modified data compression sequence 2002 may include a field 2006 for an additional byte specifying the length of literals in modified data compression sequence 2002. In another embodiment, field 2006 may be of a fixed width of, for example, one byte. Other bytes for specifying the length of literals in modified data compression sequence 2002 may be included in field 2010. Thus, in some embodiments, modified data compression sequence 2002 may differ from native compression sequence 1902 in that modified data compression sequence 2002 divides extra bytes for specifying the number of literals into different fields. Notably, modified data compression sequence 2002 may place a first byte in field 2006 before literals 2008 and the remainder after literals 2008. In one embodiment, if additional literal length counts are to be included in field 2010, field 2006 may be set as blank. In another embodiment, bits in header 2004 might have specified that the number of literals is greater than it could track (such as, for example, by being full). Accordingly, in one embodiment a large number of literals may be accounted for in header 2004 and field 2006 with a blank value in field 2006 and all literal length bits set in header 2004, signifying that additional fields will be read after all elements are received to find a match. Thus, representation of the length of the number of literals may be modified such that portions of modified data compression sequence 2002 may be sent to memory hierarchy 1832 in a flush of buffer 1816 while elements (causing a length of literals in excessive of the buffer size) are still being received In one embodiment, field 2008 may include all the literals and may be the same as field 1908. Field 2008 may be fifteen or more bytes. At 15 bytes, the number of literals may begin to cause modified data compression sequence 2002 to outgrow buffer 1816.

In one embodiment, field 2010 may include additional bytes, if necessary, to represent the number of literals. These may include bytes from field 1906 that are beyond the first byte, which has been represented in modified data compression sequence 2002 as field 2006. By the time that field 2010 is to be set when the match is found, all of literals in field 2008 may have been received. Thus, the number of literals may be correctly identified and entered, even if header 2004, field 2006, or portions of field 2008 have already been passed to memory hierarchy 1832 through a flush of buffer

1816. Field 2010 may include zero or more bytes, and may be used if modified data compression sequence 2002 will not fit in buffer 1816.

In one embodiment, modified data compression sequence 2002 may include match distance field 2012 and match length extra bytes field 2014. These may correspond to and be the same as fields 1910 and 1912, respectively. By the time that fields 2012, 2014 are to be set, all of literals in field 2008 may have been received by compression module 1818. Thus, the number of literals may be correctly identified and entered by compression module 1818, and the match may be correctly identified and entered, even if one or more of header 2004, field 2006, field 2008, or field 2010 have already been flushed to memory hierarchy 1832.

Thus, in various embodiments, fields in native compression sequence 1902 may be created in a different manner in modified data compression sequence 2002. The fields in native compression sequence 1902 that are to be created in a different manner include any fields before literals 2008 that might be lost to a flushing of buffer 1816 without being correctly set with values dependent upon data arriving beyond the scope of the width of buffer 1816. The example in FIG. 20 illustrates an example embodiment of a modified data compression sequence 2002 for modifying LZ4. Similar operations may be performed for other data compression schemes to modify such schemes so that they may work correctly with buffer 1816. For example, if native compression sequence 1902 placed a match length extra bytes before literals 1908, then such extra bytes might be divided as literal length bits have been divided in modified data compression sequence 2002.

In one embodiment, compression module 1816 may create fix-up sequence 2016. In another embodiment, fix-up sequence 2016 may identify parameters of how modified data compression sequence 2002 was changed from a native data compression sequence such that a recipient, such as cores 1814, may process modified data compression sequence 2002 back into a native data compression sequence. Fix-up sequence 2016 may include any suitable information.

In one embodiment, fix-up sequence 2016 may include an offset 2018. Offset 2016 may be four bytes wide. Offset 2016 may specify an offset from the start of modified data compression sequence 2002 identifying the byte that immediately follows the last received literal. This may be, for example, the dividing line between literals in field 2008 and any literal length extra bytes in field 2010 (if any) or the line between field 2008 and field 2012 (if field 2010 is not included as unnecessary). Offset 2016 may be used in conjunction with reassembly of extra literal length byte values, as described in more detail below.

In another embodiment, fix-up sequence 2016 may include a header 2020. Header 2020 may be a single byte wide. Header 2020, if necessary, may specify the actual correct values of a header that would be found in an equivalent native data sequence header 1904. Such correct values, such as bits for match length and bits for literal length, might be correctly specified after all elements have been received for the match to be found. Header 2020 may be used to correct modified data compression sequence 2002 so that it can be made into an equivalent native compressed data sequence, such as one complying with LZ4.

In yet another embodiment, fix-up sequence 2016 may include a field 2022 specifying whether there are any extra literal length bytes. Field 2022 may be the same as field 1906, and may include correct values identifying whether additional literal length extras exist in field 2010, as field 2006 might have been set as blank. Field 2022 may replace field 2006 so that modified data compression sequence 2002 may be corrected into an equivalent native compressed data sequence, such as one complying with LZ4.

Modified data compression sequence 2002 may be constructed by compression module 1818 as elements arrive for compression. In one embodiment, depending upon the number of elements encountered and whether a match has been found, modified data compression sequence 2002 may be issued as conforming to the native data compression scheme or deviating from the native data compression scheme. If a match is found while modified data compression sequence 2002 might be output in its entirety to buffer 1816, then modified data compression sequence 2002 may actually conform to the native data compression scheme. If a match is not found before too many literals have been encountered to output modified data compression sequence 2002 in its entirety to buffer 1816, then modified data compression sequence 2002 might deviate from the native data compression scheme. In another embodiment, if modified data compression sequence 2002 deviates the native data compression scheme, compression module 1818 may also output fix-up sequence 2016 to the recipient through another channel, pipeline, memory, or register location.

Figure 21:
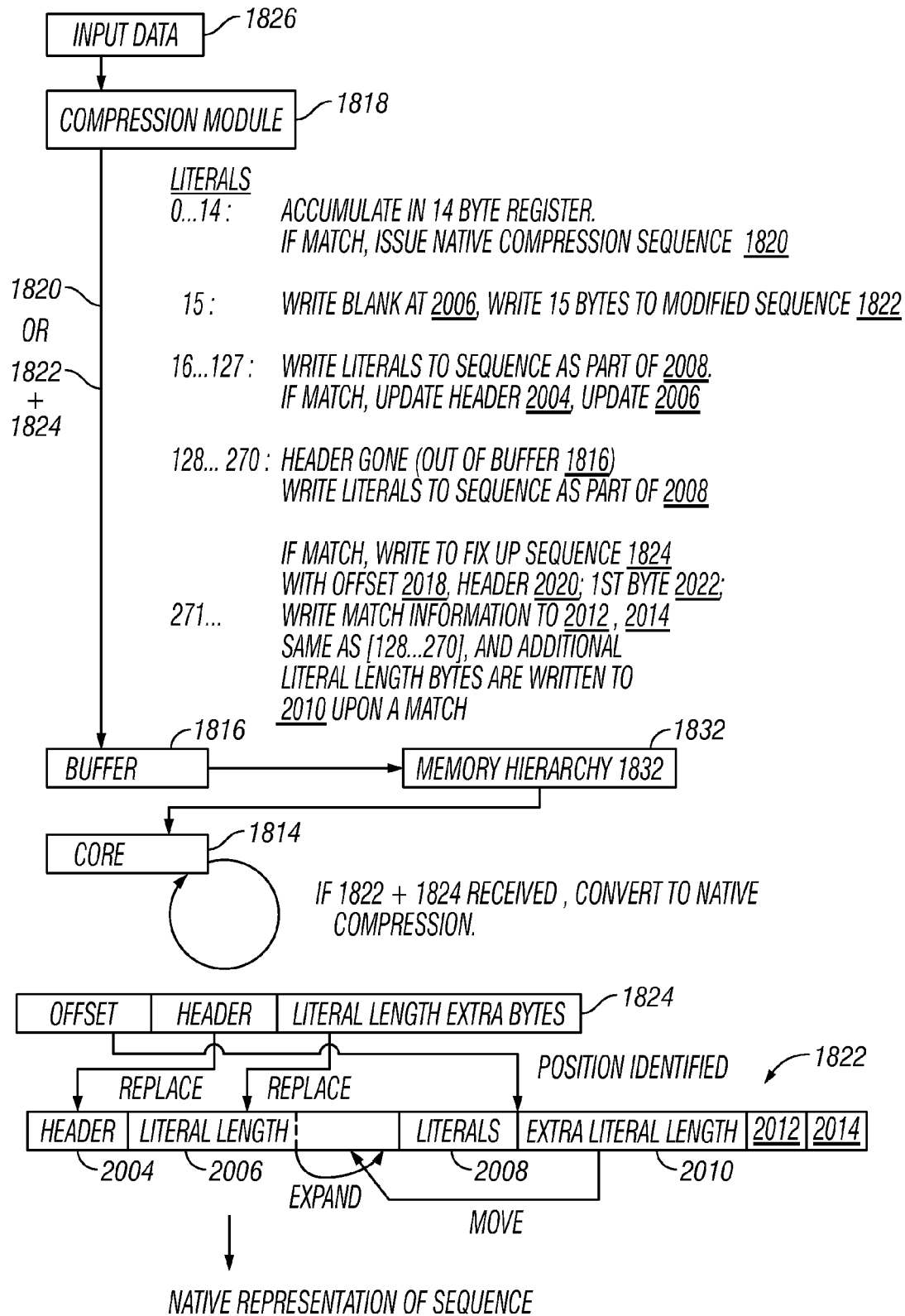
FIG. 21 illustrates example operation of a system for lossless data compression, in accordance with embodiments of the present disclosure.

FIG. 21 illustrates example operation of system 1800 for performing lossless data compression, in accordance with embodiments of the present disclosure.

In one embodiment, given input data 1826, compression module 1818 may selectively output modified data compression sequence 2002 (or 1822) and fix-up sequence 2016 (or 1824), or may selectively output native data compression sequence 1902 (or 1820) conforming to the original data compression scheme. In another embodiment, compression module 1818 may output data into buffer 1816 that may at first conform to native data compression sequence 1820, but then change such data to modified data compression sequence 2002. In such an embodiment, compression module 1818 may make such changes before buffer 1816 is filled.

In various embodiments, compression module 1818 may output modified data compression sequence 2002 (or 1822) and fix-up sequence 2016 (or 1824) if the number of elements received is too large to place all portions of the literals in the compression sequence into buffer 1816. In such a case, buffer 1816 may be sent to memory hierarchy 1832 while portions of the compression sequence are still being calculated. The additional portions may be placed into buffer 1816, which may be again flushed, as many times as necessary.

As compression module 1818 receives the uncompressed elements of data, they may be accumulated in a register. The register may be of a size conforming to the ability of the data compression scheme to specify literal length and match length. For example, if LZ4 is being used and modified, once fifteen elements are reached, bits in header 1904 and header 2004 are maximized; consequently, additional fields for literal length must be used. In one embodiment, for the first fourteen uncompressed elements that are received, compression module 1818 may determine whether a match of already-encountered data has been found. If there is a match, compression module 1818 may perform data compression according to the native, standard compression scheme and output a data compression sequence such as that shown in native compression sequence 1902. Otherwise, in another embodiment compression module 1818 may continue to accumulate data in the register and evaluate whether a match has been found.

In one embodiment, upon receipt of the element that would cause the data compression sequence to require additional fields for, for example, literal length (in LZ4), compression module 1818 may switch to creating a modified compression sequence. Such an element may be the fifteenth element received in the sequence. The literals may be written to the output sequence by compression module 1818. In another embodiment, compression module 1818 may tentatively modify the compression scheme by writing a blank to field 2006. The blank may be maintained until compression module 1818 determines whether the number of literals will exceed buffer 1816 before a match is found. If the number of literals will exceed buffer 1816 before a match is found, the blank may be further maintained until it is fixed by a recipient using fix-up sequence 1824. If a match is found before compression module 1818 determines that the number of literals received will cause buffer 1816 to be exceeded, the correct value of the first byte of the number of extra literals (as would appear in field 1906) may be written to field 2006.

In one embodiment, upon receipt of literals numbered fifteen through approximately 128, compression module 1818 may write literals as they are received by compression module 1818. Compression module 1818 may determine whether each received data element has triggered a match. If there is a match, the correct value of the number of literals (as would be specified in field 1906) may be written to field 2006. Header 2004 may be updated with the correct value of the number of literals and the match size (as would be specified in field 1904) if there is a match. The values of the match distance field 2012 and match length extra bytes 2014 may be set if there is a match. The result may be that data sequence 2002 actually conforms to the format of native compression sequence 1902, and the "modified" data sequence is indistinguishable from a data sequence produced without modification. Compression module 1818 may perform such actions for literals numbered fifteen through approximately 127, though the precise number of the upper limit of such literals may depend upon the size of buffer 1816. If more or less bytes are available in buffer 1816, then the upper limit of such literals may vary accordingly. The upper limit may be the number of literals that will cause a buffer 1816 to be exceeded.

In one embodiment, upon receipt of literals numbered from 128 (approximately, as discussed above) through a number that will require additional literal length bytes to be written (such as approximately 270 literals), compression module 1818 may write literals as they are received by compression module 1818. One or more of header 2004, field 2006, or portions of literals 2008 might have already been flushed out of buffer 1816. Compression module 1818 may determine whether each received element has triggered a match. In another embodiment, if there is a match, compression module 1818 may create fix-up sequence 1824. In yet another embodiment, compression module 1818 may populate fix-up sequence 1824 with offset 2018, calculated after all elements have been received. In another embodiment, compression module 1818 may populate fix-up sequence 1824 with header 2020, calculated after all elements have been received. In yet another embodiment, compression module 1818 may populate fix-up sequence 1824 with field 2022. Furthermore, compression module may write match information to fields 2012, 2014 in modified data compression sequence 2002. It might not be necessary to write any values to field 2010, as additional bytes for specifying the literal length might not be needed. This may occur because at 270 literals (or another suitable value depending upon the implementation), the information in the header and first extra byte may be sufficient to specify the number of literals.

Upon receipt of elements from a number that will require additional literal length bytes to be written (such as approximately 271 literals, with respect to 270 literals as discussed above), onward, compression module 1818 may perform substantially the same as described above with respect to the range of literals from 128 to 270 literals. However, in one embodiment, upon a match compression module 1818 may also write the additional literal length bytes to field 2010 in order to fully the number of literals. Thus, field 2010 might not be empty.

Upon receipt of a native compression sequence 1820 conforming to native data compression (such as LZ4) through memory hierarchy 1832, core 1814 may process such a data sequence as normal. Upon receipt of both a modified data sequence 1822 (or 2002) and a fix-up sequence 1824 (or 2016), in one embodiment core 1814 may convert the modified data sequence to a form conforming to the original native compression scheme. In another embodiment, core 1814 may apply fix-up sequence 1824 to modified data sequence 1822 to perform such conversion. Such conversions may be performed by shifting values or execution of MEMCOPY to copy values from one location to another.

In one embodiment, header 2004 from fix-up sequence 1824 may be inserted into header 2004 of data sequence 1822. In another embodiment, offset 2018 may be used to determine a demarcation between literals 2008 and subsequent fields. In yet another embodiment, a first byte of any additional literal length bytes in field 2022 may be copied to field 2006. If field 2010 is present for additional literal length bits (as specified by a full value in 2022) at such an offset, in another embodiment such additional literal length bits may be appended to the end of field 2006, at the end of existing values therein. This may also be accomplished by swapping fields 2008 and 2010. The result may include a representation of the data sequence as would be produced by an otherwise normal use of the data compression scheme.

Figure 22:
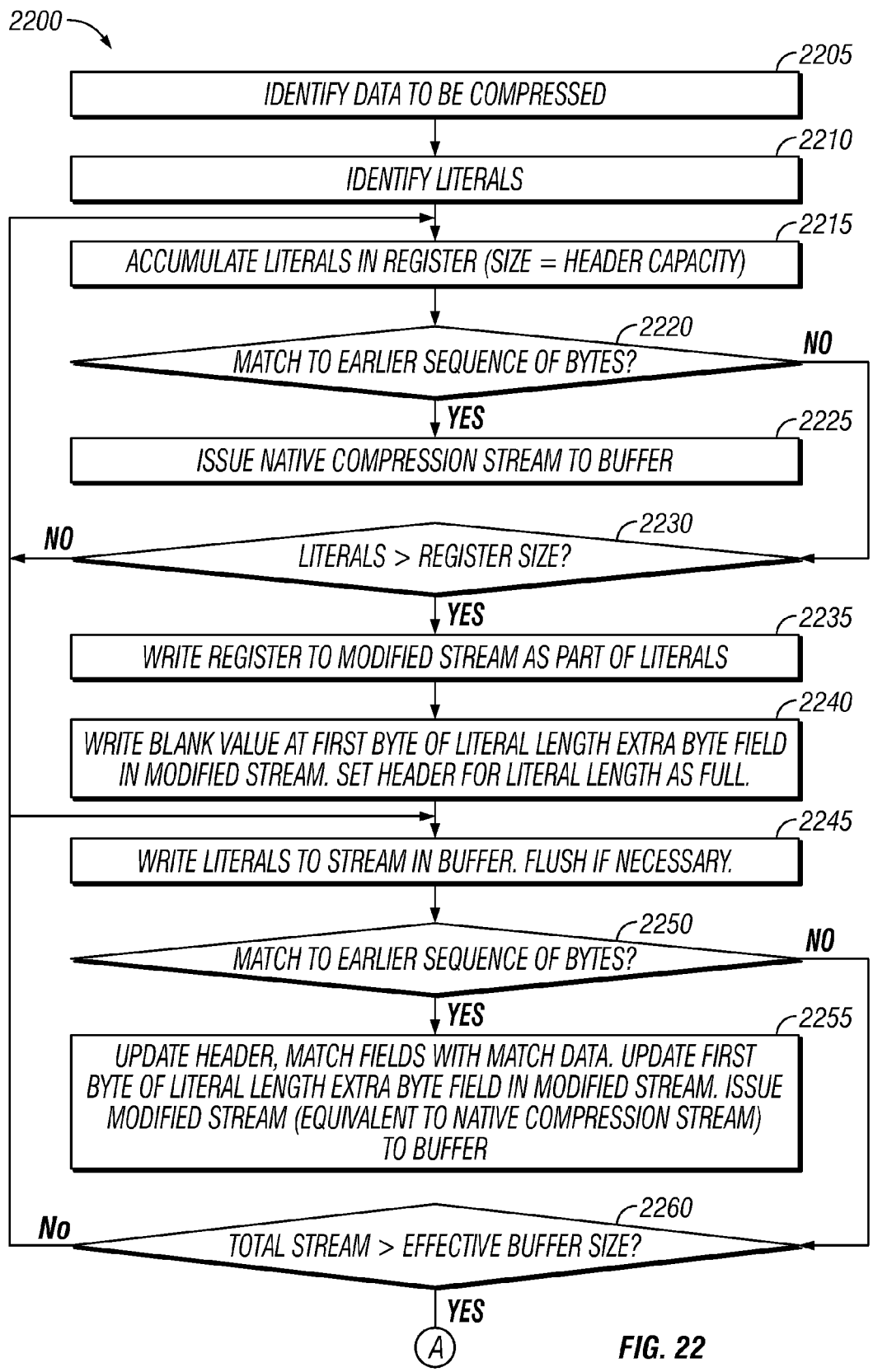
FIG. 22 is an illustration of an example method for lossless data compression, in accordance with embodiments of the present disclosure.
Figure 22:
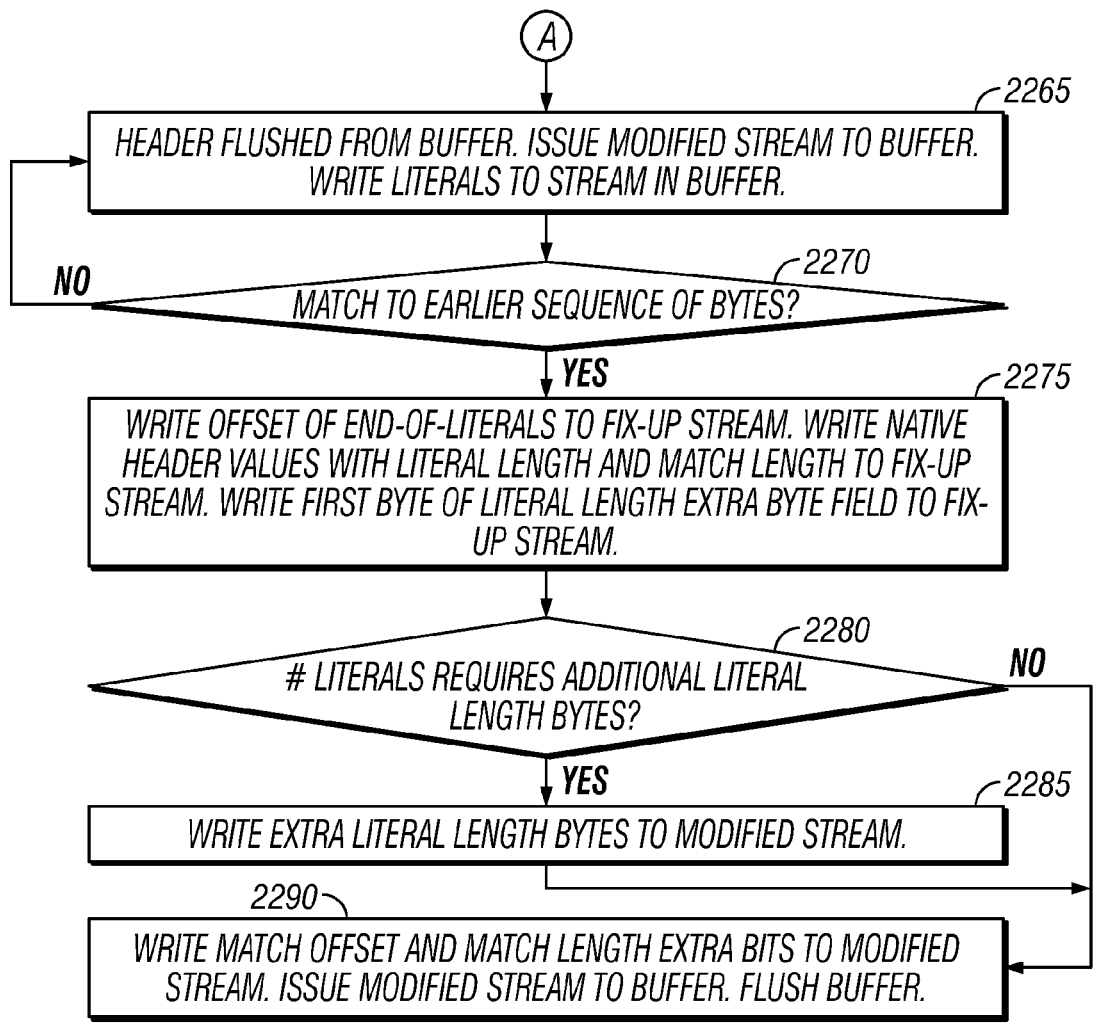

FIG. 22 is an illustration of an example method 2200 for lossless data compression, in accordance with embodiments of the present disclosure. Method 2200 may be performed by, for example, compression module 1818 and may yield data sequences for output to recipients such as core 1814 through memory hierarchy 1832. The conversion of such data sequences, if necessary, by core 1814 to restore such data sequences to a standard or native compression scheme, may be performed by the steps of method 2300 illustrated in FIG. 23, below. Method 2200 may begin at any suitable point and may execute in any suitable order. In one embodiment, method 2200 may begin at 2205. In various embodiments, method 2200 may be performed during the execution of an out-of-order processor. Method 2200 may be performed in parallel with method 2300.

At 2205, data to be compressed may be identified. The data may be determined to be compressed by a given native compression scheme. At 2210, elements in the stream of data to be compressed may be identified. The elements may arrive, one at a time or in blocks, to a compressor. 2205 and 2210 may repeat and execute in parallel with other steps of method 2200, wherein the elements may be evaluated to determine whether they are literals or matches to previous data in the input stream.

At 2215, in one embodiment elements may be accumulated as they arrive in a register. The register size may be set according to the number of literals that may be enumerated by a header to be placed in the output data sequence.

At 2220, in one embodiment it may be determined whether a match has been found in the data that is the same as data previously received, matching the earlier sequence of bytes. If so, method 2200 may proceed to 2225. Otherwise, method 2200 may proceed to 2230.

At 2225, a native compression sequence may be calculated according to the unmodified data compression sequence. The sequence may be issued to the buffer. Method 2200 may repeat at, for example, 2215 or may terminate.

At 2230, it may be determined whether the number of elements that have been received exceeds the size of the accumulation register. If so, method 2200 may return to 2215 to accumulate more elements. In one embodiment, if not, method 2200 may proceed to 2235 wherein the elements in the register may be written to a data sequence output as part of the literals field. In another embodiment, method 2240 may write a blank value at a first byte of the literal length extra byte fields in the data sequence. The bits in the header specifying the literal length may be all set, indicating that they are full. Extra bytes must thus be used to track the full literal length.

At 2245, additional elements may be received, individually or in blocks. These may be written to the data sequence in the buffer as they arrive if they are literals (rather than matches to previous data in the input stream), and subsequent steps may be taken upon the arrival of each. If necessary, the buffer may be flushed to a memory hierarchy if the buffer is full.

At 2250, it may be determined whether a match of already-encountered data has been found within the input data, given the most recently received element. If a match has not been determined, method 2200 may proceed to 2260. If a match has been found, in one embodiment the header and match fields in the data sequence may be updated with match data. The first byte of literal length extra byte fields may be updated with the actual values indicating the size of the literal length, less those represented by bits in the header. In another embodiment, such an update may change the field from a blank byte. The modified data sequence may be issued. Such a modified data sequence may be equivalent to the compression sequence generated for the same data by the native data compression technique. Method 2200 may repeat at, for example, 2215 or may terminate.

At 2260, in one embodiment it may be determined whether portions of the output sequence will not fit in the buffer. This may be determined by evaluating whether the total sequence is larger than the effective buffer size. If not, method 2200 may repeat at 2245 to continue receive elements. If so, in another embodiment the header, as well as other fields and some of the literals themselves, may have flushed from the buffer. The modified sequence may be issued to the buffer as elements continue to arrive.

At 2270, it may be determined whether a match has been found for already-encountered data. If not, method 2200 may repeat at 2265. Otherwise, in one embodiment the offset of the end-of-literals may be written to a fix-up sequence. This offset may specify a demarcation between literals and subsequent fields in the data sequence. In another embodiment, header values conforming to the native compression scheme may be written to the fix-up sequence. These values may include bits in the header specifying literal length and match length. In yet another embodiment, a first byte of extra bytes specifying literal length may be written to the fix-up sequence.

At 2280, in one embodiment it may be determined whether the number of literals requires additional literal length bytes beyond the first extra literal length byte. This may occur if the first extra literal length byte is not sufficiently large to enumerate the number of literals before the match was found. If additional bytes are required, method 2200 may proceed to 2285. Otherwise, method 2200 may proceed to 2290.

At 2285, in one embodiment the necessary additional literal length bytes may be written to the modified sequence in a field after the literals.

At 2290, the match offset and the match length extra bytes may be written to the modified sequence. The modified sequence may be issued to the buffer. Method 2200 may repeat at, for example, 2215 or may terminate.

Figure 23:
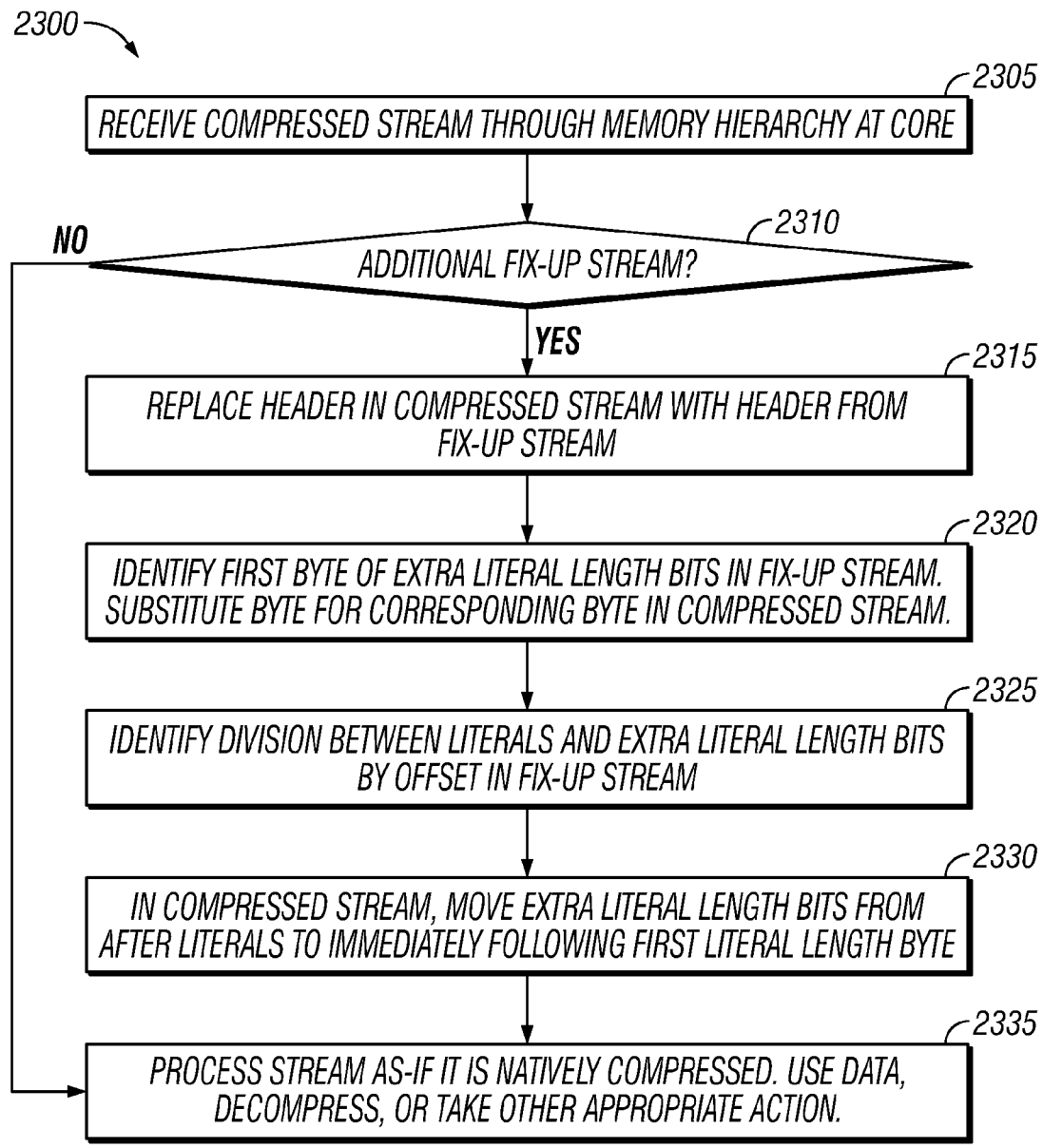
FIG. 23 is an illustration of an example method for conversion of data compressed with lossless data compression, in accordance with embodiments of the present disclosure.

FIG. 23 is an illustration of an example method for conversion of data compressed with lossless data compression, in accordance with embodiments of the present disclosure. Method 2300 may be performed by, for example, a recipient of data streams such as core 1814 by reading data from memory hierarchy 1832. Method 2300 may begin at any suitable point and may execute in any suitable order. In one embodiment, method 2300 may begin at 2305. In various embodiments, method 2300 may be performed during the execution of an out-of-order processor.

At 2305, a compressed sequence may be read from, for example, a memory hierarchy. Such a compressed sequence may have been generated during, for example, method 2200. The compressed sequence may be received at, for example, a core for further processing the sequence by reading data as it was written to a memory hierarchy.

In one embodiment, at 2310 it may be determined whether there is also an additional fix-up sequence that has been generated. The fix-up sequence may be in a different or subsequent memory location and may have been generated during method 2200. If not, method 2300 may proceed to 2335.

In one embodiment, if the additional fix-up sequence has been received, in one embodiment at 2315 a header byte in the fix-up sequence may be used to overwrite a header in the compressed sequence. This may correct any counts of literal length or match length by bits in the compressed sequence that were unable to be correctly written before all elements for the compression sequence were received in method 2200.

In one embodiment, at 2320 a first byte of extra literal length bits from the fix-up sequence may be copied to the corresponding field in the compressed data sequence. Such a first byte may be empty.

In one embodiment, at 2325 a division in the data sequence between a field for the literals and subsequent fields, such as additional extra literal length bits or match information, may be determined by an offset in the fix-up sequence. 2325 may be performed as necessary to obtain additional extra literal length bits. Whether additional, extra literal length bits are present in the modified data sequence may be indicated by, for example, whether the first byte copied from the fix-up sequence in 2320 is full. Such a full byte may indicate that additional bits are necessary to enumerate all literals.

At 2330, if necessary due to additional extra literal length bits, the additional extra literal length bits in the compressed data sequence may be moved from their position after the literals and appended to the end of the first byte of extra literal length bits before the literals. 2330 might not be performed if the field for additional extra literal lengths is empty. In one embodiment, fields for the literals and for the extra literal length bits may be swapped. Method 2300 may proceed to 2335.

At 2335, the sequence may be in native format conforming to the unmodified compression scheme. The core may process the sequence in order to use the data, send it elsewhere, perform additional calculations, decompress it, or perform any other suitable action. Method 2300 may optionally repeat or terminate.

Methods 2200, 2300 may be initiated by any suitable criteria. Furthermore, although methods 2200, 2300 describe an operation of particular elements, methods 2200, 2300 may be performed by any suitable combination or type of elements. For example, method 2200 may be implemented by the elements illustrated in FIGS. 1-21 or any other system operable to implement methods 2200, 2300. As such, the preferred initialization point for methods 2200, 2300 and the order of the elements comprising methods 2200, 2300 may depend on the implementation chosen. In some embodiments, some elements may be optionally omitted, reorganized, repeated, or combined.

Embodiments of the mechanisms disclosed herein may be implemented in hardware, software, firmware, or a combination of such implementation approaches. Embodiments of the disclosure may be implemented as computer programs or program code executing on programmable systems comprising at least one processor, a storage system (including volatile and non-volatile memory and/or storage elements), at least one input device, and at least one output device.

Program code may be applied to input instructions to perform the functions described herein and generate output information. The output information may be applied to one or more output devices, in known fashion. For purposes of this application, a processing system may include any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine-readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, Compact Disk Read-Only Memories (CD-ROMs), Compact Disk Rewritables (CD-RWs), and magneto-optical disks, semiconductor devices such as Read-Only Memories (ROMs), Random Access Memories (RAMs) such as Dynamic Random Access Memories (DRAMs), Static Random Access Memories (SRAMs), Erasable Programmable Read-Only Memories (EPROMs), flash memories, Electrically Erasable Programmable Read-Only Memories (EEPROMs), magnetic or optical cards, or any other type of media suitable for storing electronic instructions.

Accordingly, embodiments of the disclosure may also include non-transitory, tangible machine-readable media containing instructions or containing design data, such as Hardware Description Language (HDL), which defines structures, circuits, apparatuses, processors and/or system features described herein. Such embodiments may also be referred to as program products.

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part-on and part-off processor.

Thus, techniques for performing one or more instructions according to at least one embodiment are disclosed. While certain exemplary embodiments have been described and shown in the accompanying drawings, it is to be understood that such embodiments are merely illustrative of and not restrictive on other embodiments, and that such embodiments not be limited to the specific constructions and arrangements shown and described, since various other modifications may occur to those ordinarily skilled in the art upon studying this disclosure. In an area of technology such as this, where growth is fast and further advancements are not easily foreseen, the disclosed embodiments may be readily modifiable in arrangement and detail as facilitated by enabling technological advancements without departing from the principles of the present disclosure or the scope of the accompanying claims.

What is claimed is:

1. A processor, comprising:
   a memory hierarchy;
   a buffer for input to the memory hierarchy; and
   a compression module comprising hardware circuitry, the compression module to:
      read elements to be compressed according to a compression scheme;
      selectively modify a format of the compression scheme based upon a number of literals received;
      modify the format of the compression scheme with respect to information in an output data sequence at a position located before the literals;
      compress, in hardware, the elements to produce the output data sequence; and
      send the output data sequence to the memory hierarchy.

2. The processor of claim 1, wherein the compression module is further to output a fix-up sequence to the memory hierarchy, the fix-up sequence to include information to undo modifications to the format of the compression scheme.

3. The processor of claim 1, further comprising a core including logic to convert the output data sequence to the format of the compression scheme.

4. The processor of claim 1, wherein the compression module is further to compress a subsequent sequence of data according to an unmodified format of the compression scheme based upon a determination that a portion of a compressed version of the subsequent sequence of data will not fit within the buffer.

5. The processor of claim 1, wherein the compression module is further to:
divide the information into a first portion and a second portion;
write the first portion to the output data sequence at a position before the literals; and
write the second portion to the output data sequence at another position after the literals.

6. The processor of claim 1, wherein the compression module is further to:
determine a first portion of the information before the buffer is filled;
write the first portion of the information; and
write the second portion of the information after all data to be compressed have been received.

7. The processor of claim 1, wherein the output data sequence is of a same length as a native data sequence produced by application of the compression scheme.

8. A method comprising:
reading a sequence of data be compressed by a compression scheme;
selectively modifying a format of the compression scheme based upon a number of literals received;
modifying the format of the compression scheme with respect to information in an output data sequence at a position located before the literals;
compressing, in hardware, the sequence of data to produce the output data sequence; and
sending the output data sequence to a memory hierarchy.

9. The method of claim 8, further comprising outputting a fix-up sequence to the memory hierarchy, the fix-up sequence to include information to undo modifications to the format of the compression scheme.

10. The method of claim 8, further comprising converting the output data sequence to the format of the compression scheme.

11. The method of claim 8, further comprising compressing a subsequent sequence of data according to an unmodified format of the compression scheme based upon a determination that a portion of a compressed version of the subsequent sequence of data will not fit within a buffer for output.

12. The method of claim 8, further comprising:
dividing the information into a first portion and a second portion;
writing the first portion to the output data sequence at the position before the literals; and
writing the second portion to the output data sequence at another position after the literals.

13. The method of claim 8, further comprising:
determining a first portion of the information before a buffer for output is filled;
writing the first portion of the information; and
writing the second portion of the information after all literals to be compressed have been received.

14. A system comprising:
a data processing apparatus;
a memory hierarchy;
a buffer for output to the memory hierarchy; and
a compression module executable by the data processing apparatus to:
evaluate a stream of data to be compressed according to a compression scheme;
selectively modify a format of the compression scheme based upon a number of literals received;
modify the format of the compression scheme with respect to information in an output data sequence at a position located before the literals;
compress, in hardware, a sequence of the data to produce the output data sequence; and
send the output data sequence to the memory hierarchy.

15. The system of claim 14, wherein the compression module is further executable to output a fix-up sequence to the memory hierarchy, the fix-up sequence to include information to undo modifications to the format of the compression scheme.

16. The system of claim 14, further comprising a core to convert the output data sequence to the format of the compression scheme.

17. The system of claim 14, wherein the compression module is further executable to compress a subsequent sequence of data according to an unmodified format of the compression scheme based upon a determination that a portion of a compressed version of the subsequent sequence of data will not fit within the buffer.

18. The system of claim 14, wherein the compression module is further executable to:
divide the information into a first portion and a second portion;
write the first portion to the output data sequence at the position before the literals; and
write the second portion to the output data sequence at another position after the literals.

19. The system of claim 14, wherein the compression module is further executable to:
determine a first portion of the information before the buffer is filled;
write the first portion of the information; and
write the second portion of the information after all literals to be compressed have been received.

20. The system of claim 14, wherein the output data sequence is of a same length as a native data sequence produced by application of the compression scheme.

* * * * *